(12) United States Patent
Wu et al.

(10) Patent No.: US 11,217,676 B1
(45) Date of Patent: Jan. 4, 2022

(54) ANTENNA-FREE HIGH-K GATE DIELECTRIC FOR A GATE-ALL-AROUND TRANSISTOR AND METHODS OF FORMING THE SAME

(71) Applicant: Taiwan Semiconductor Manufacturing Company Limited, Hsinchu (TW)

(72) Inventors: Che-Chen Wu, Hsinchu (TW); Kuo-Cheng Chiang, Zhubei (TW); Chih-Hao Wang, Baoshan Township (TW); Jia-Chuan You, Dayuan Township (TW); Li-Yang Chuang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/910,120

(22) Filed: Jun. 24, 2020

(51) Int. Cl.
| | |
|---|---|
| *H01L 21/311* | (2006.01) |
| *H01L 21/3213* | (2006.01) |
| *H01L 29/423* | (2006.01) |
| *H01L 29/66* | (2006.01) |
| *H01L 29/786* | (2006.01) |

(52) U.S. Cl.
CPC .. *H01L 29/42392* (2013.01); *H01L 21/31116* (2013.01); *H01L 21/32136* (2013.01); *H01L 29/66545* (2013.01); *H01L 29/78696* (2013.01)

(58) Field of Classification Search
CPC ......... H01L 29/42392; H01L 29/66545; H01L 29/78696; H01L 21/31116; H01L 21/32136
USPC ........................................................ 257/401
See application file for complete search history.

(56) References Cited

U.S. PATENT DOCUMENTS

| | | | |
|---|---|---|---|
| 2020/0135901 A1* | 4/2020 | Chang | H01L 29/785 |
| 2021/0057525 A1* | 2/2021 | Chiang | H01L 21/823437 |
| 2021/0134721 A1* | 5/2021 | Chiang | H01L 21/28518 |

* cited by examiner

*Primary Examiner* — Tong-Ho Kim
(74) *Attorney, Agent, or Firm* — The Marbury Law Group, PLLC

(57) ABSTRACT

A gate-all-around field effect transistor may be provided by forming a sacrificial gate structure and a dielectric gate spacer around a middle portion of a semiconductor plate stack. A source region and a drain region may be formed on end portions of semiconductor plates within the semiconductor plate stack. The sacrificial gate structure and other sacrificial material portions may be replaced with a combination of a gate dielectric layer and a gate electrode. The gate dielectric layer and the gate electrode may be vertically recessed selective to the dielectric gate spacer. A first anisotropic etch process recesses the gate electrode and the gate dielectric layer at about the same etch rate. A second anisotropic etch process with a higher selectivity may be subsequently used. Protruding remaining portions of the gate dielectric layer are minimized to reduce leakage current between adjacent transistors.

20 Claims, 71 Drawing Sheets

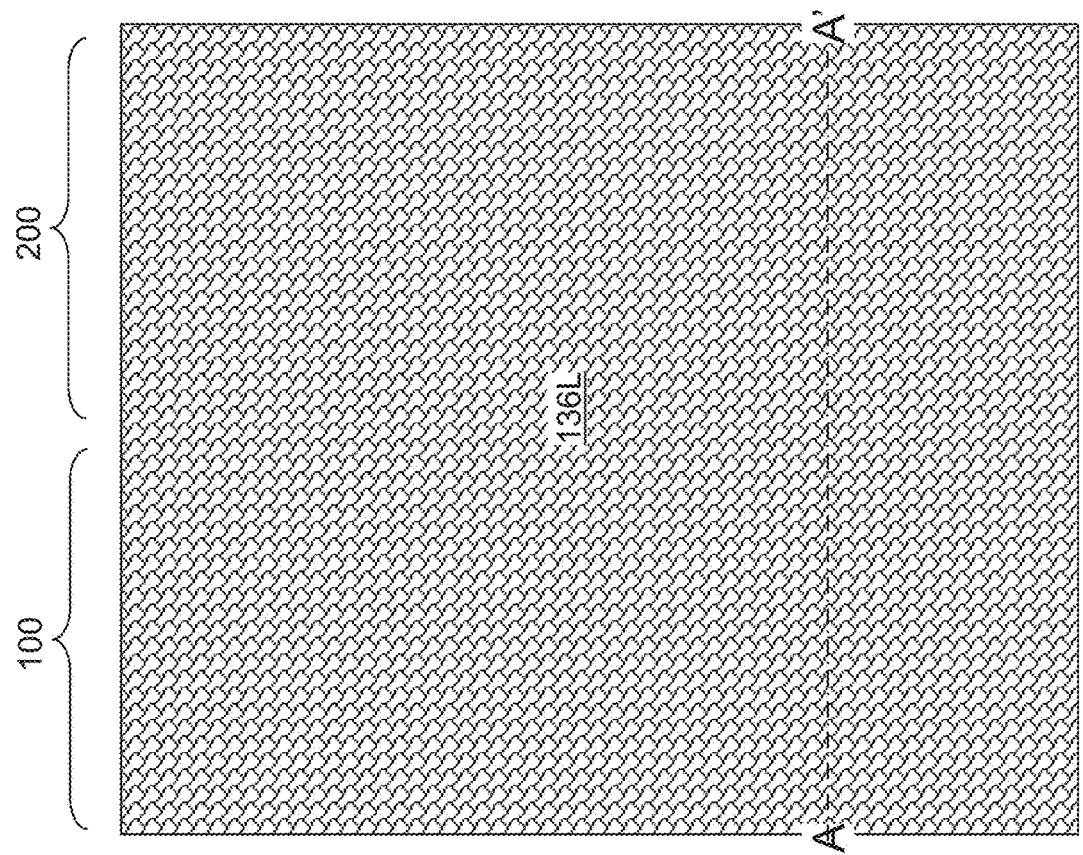
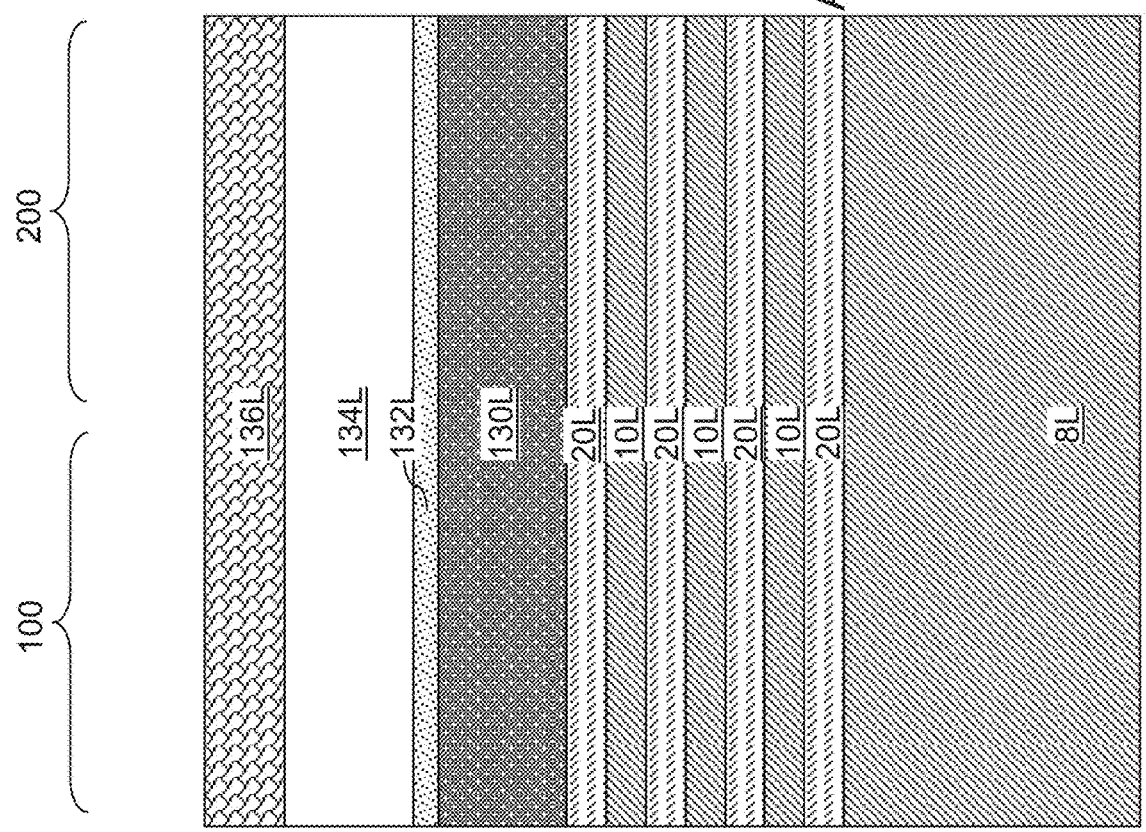

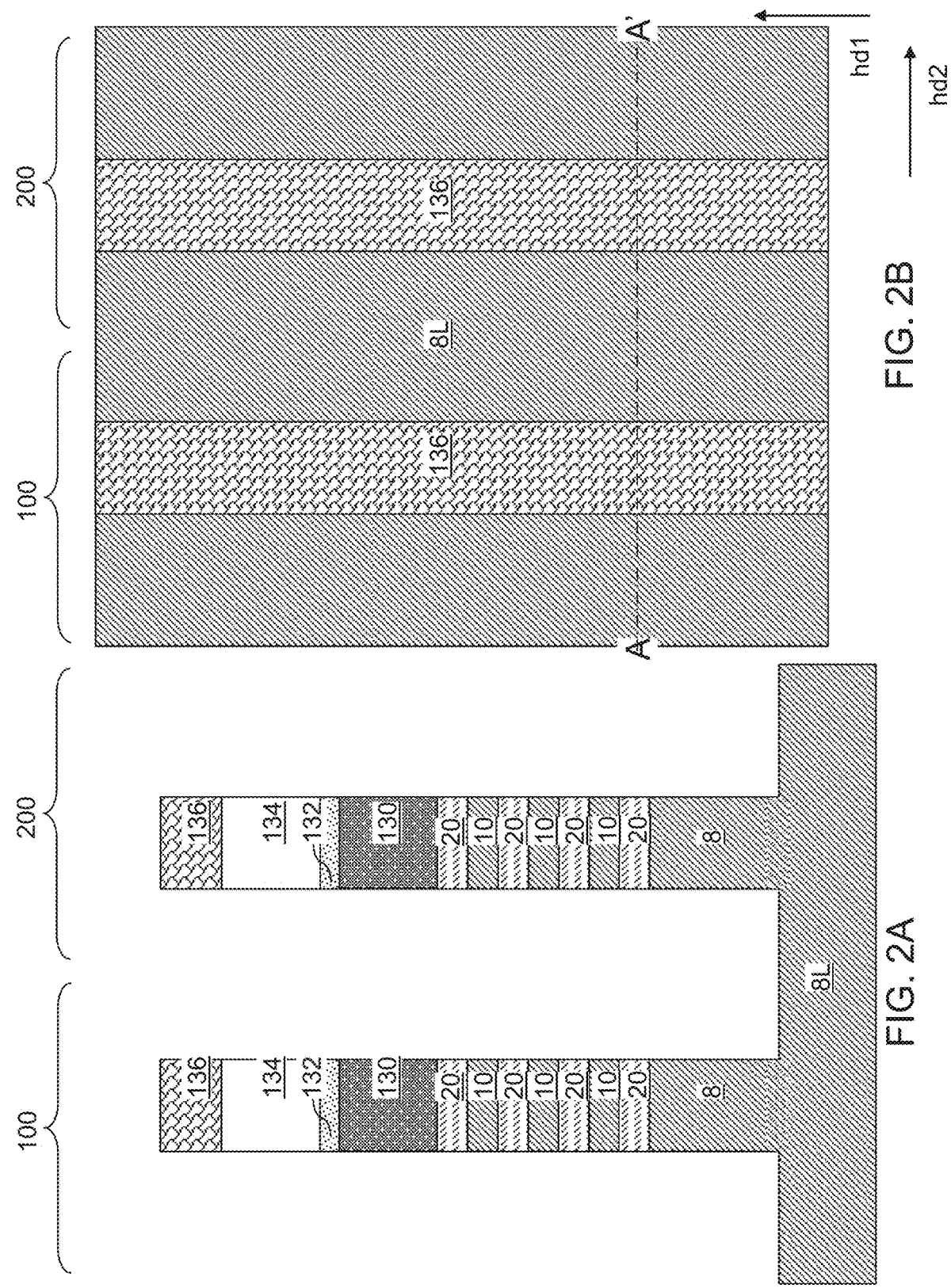

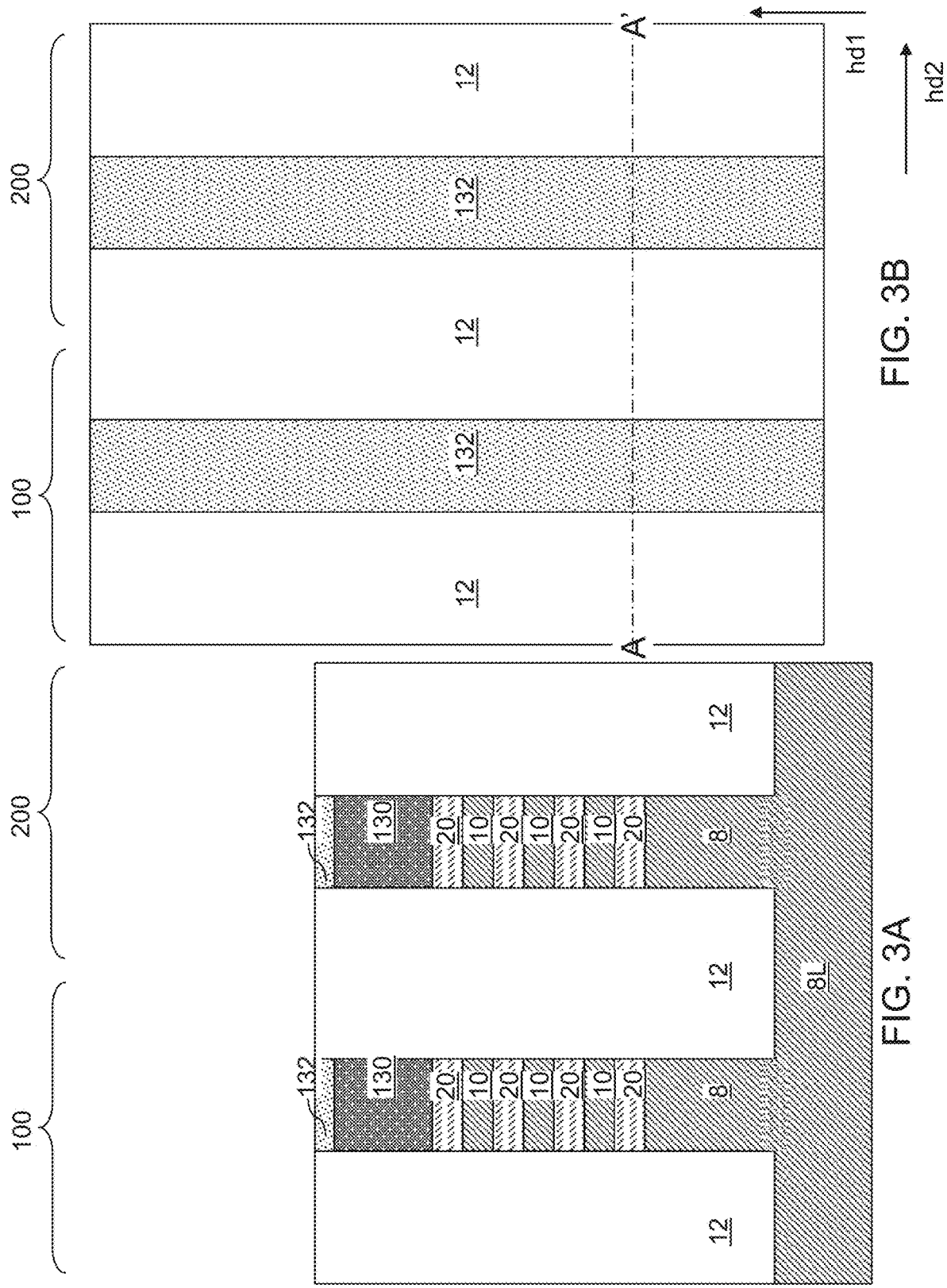

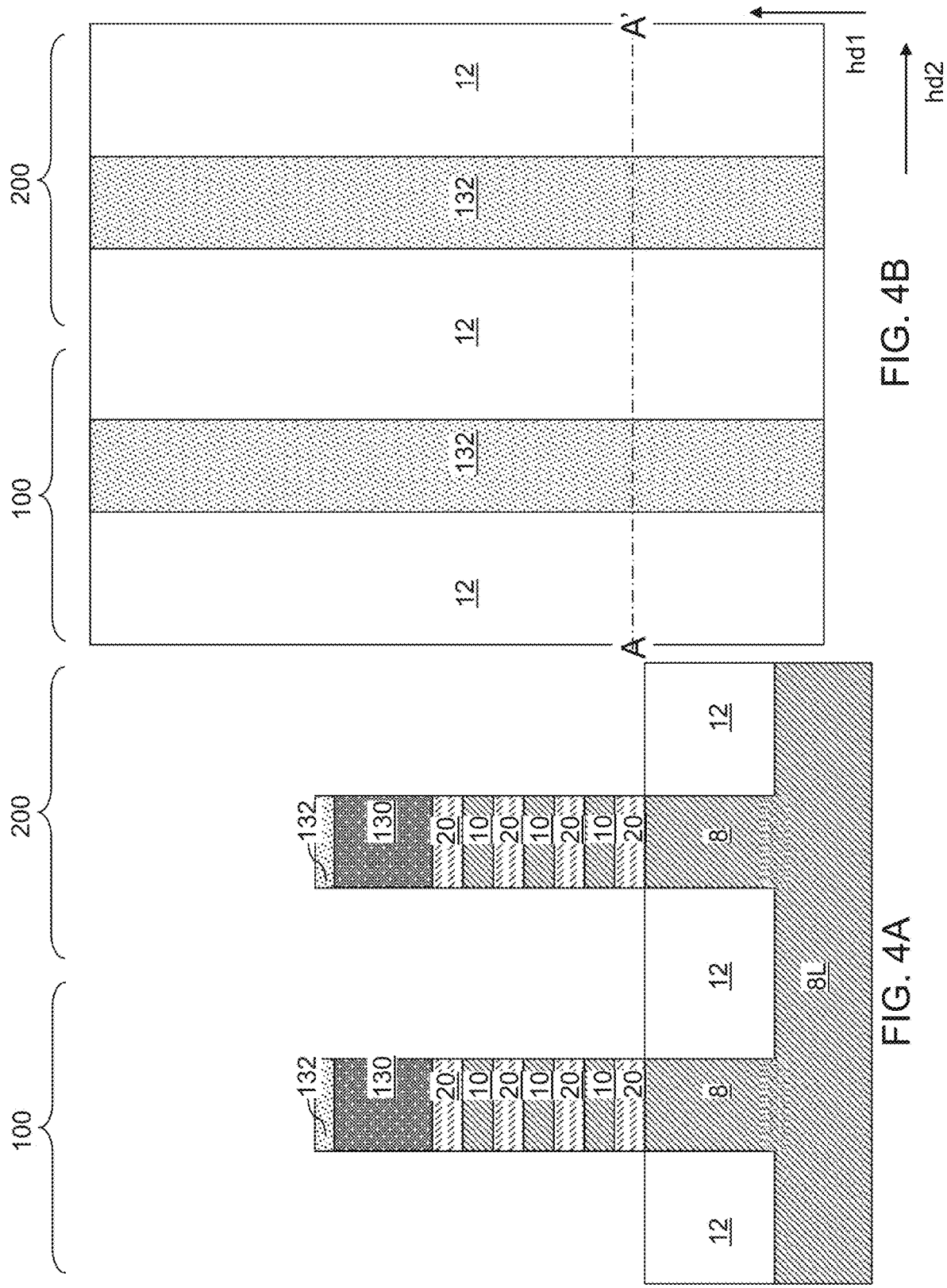

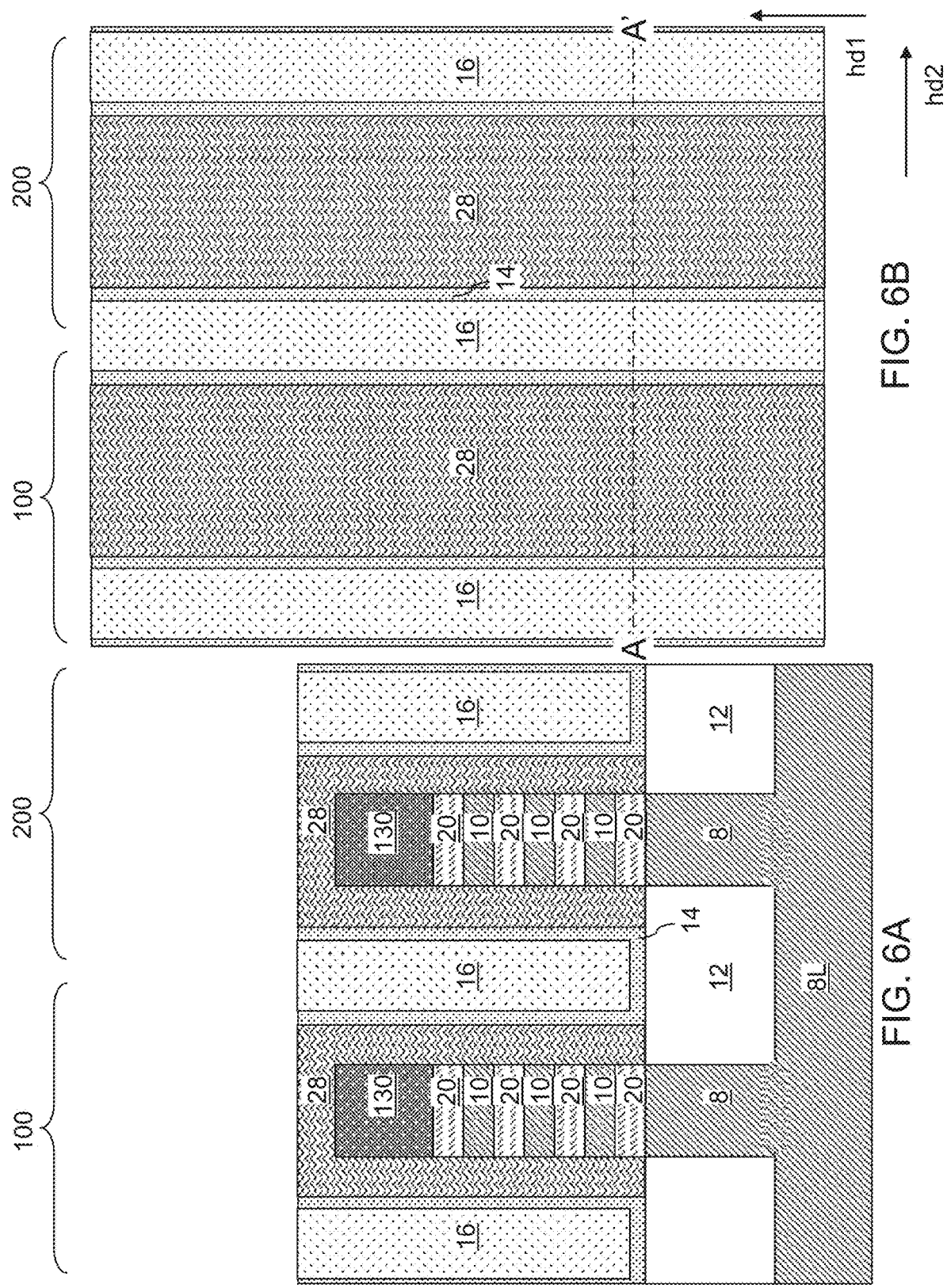

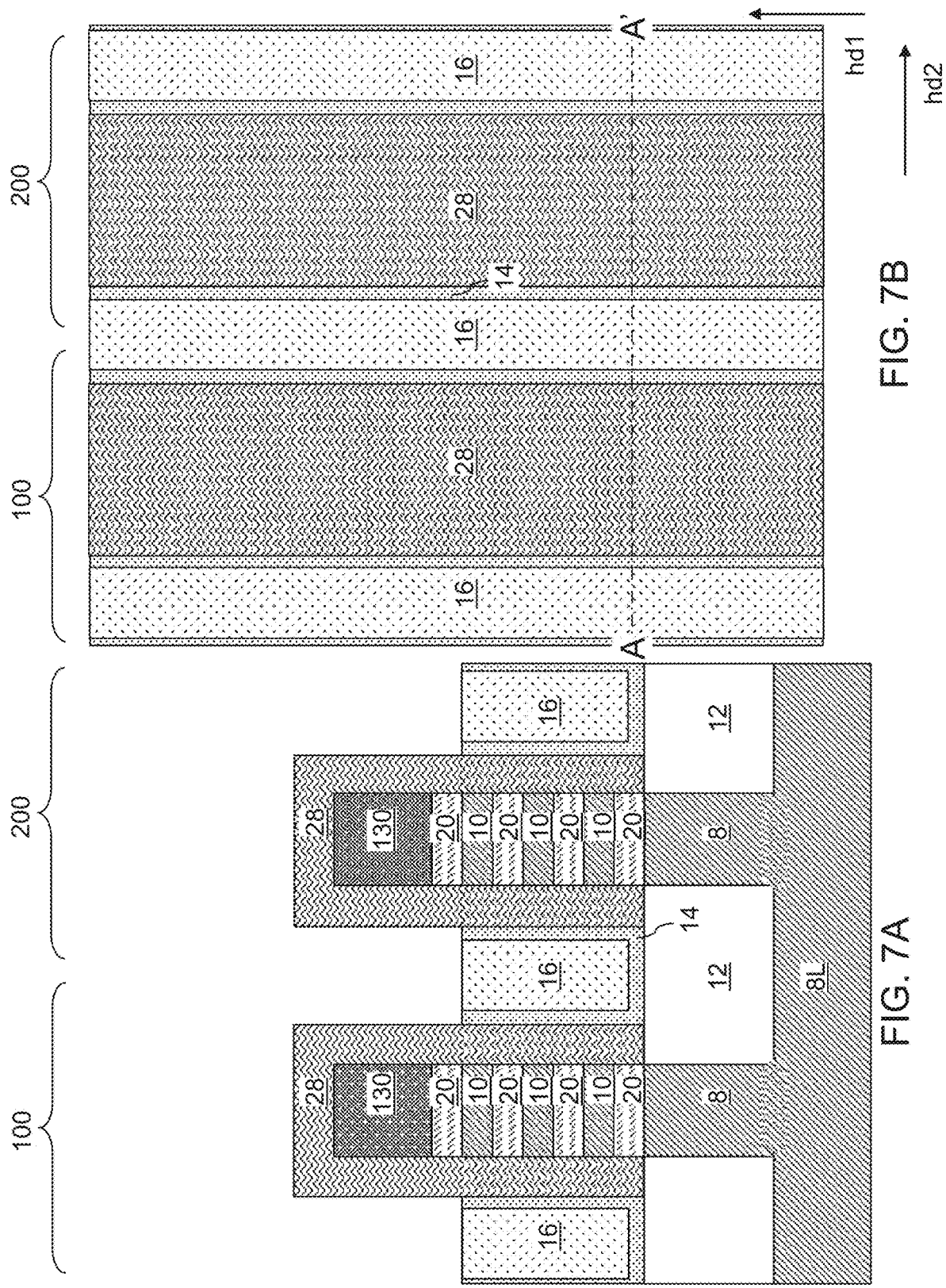

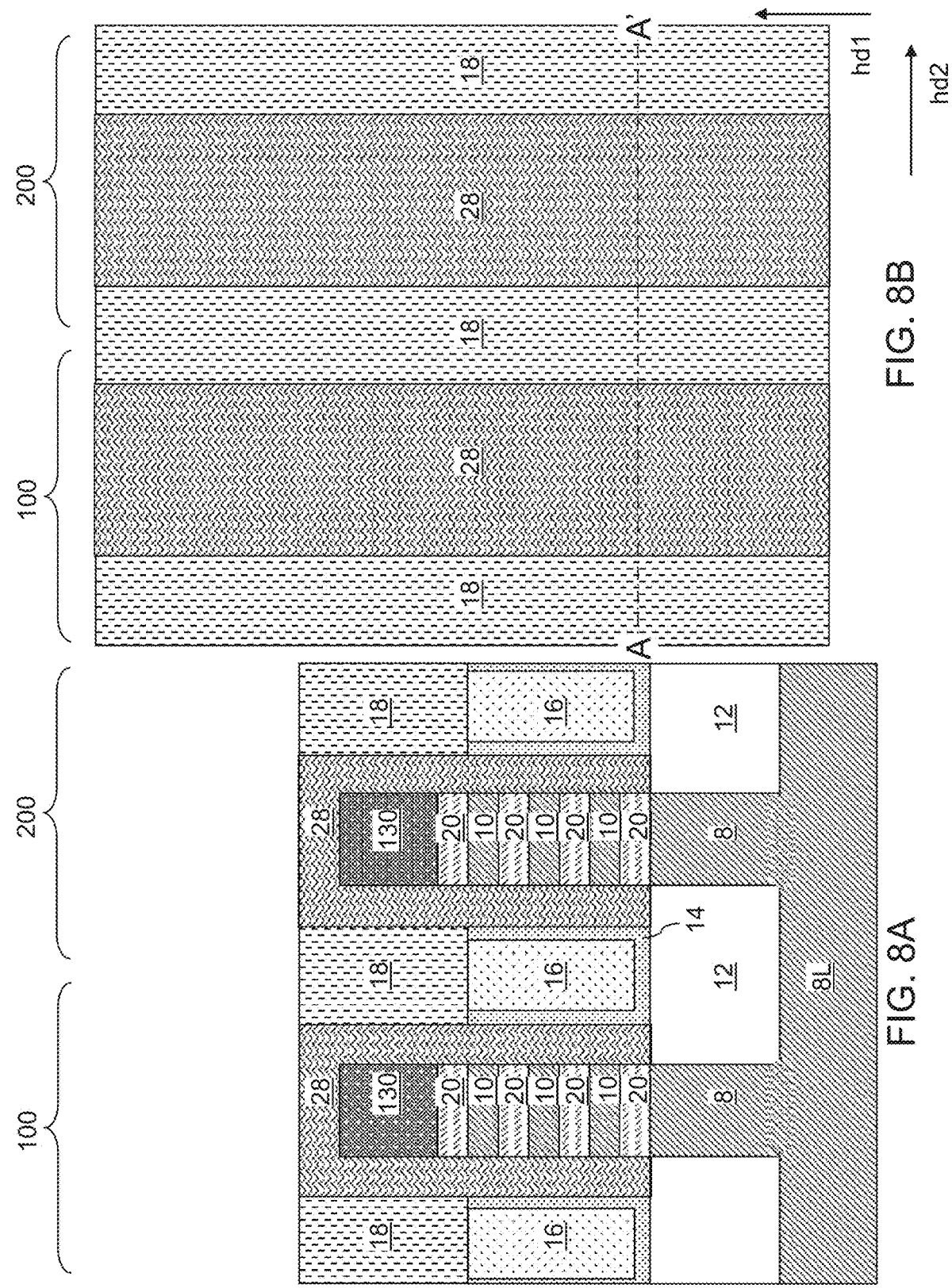

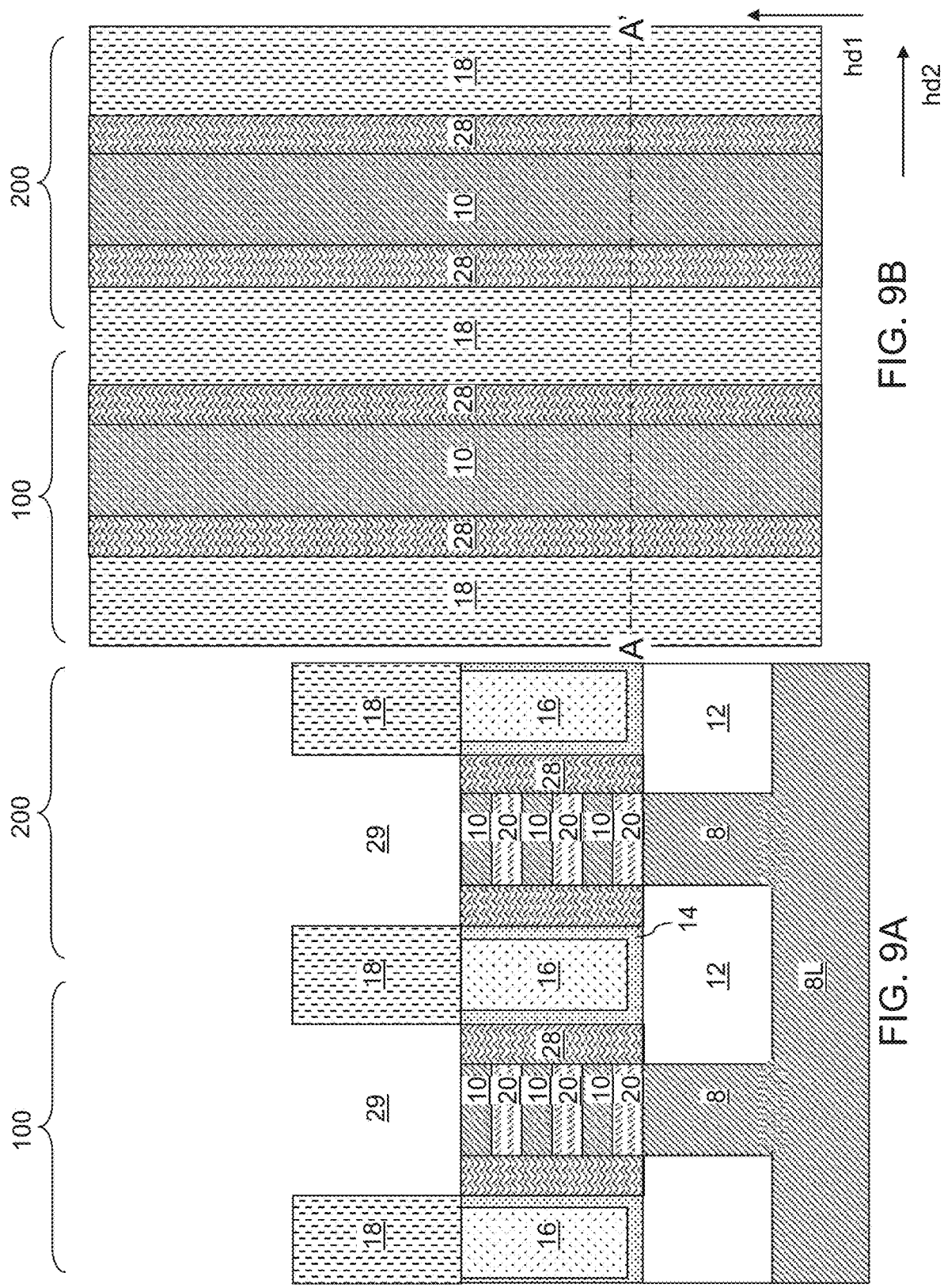

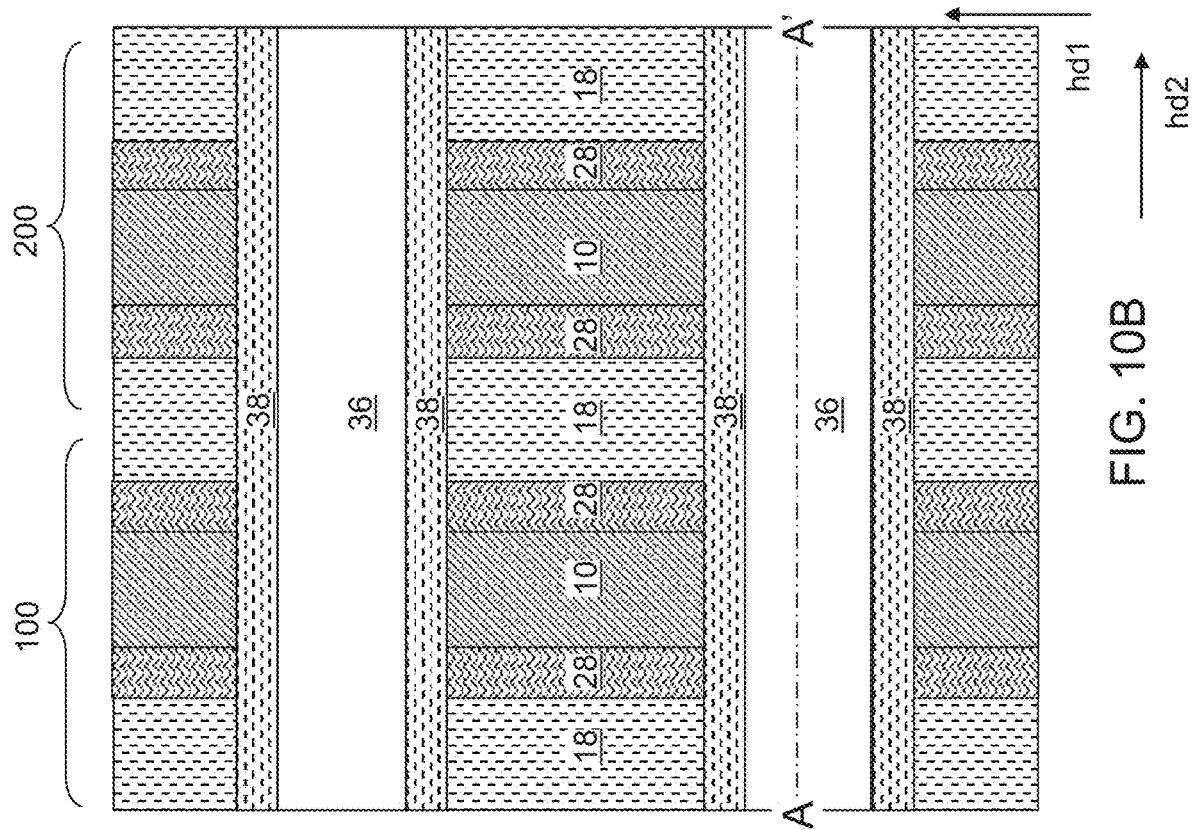
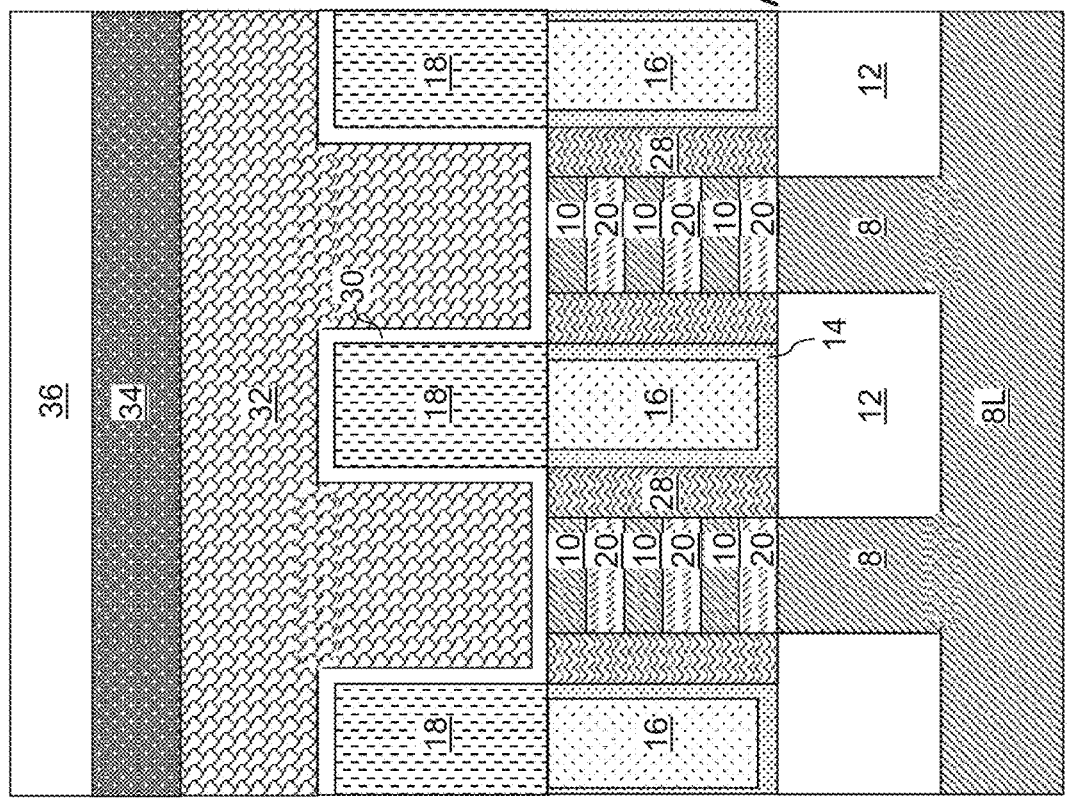
FIG. 10A
FIG. 10B

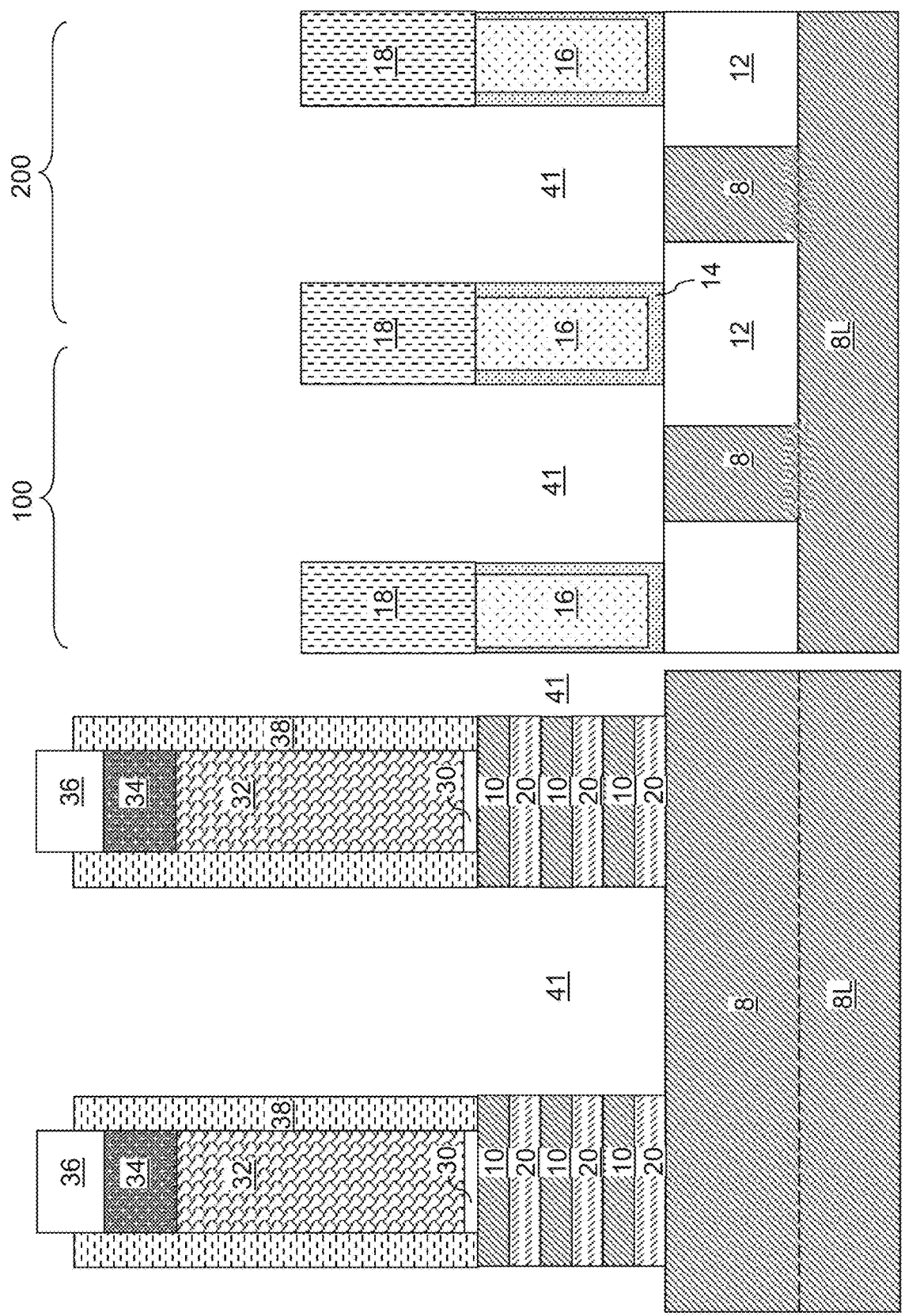

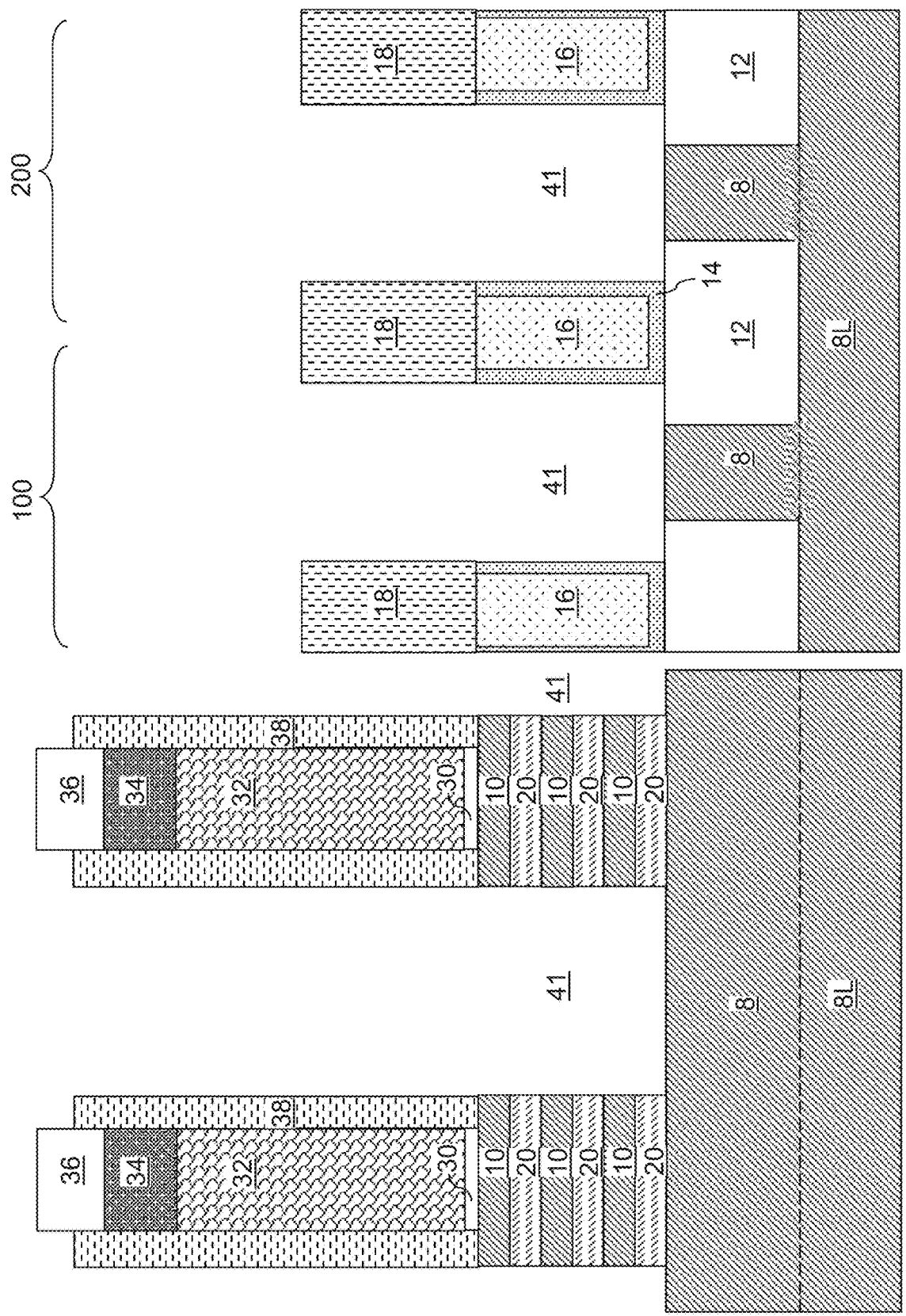

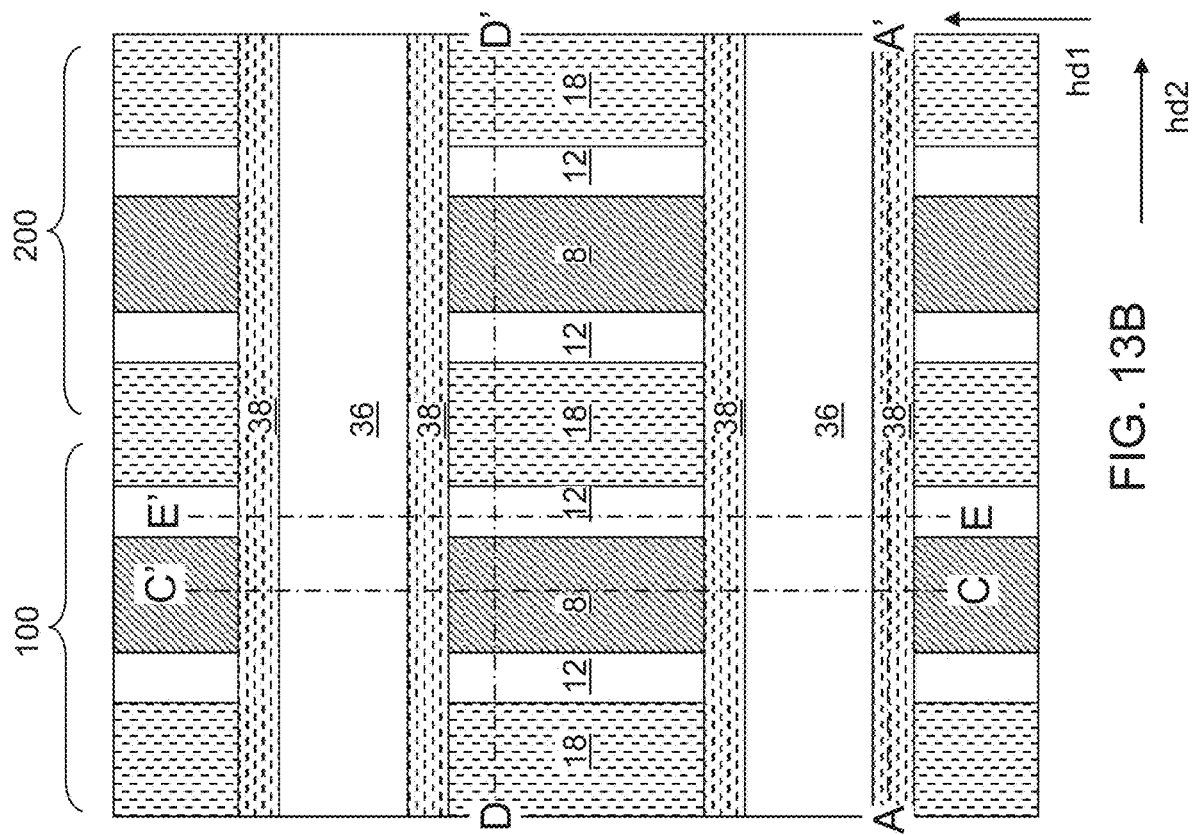
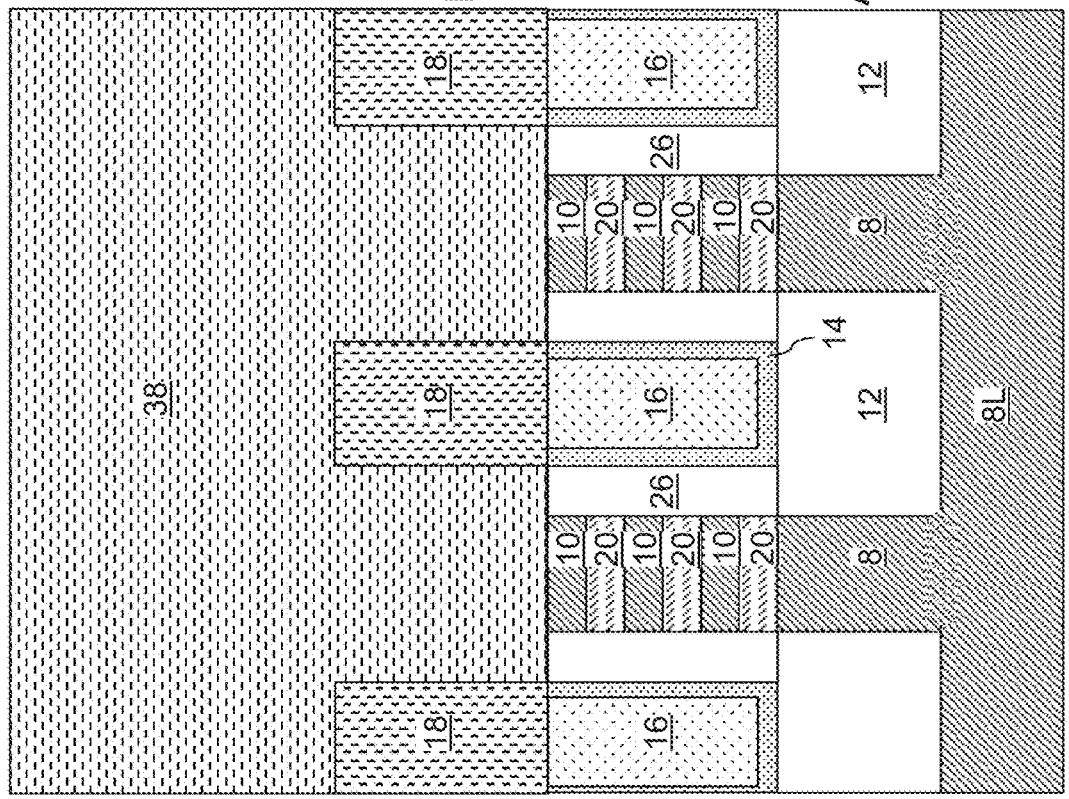
FIG. 13B
FIG. 13A

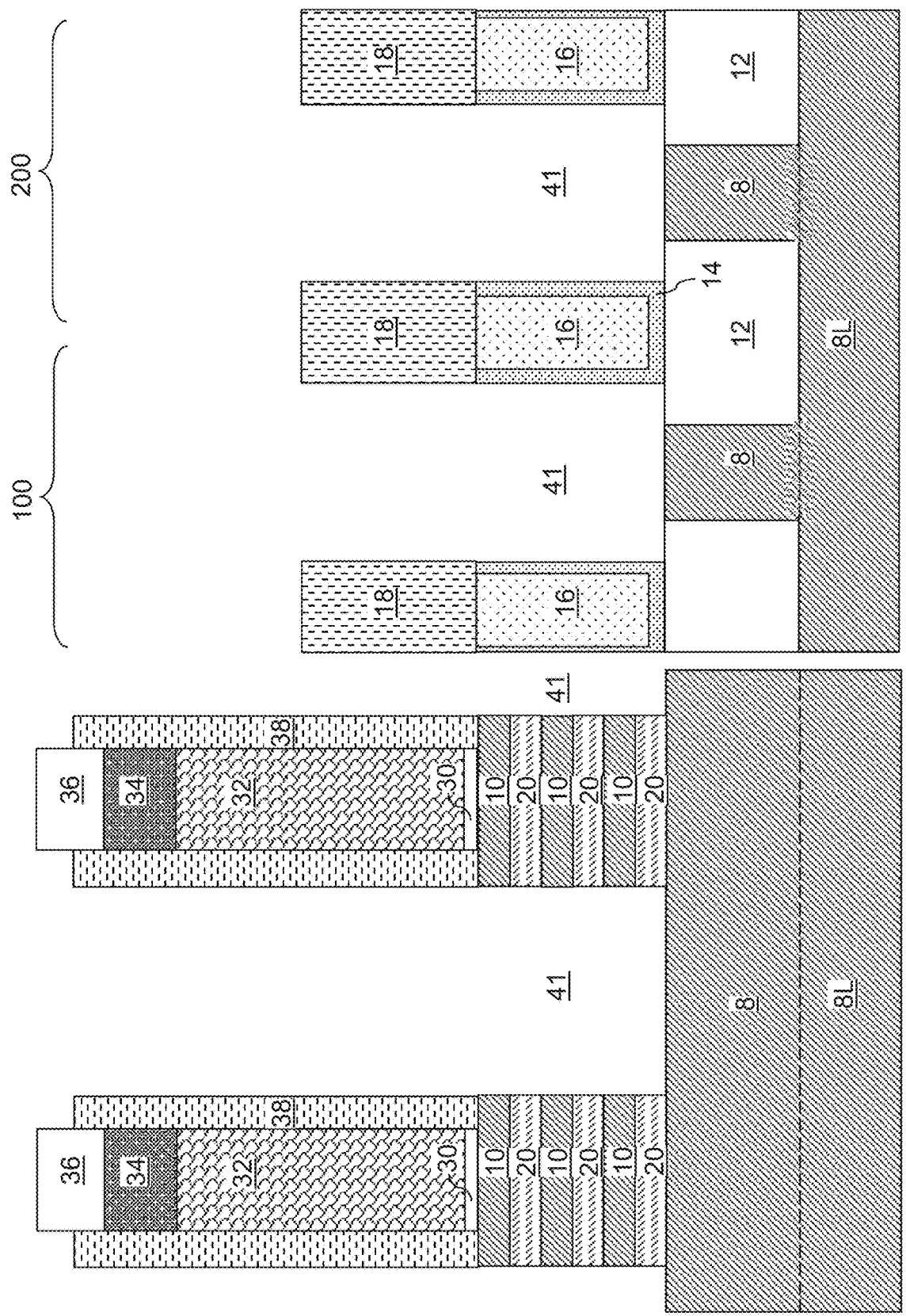

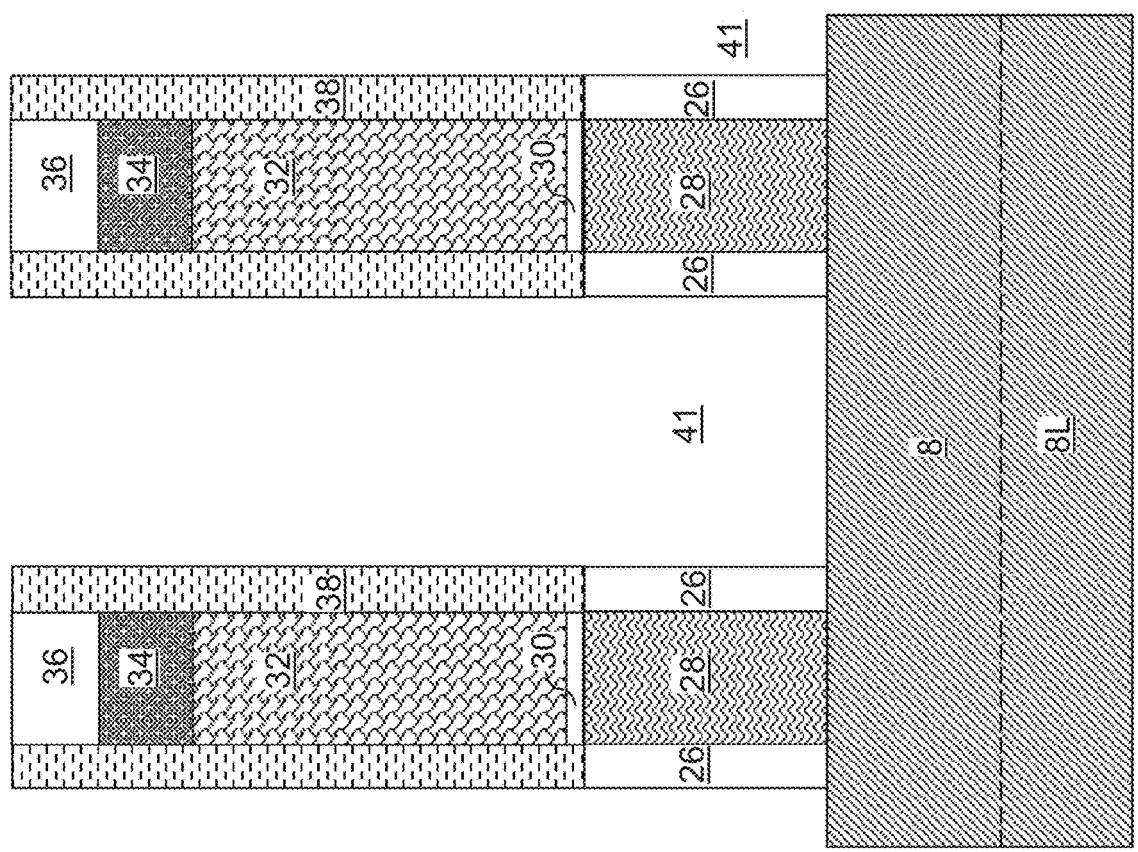

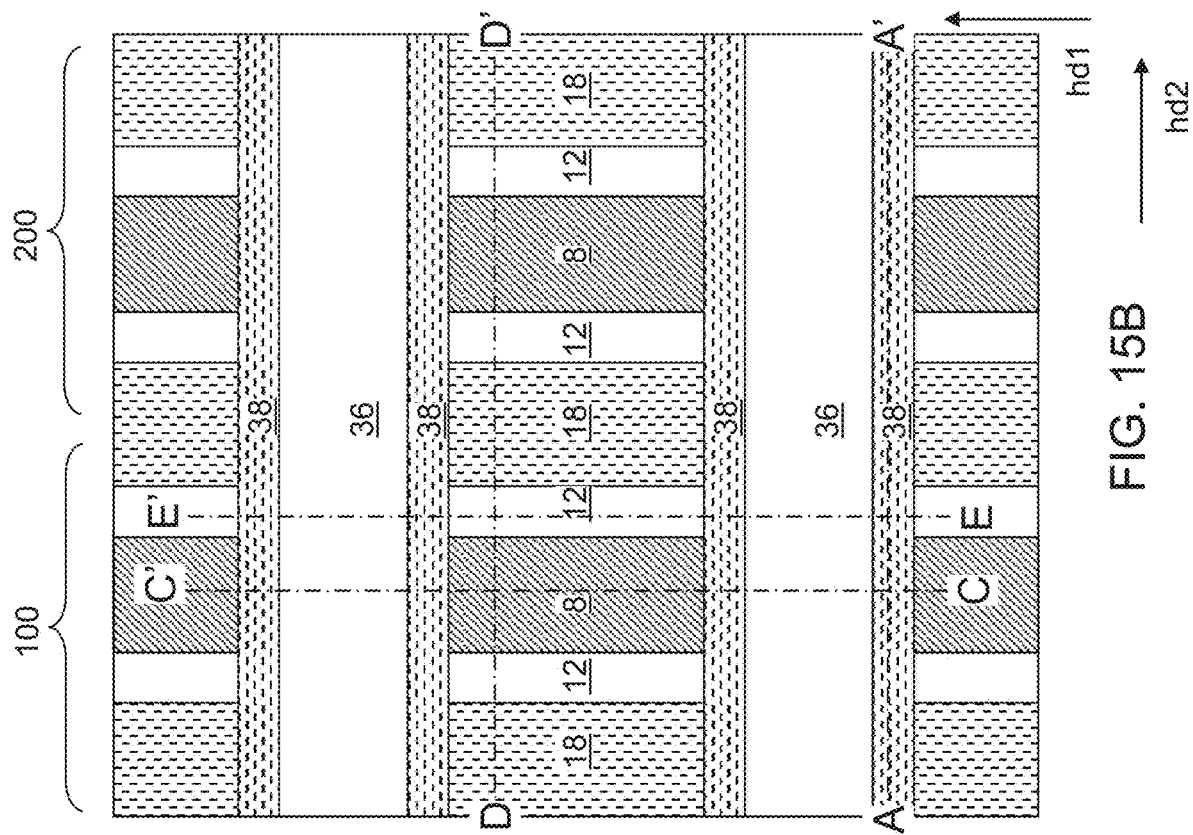
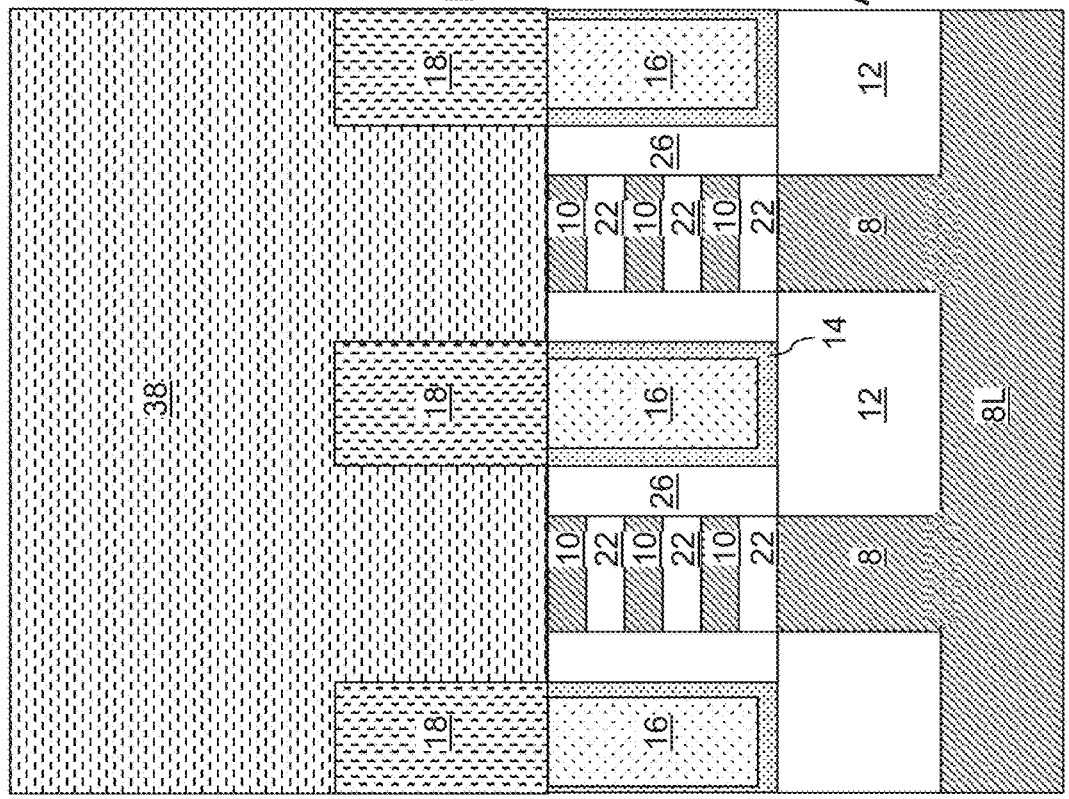

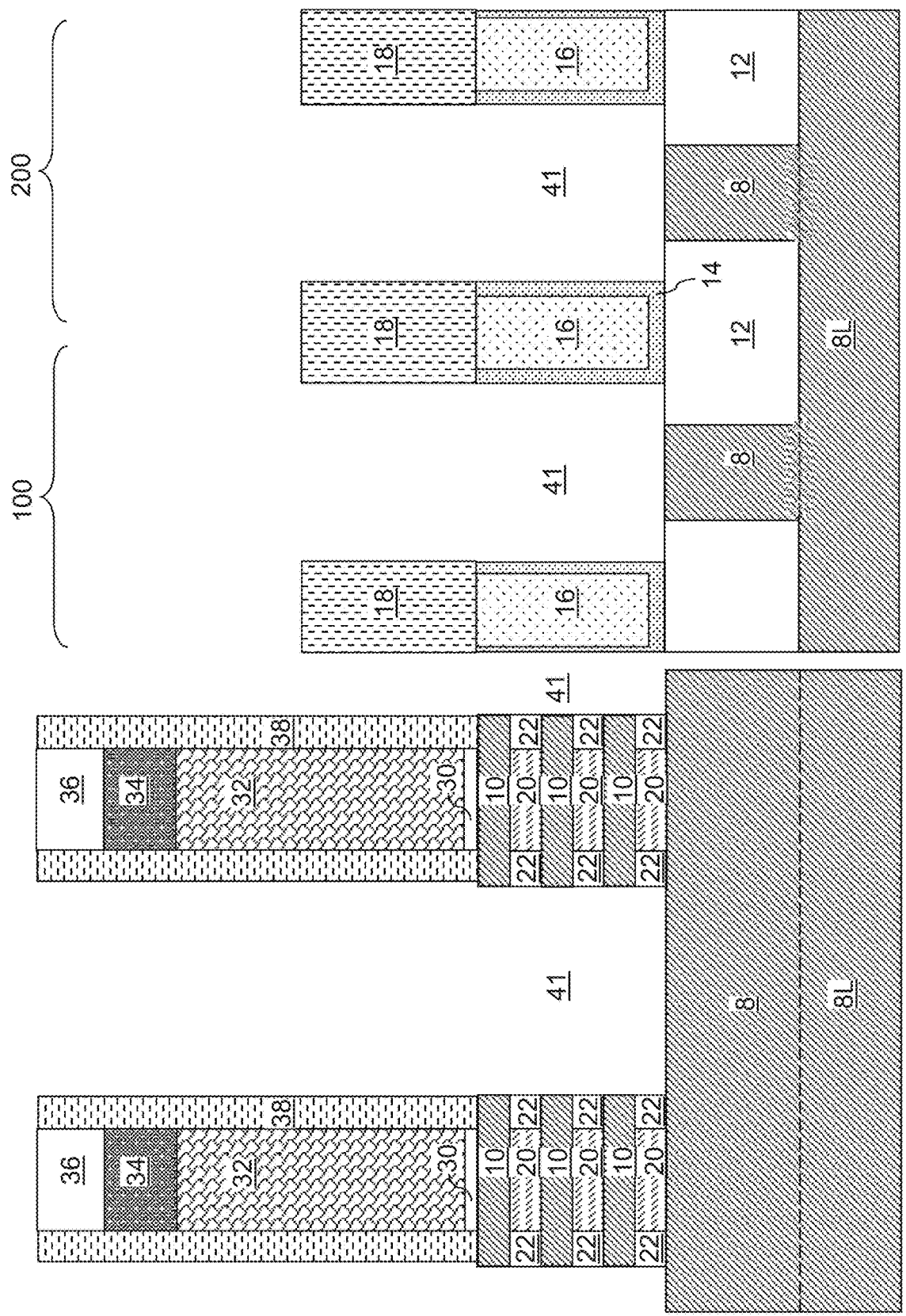

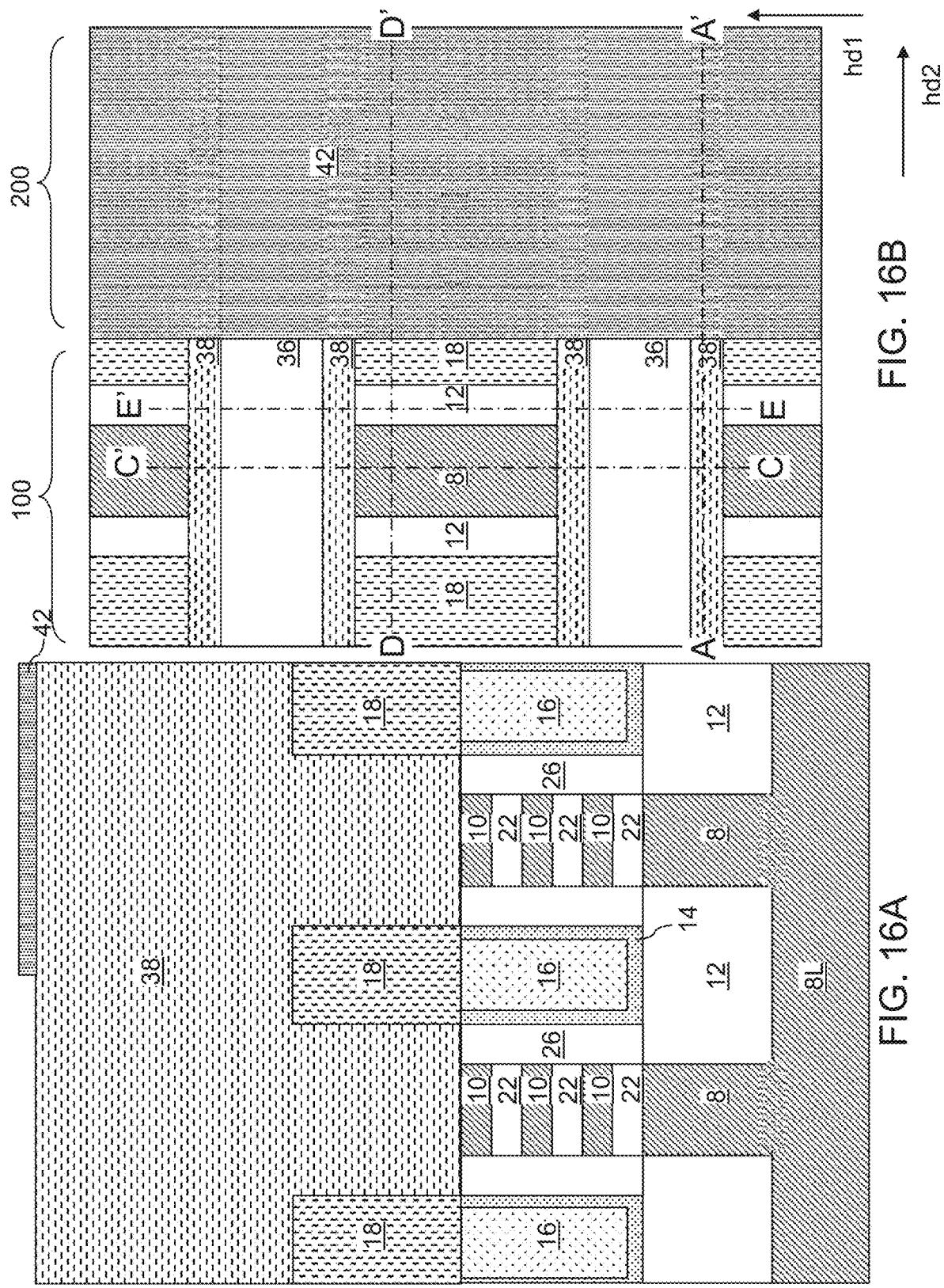

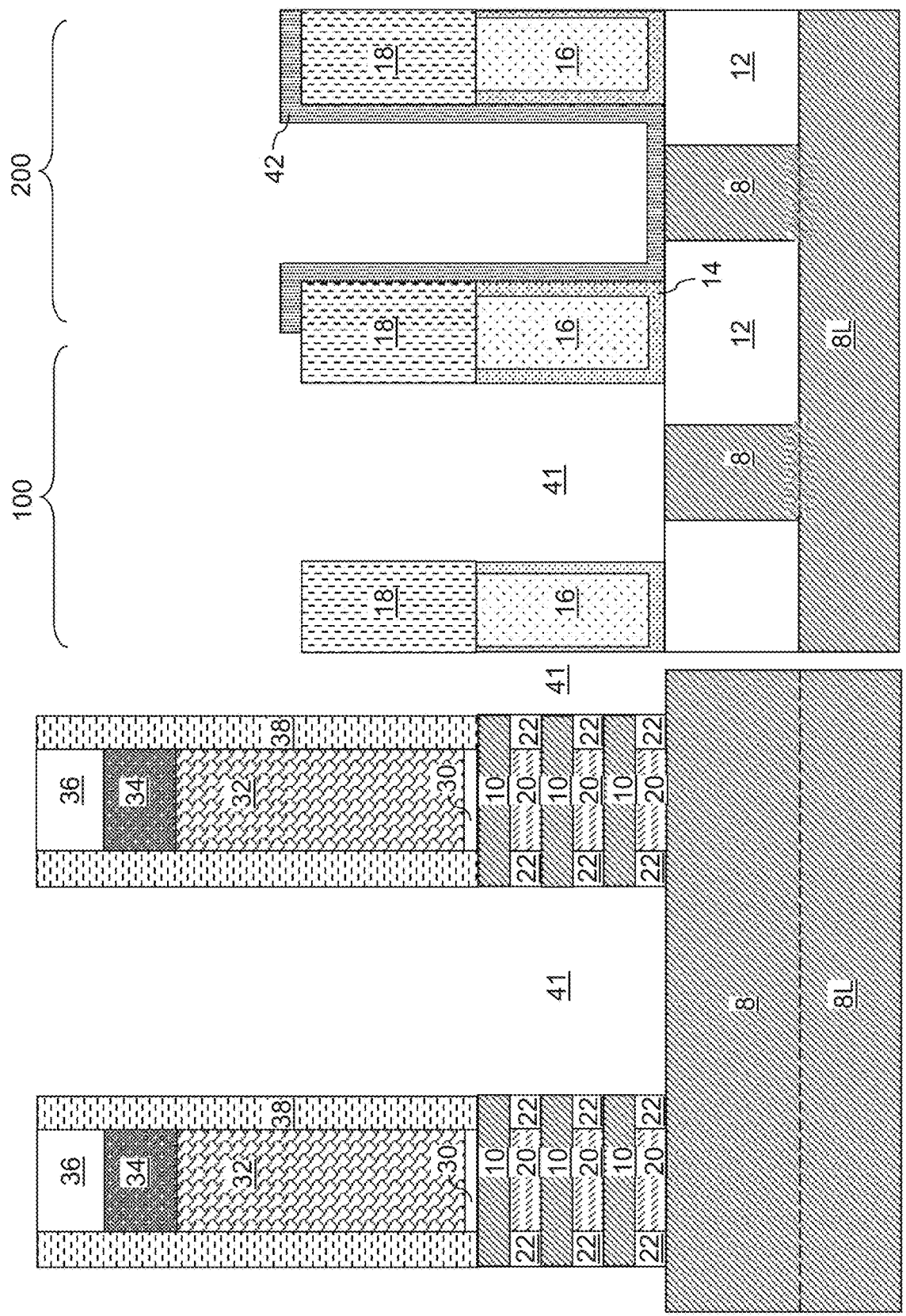

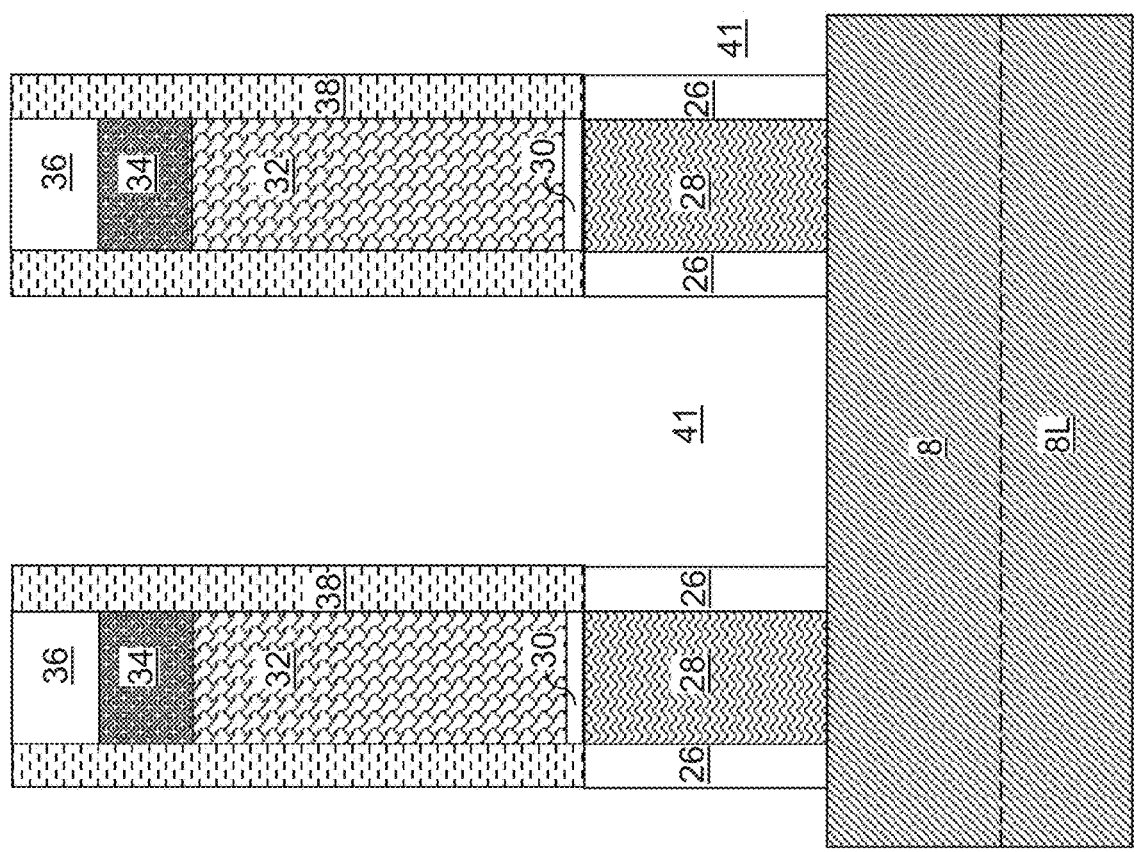

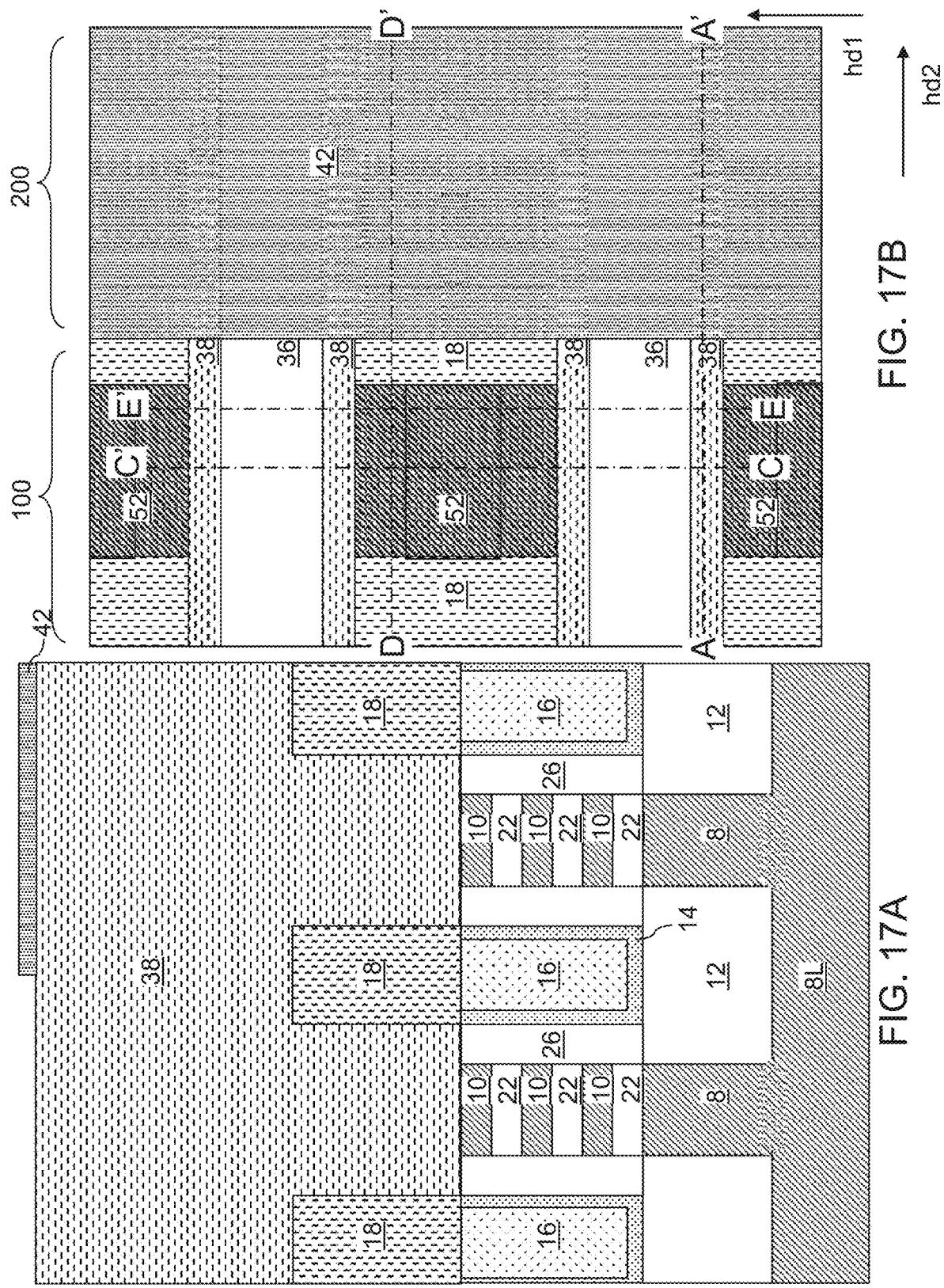

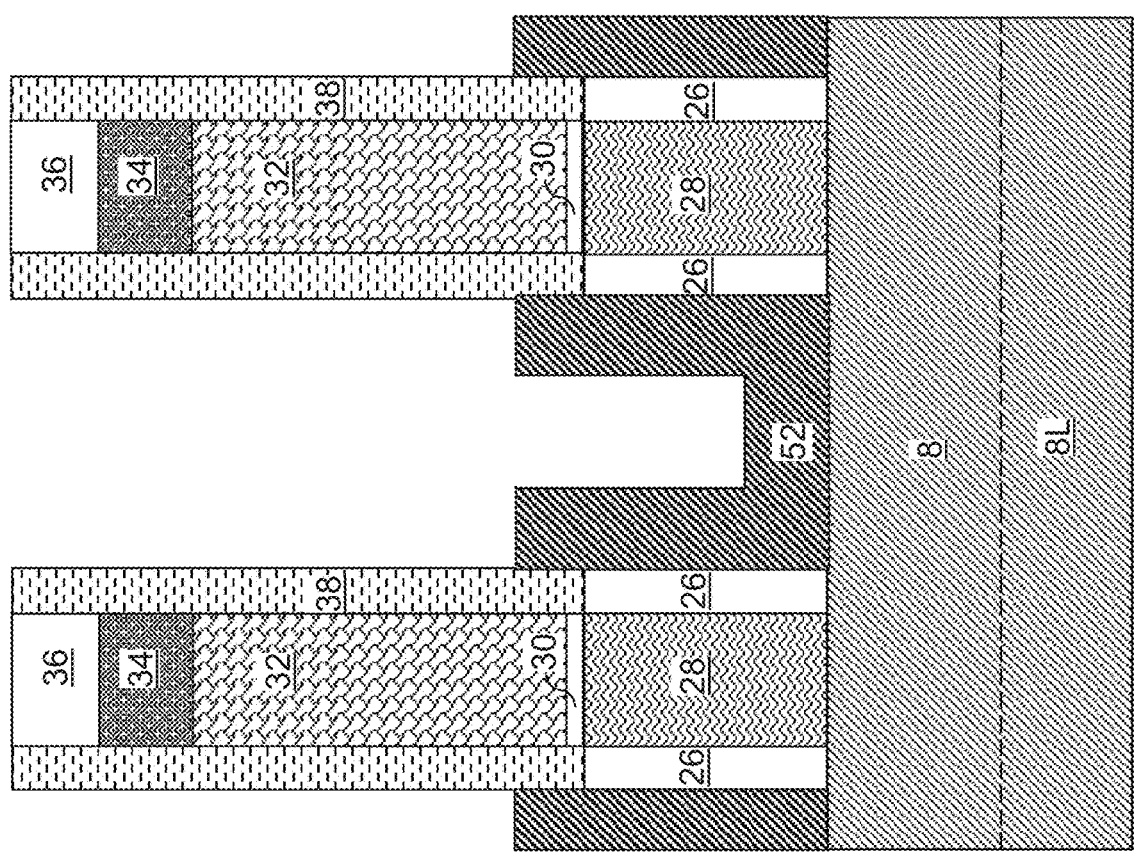

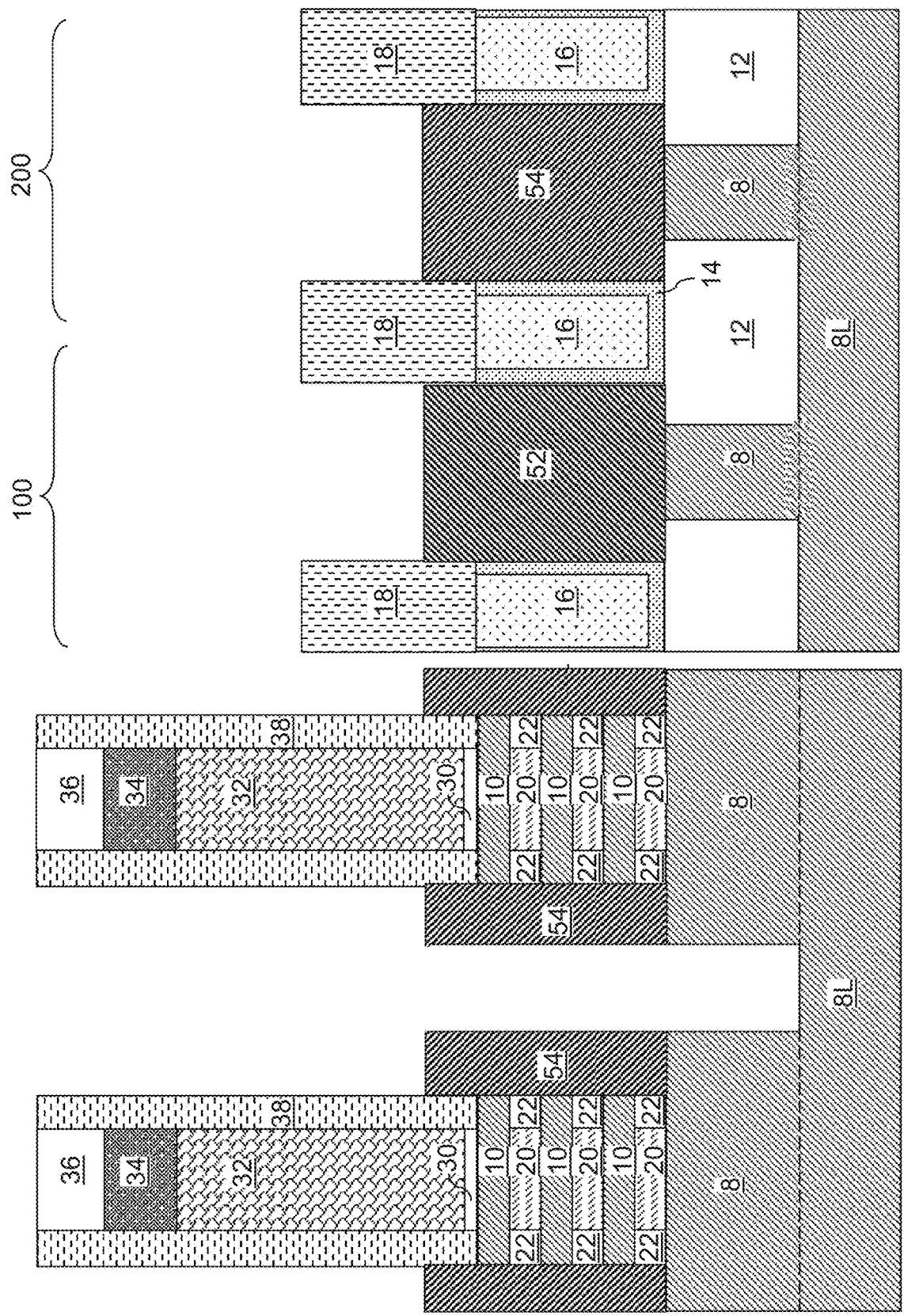

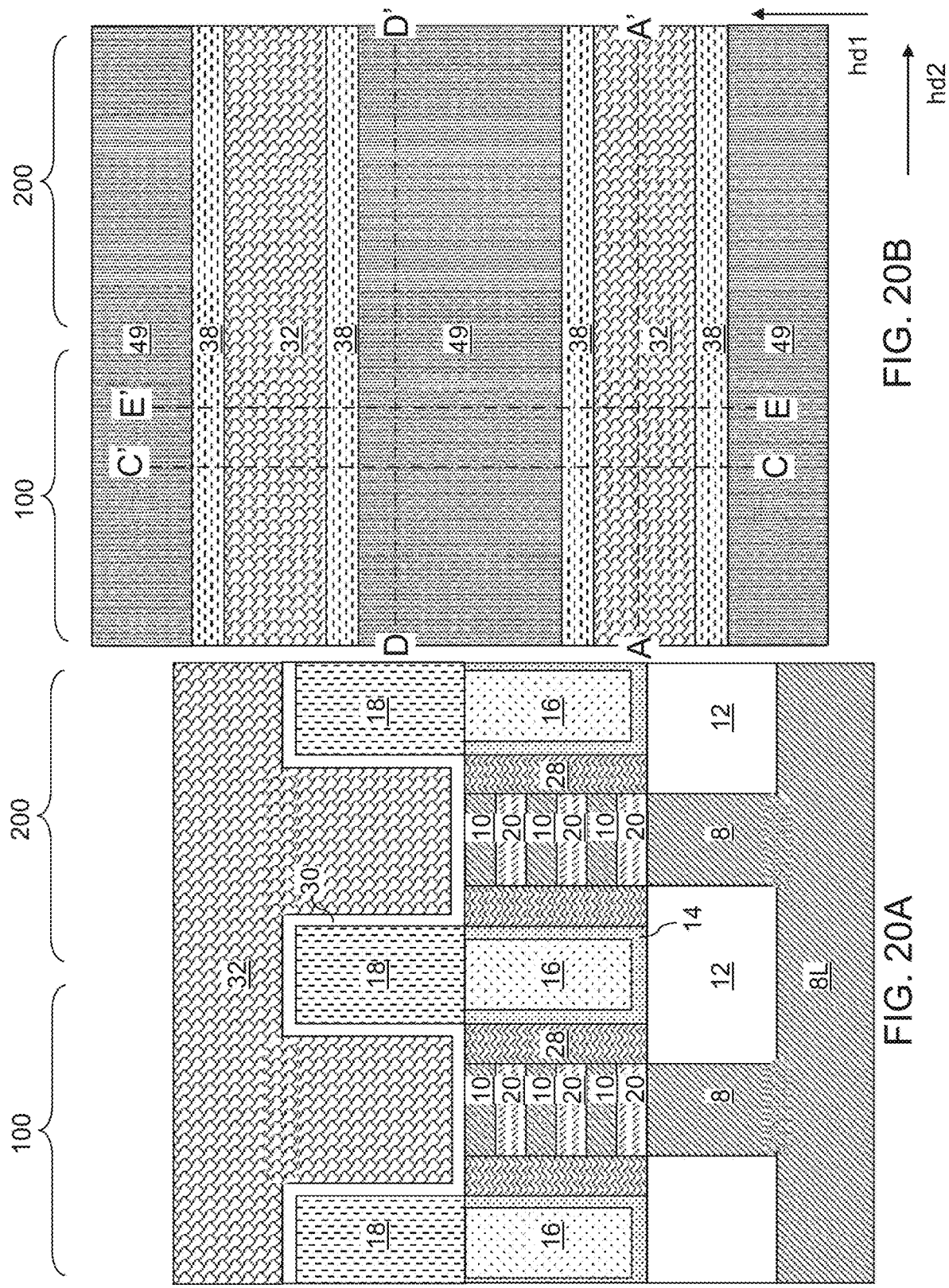

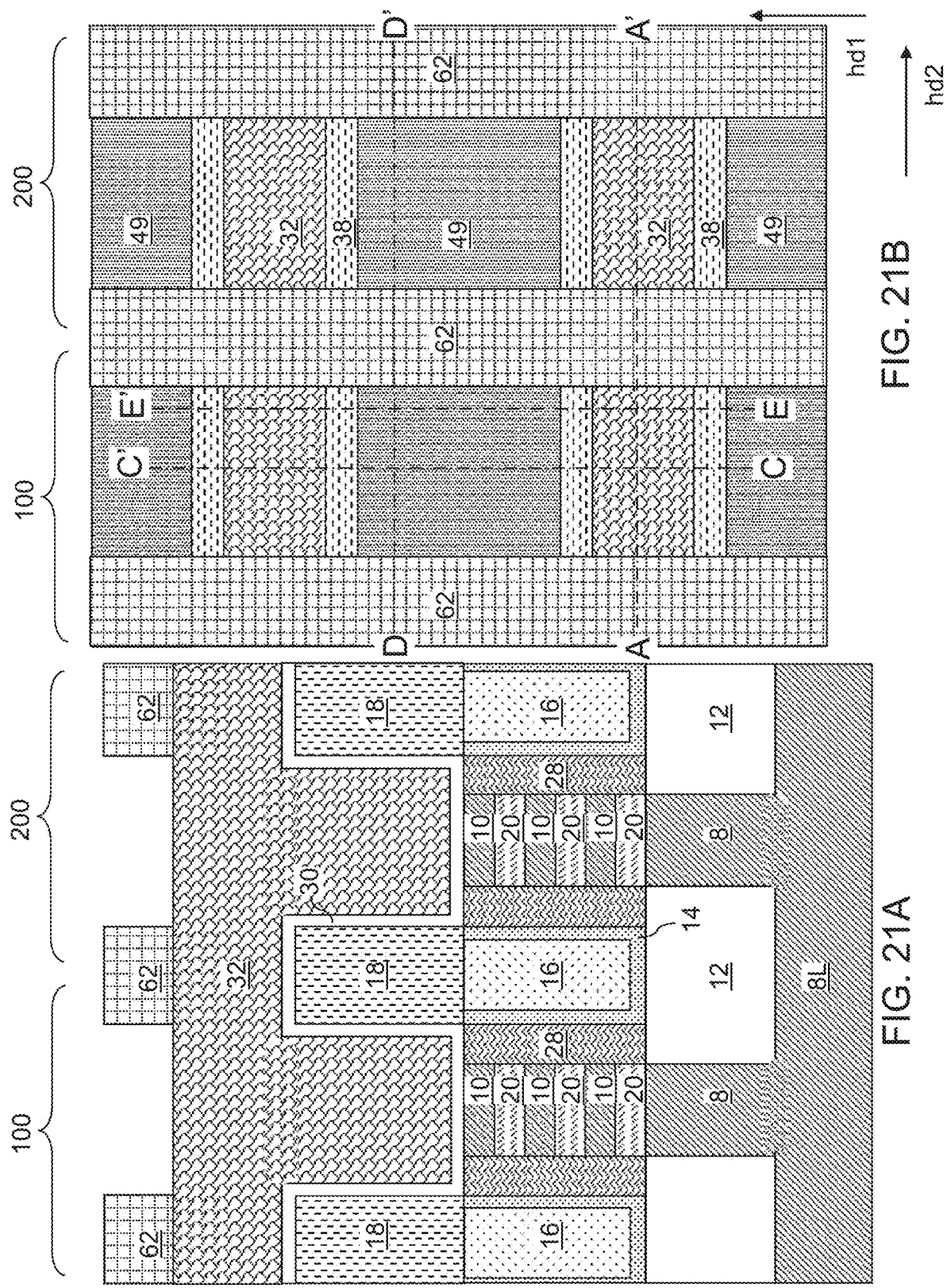

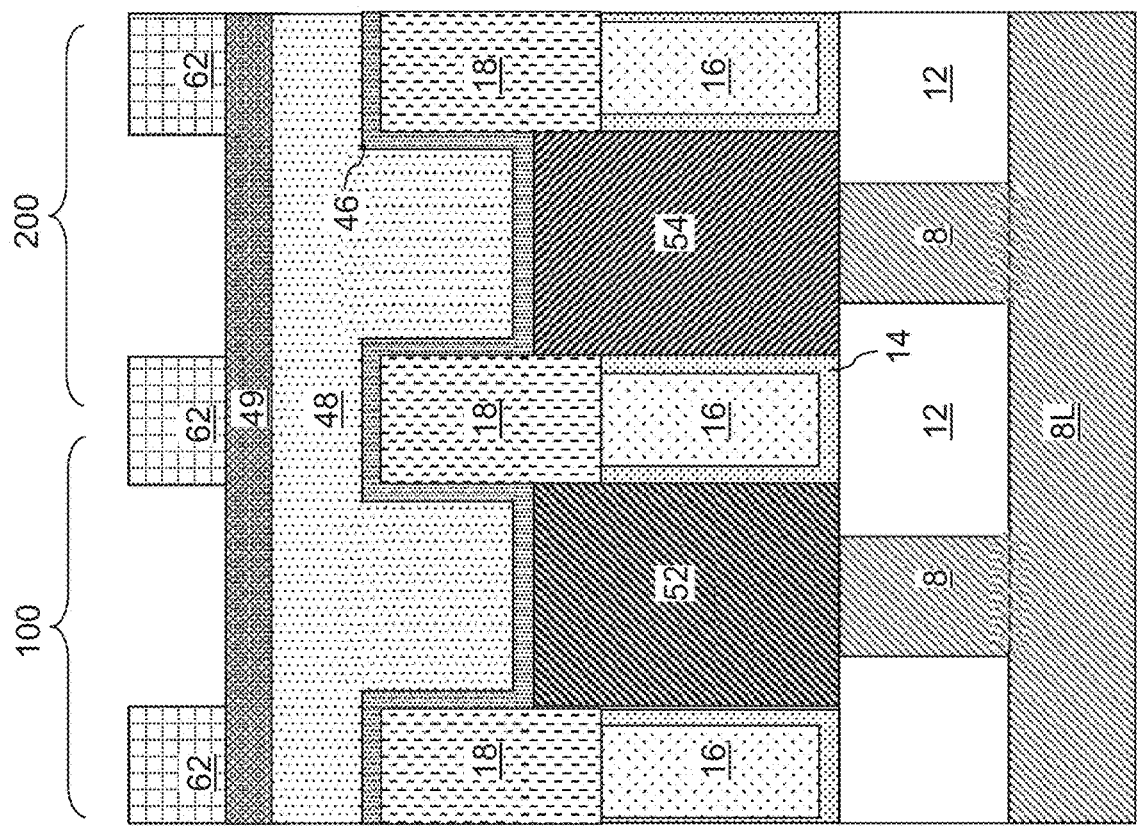
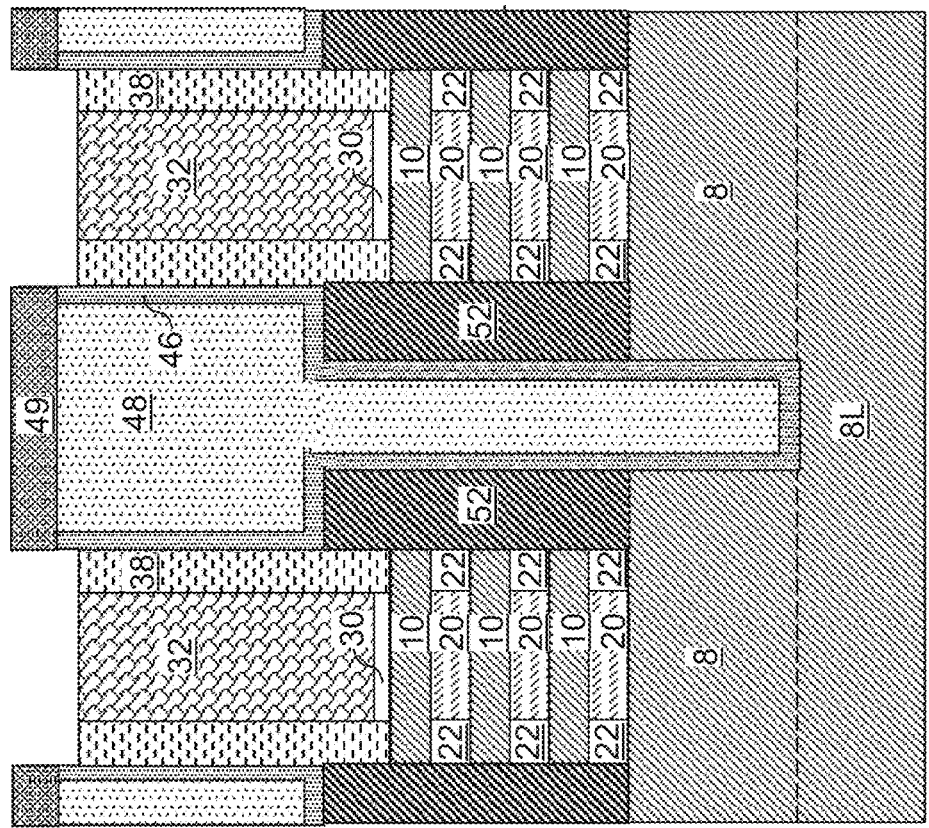
FIG. 21D
FIG. 21C

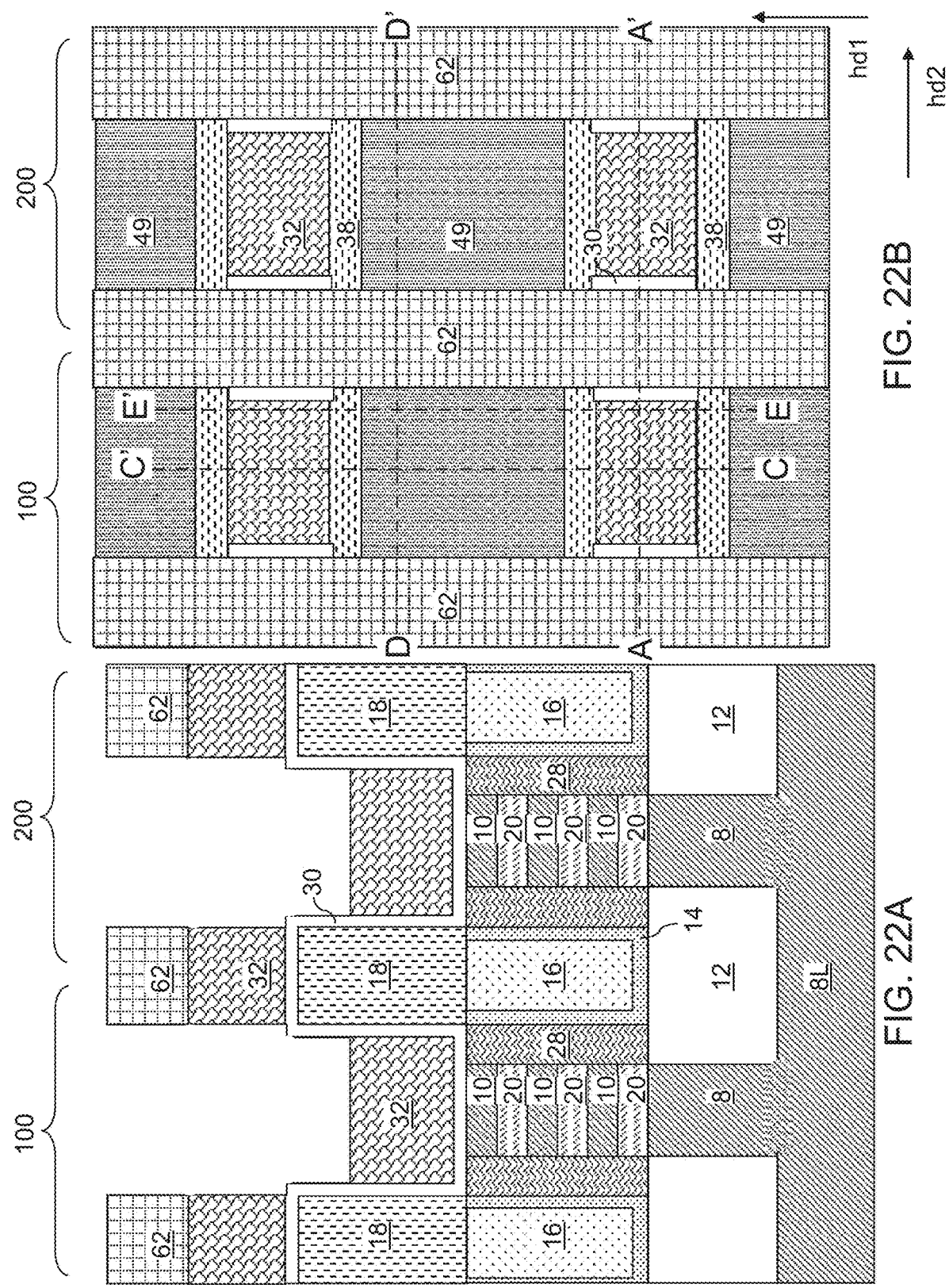

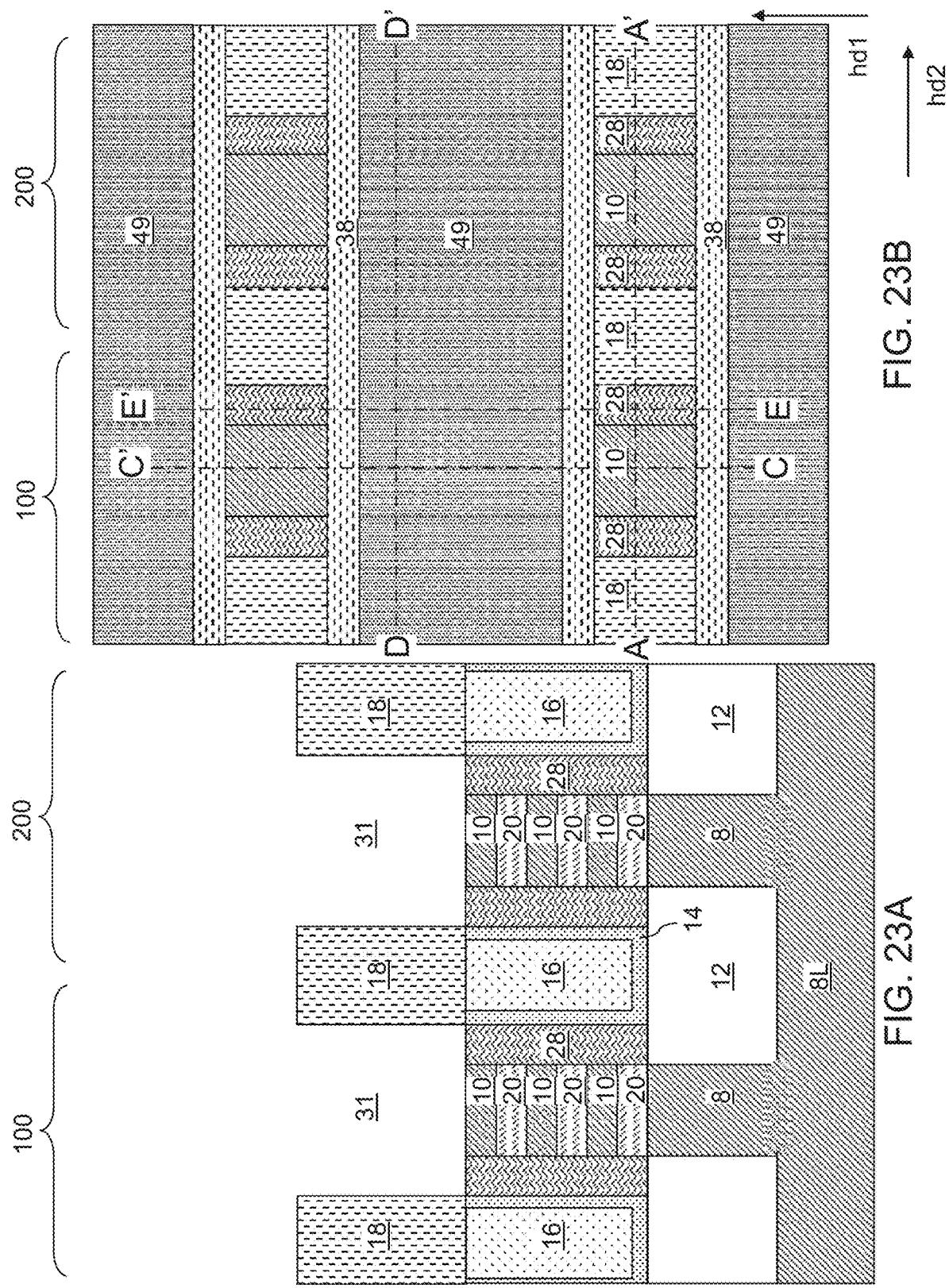

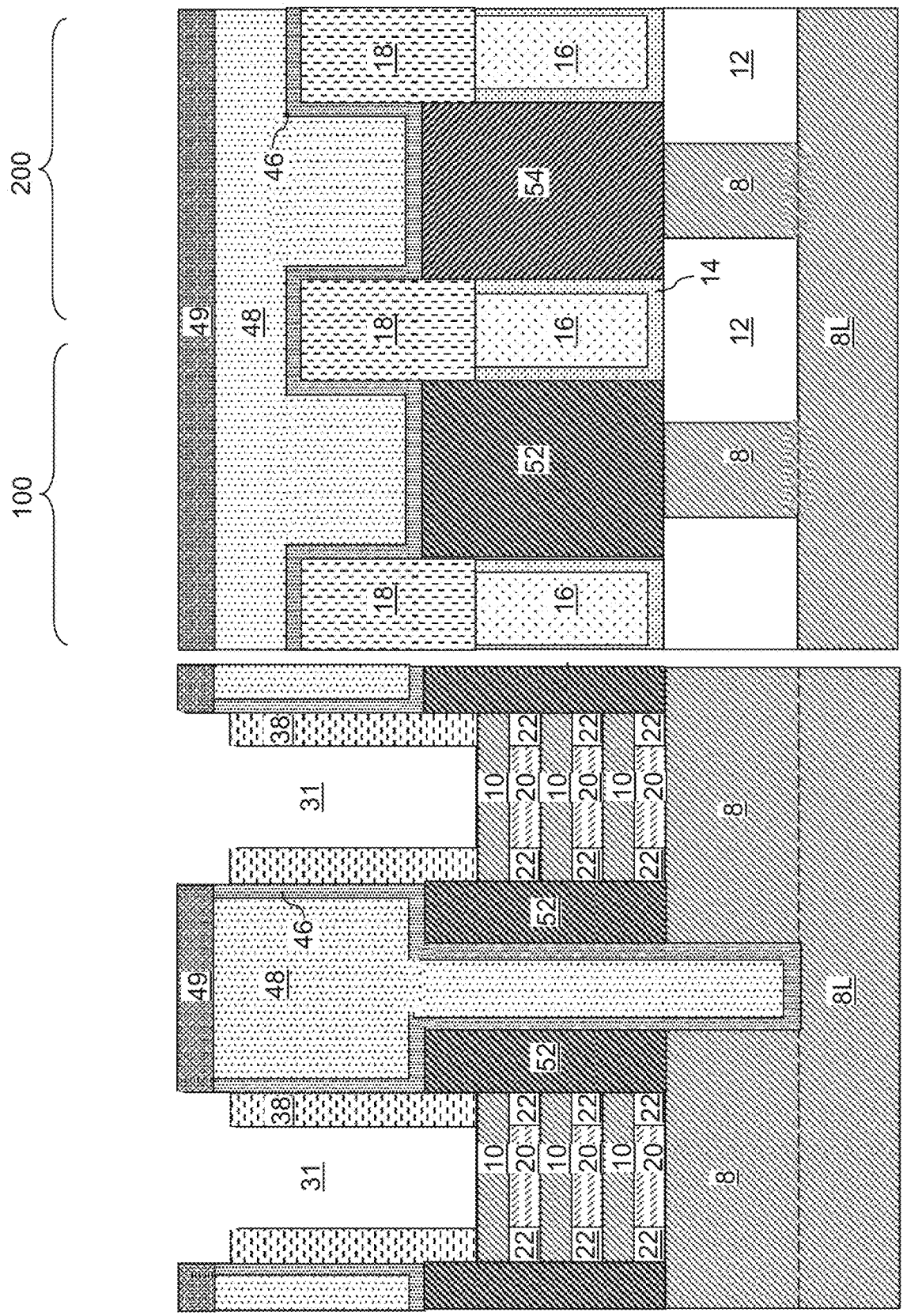

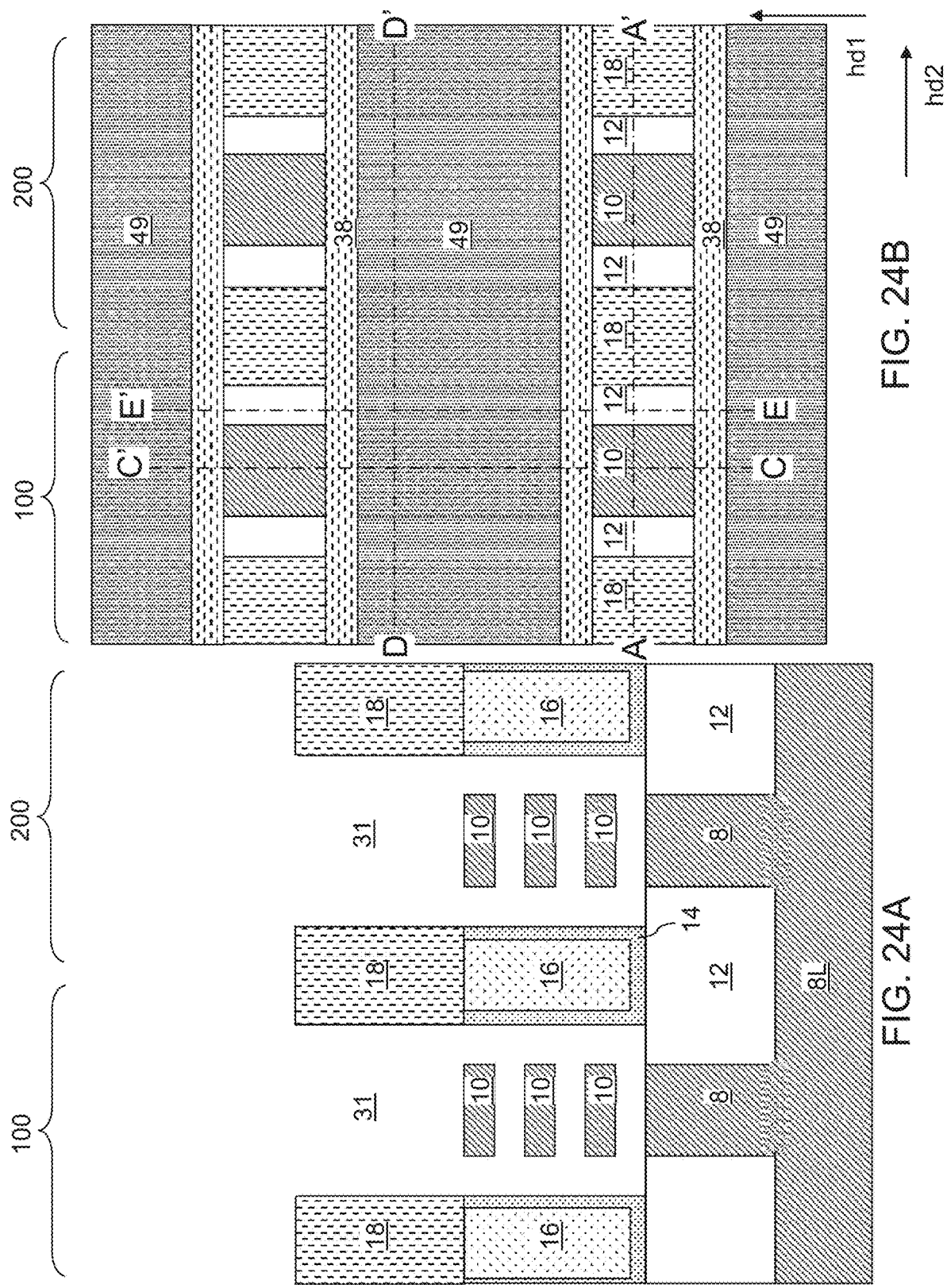

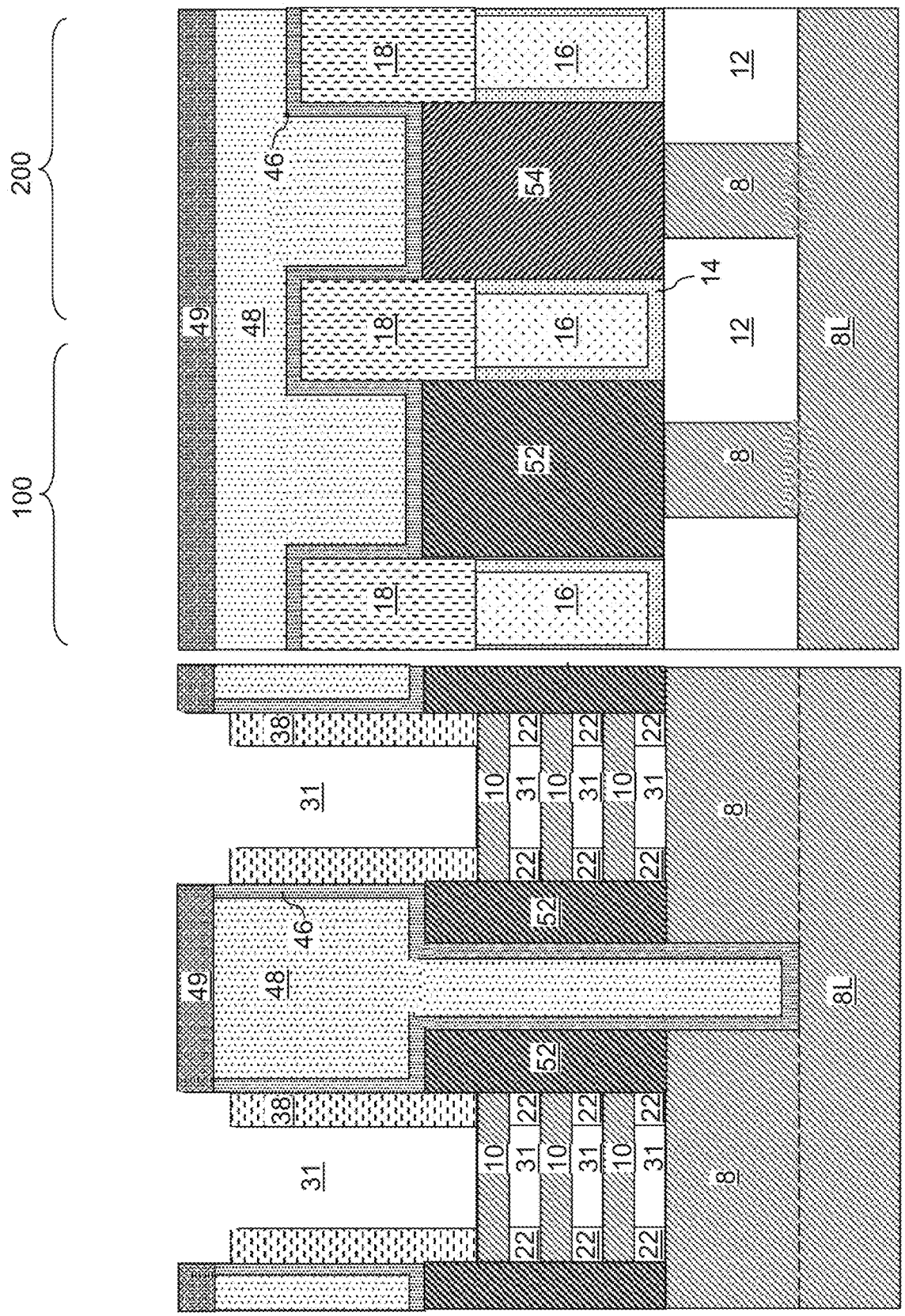

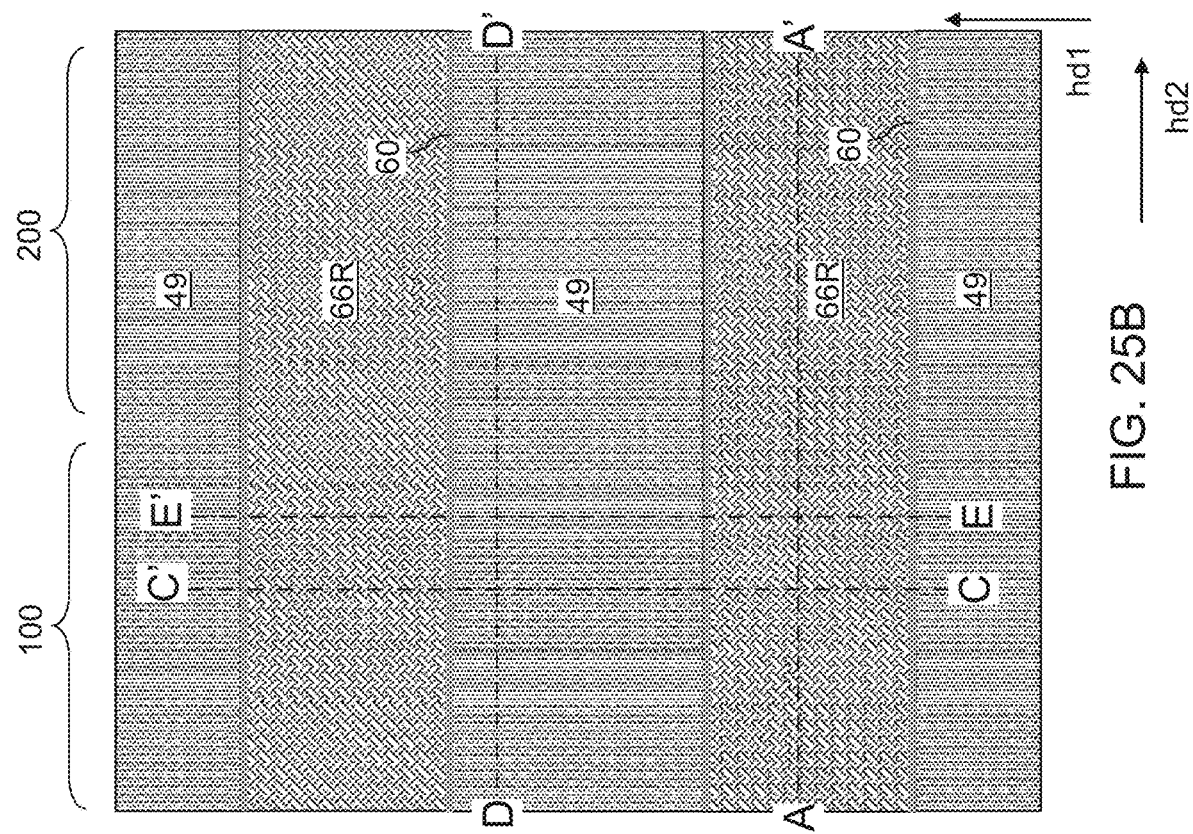
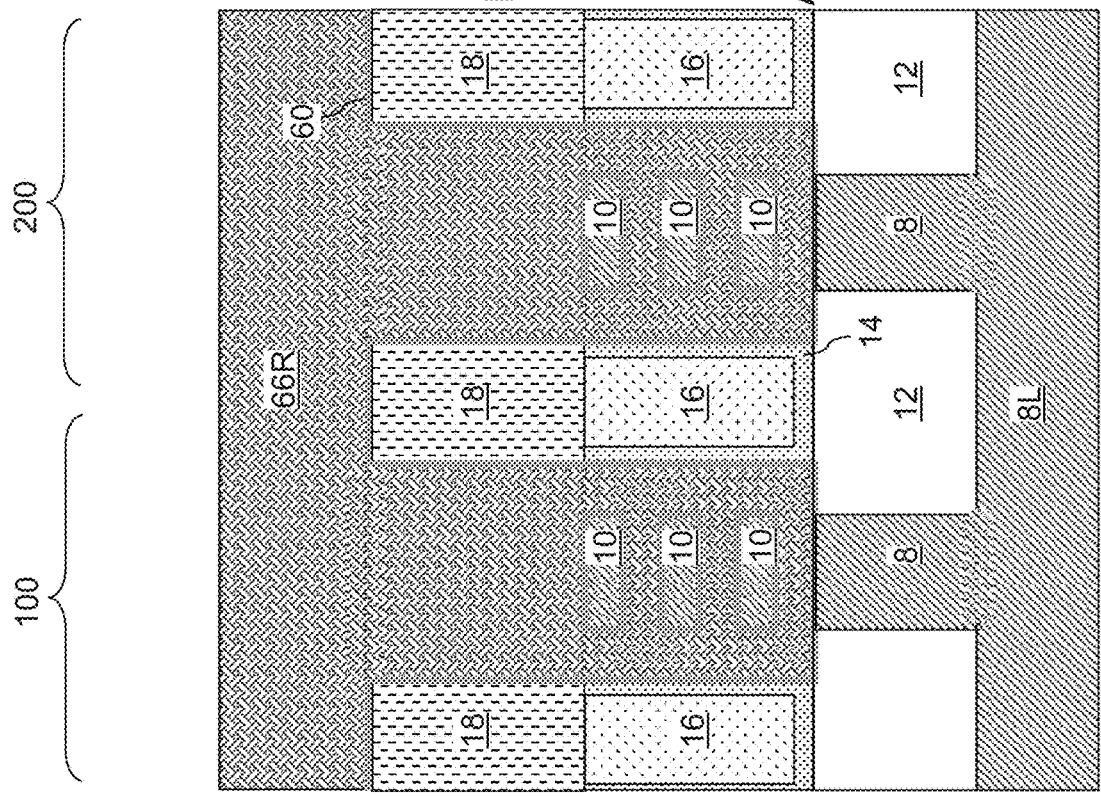
FIG. 25B
FIG. 25A

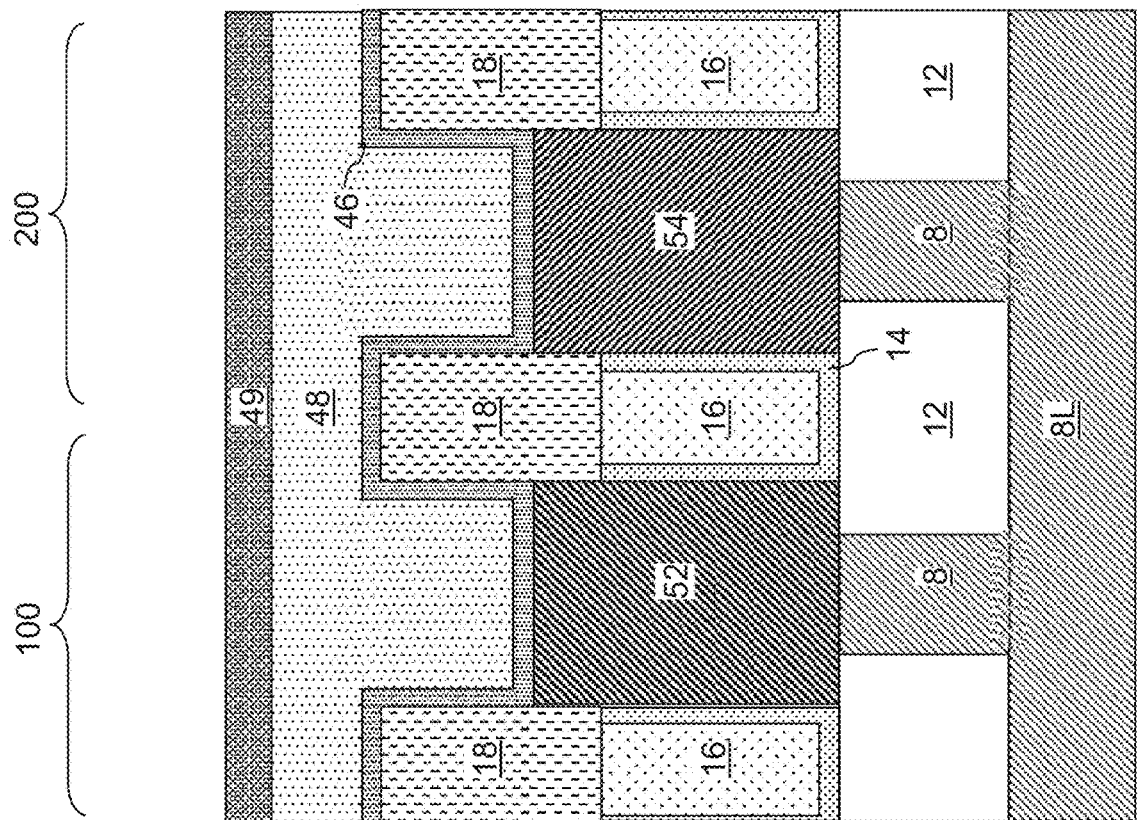
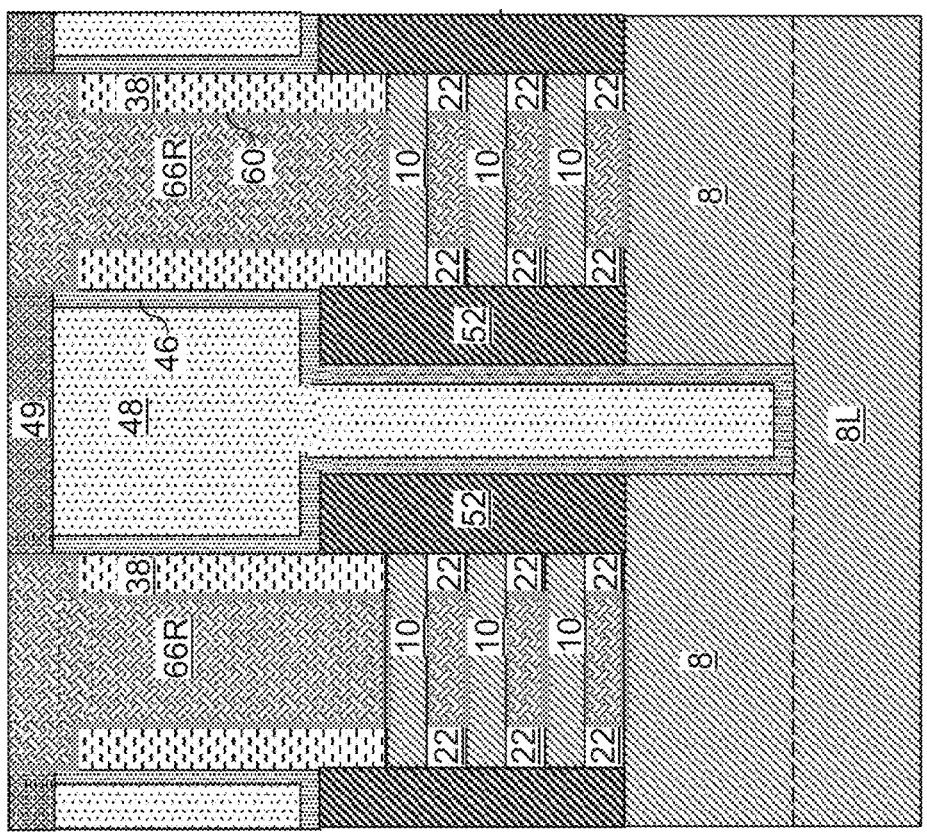
FIG. 25D
FIG. 25C

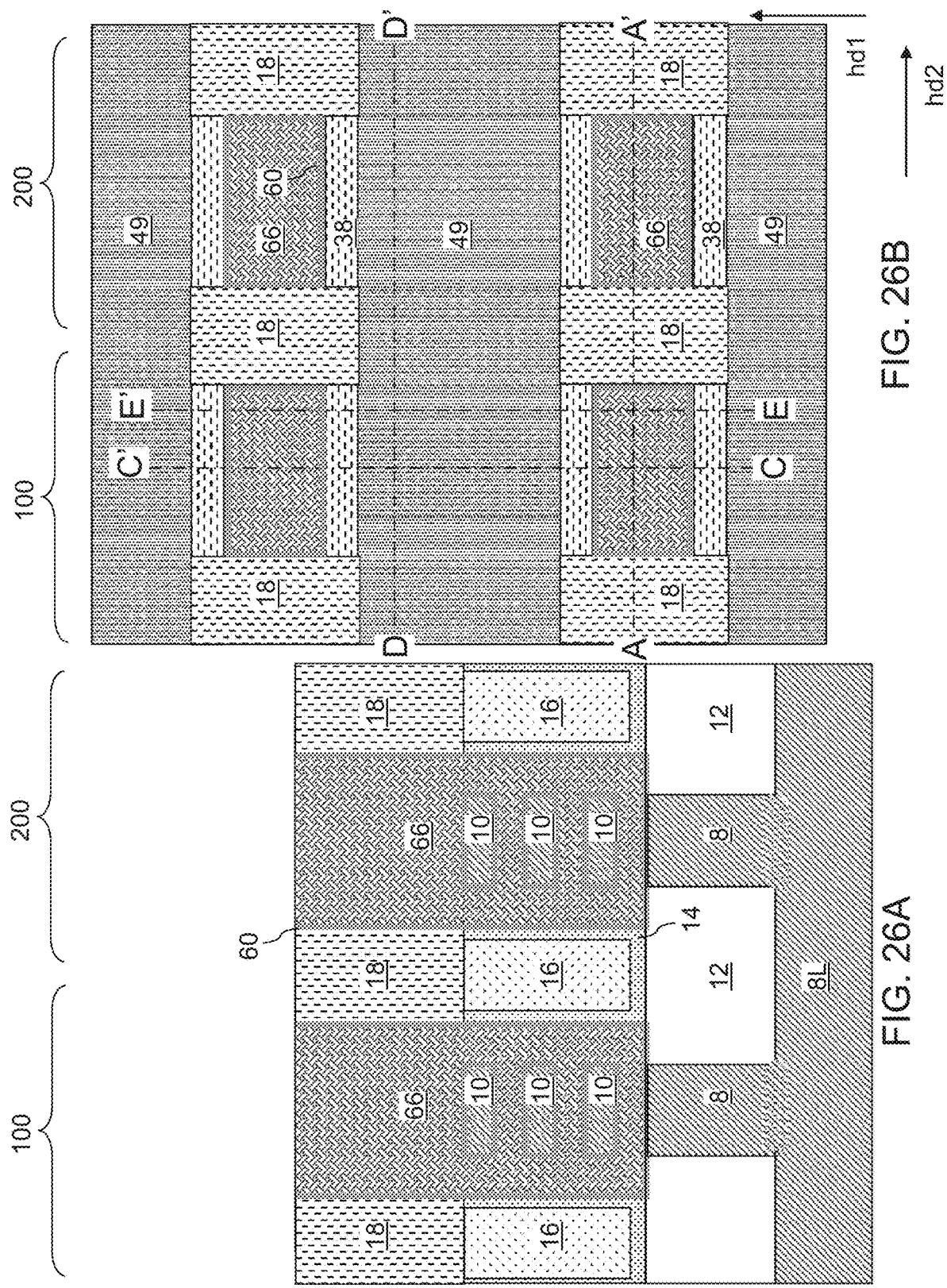

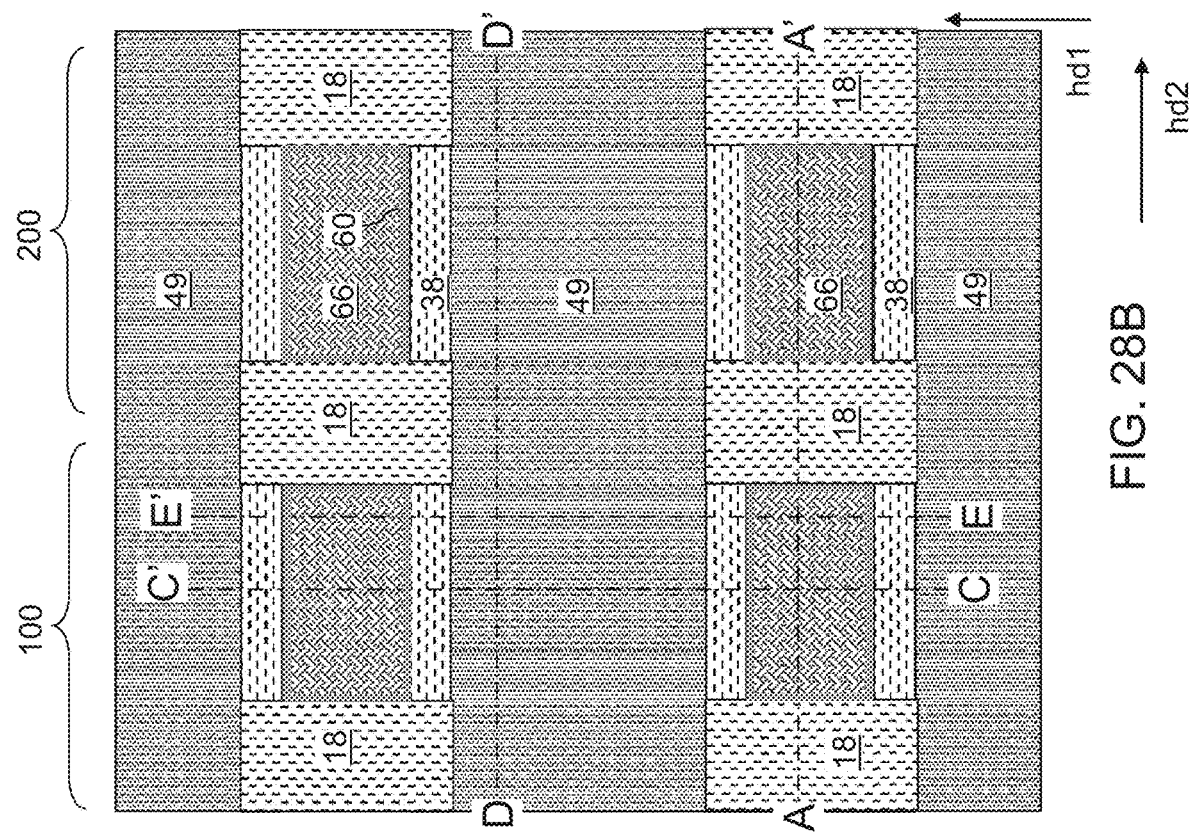
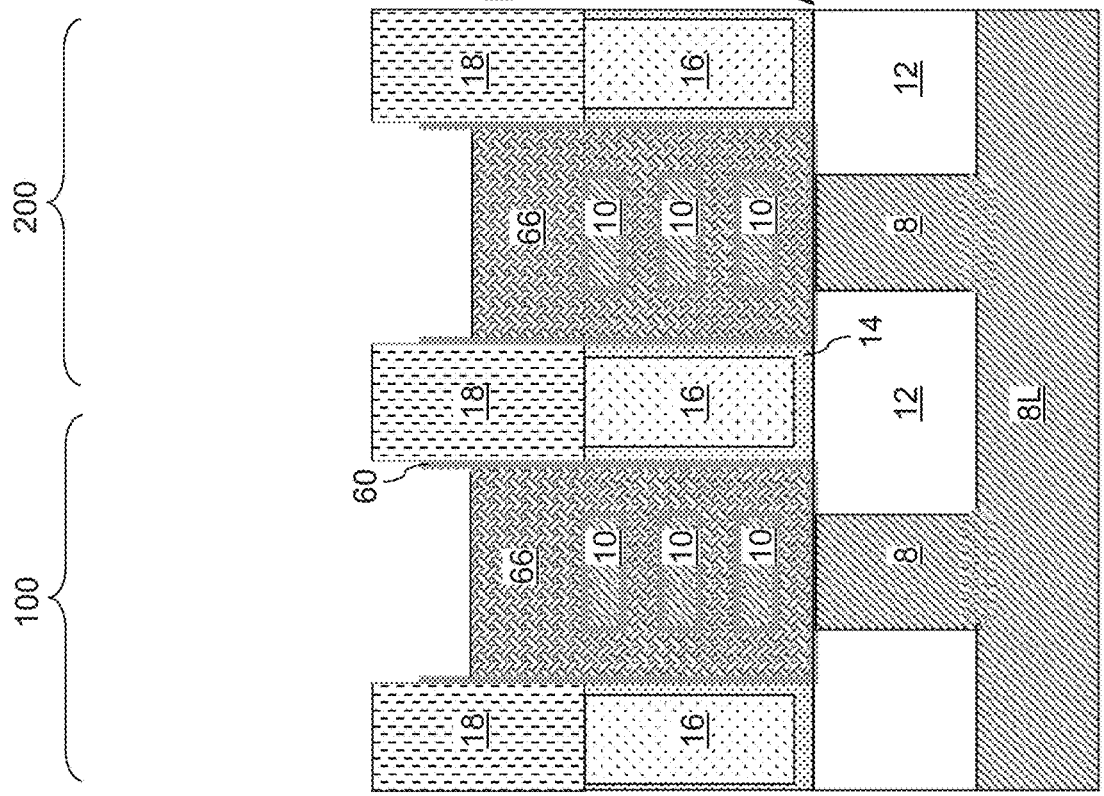
FIG. 28B
FIG. 28A

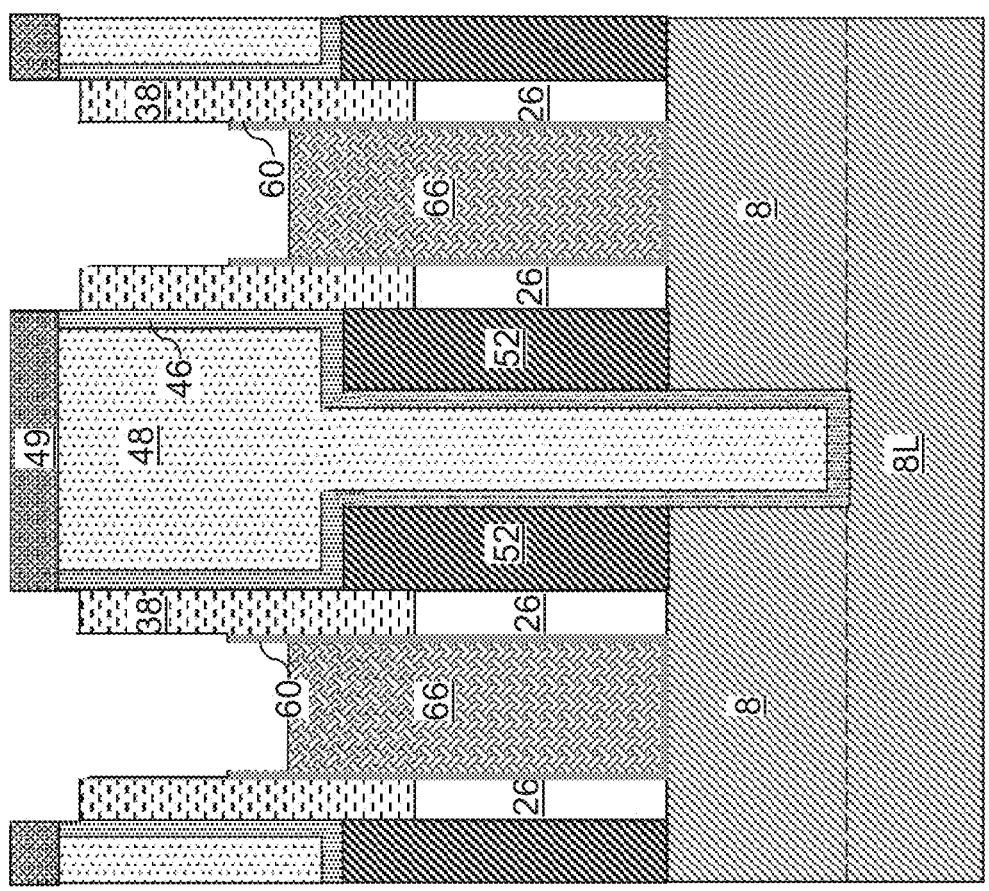

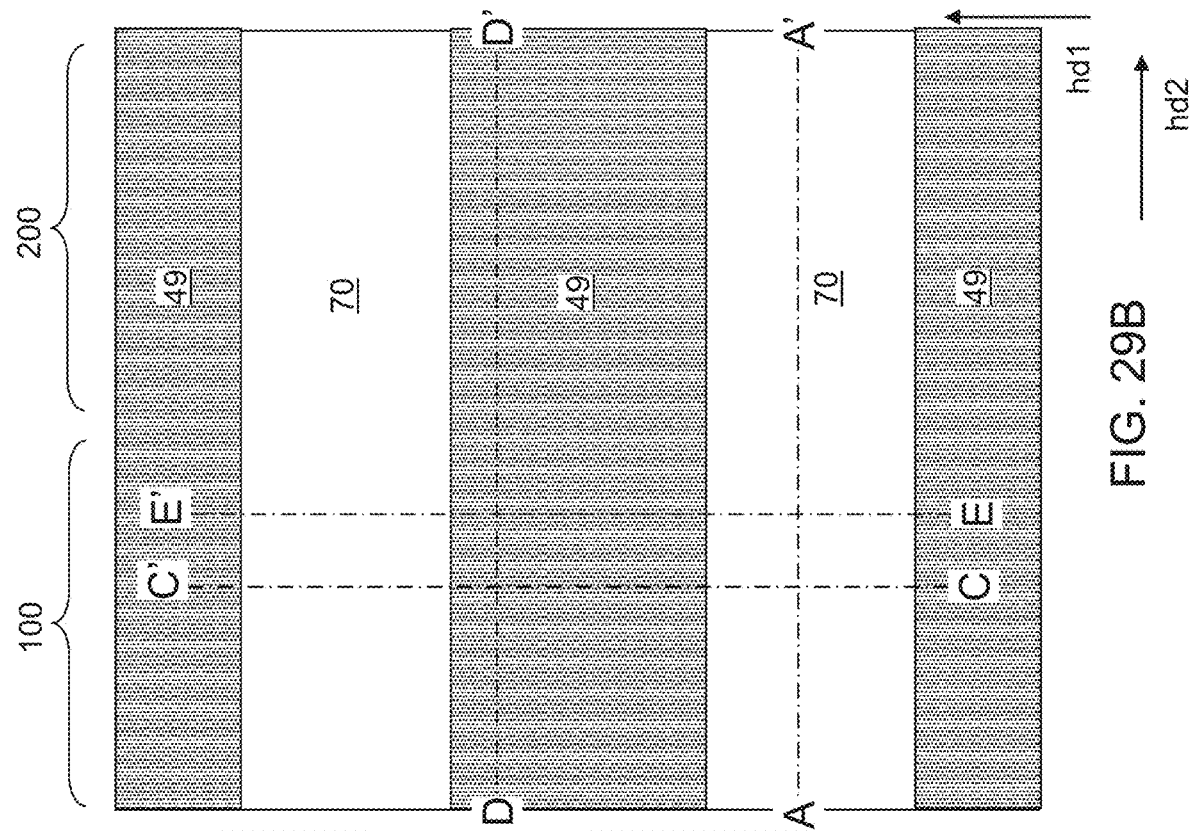
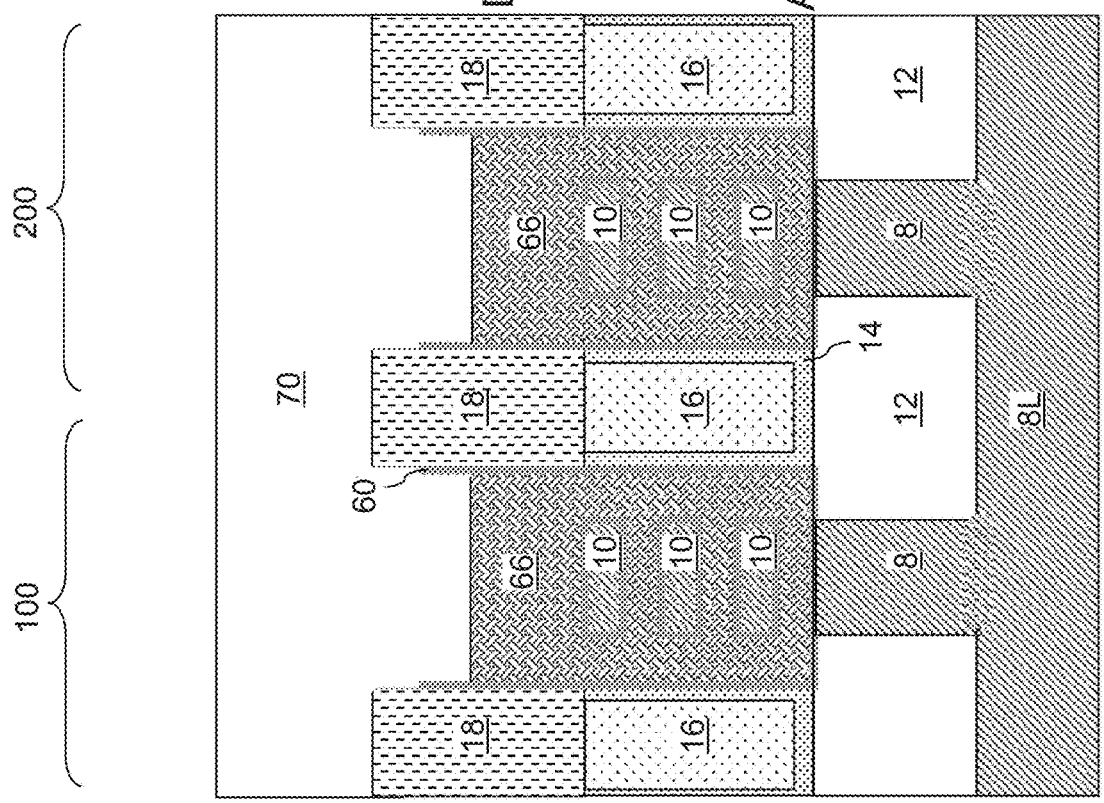
FIG. 29B
FIG. 29A

ANTENNA-FREE HIGH-K GATE DIELECTRIC FOR A GATE-ALL-AROUND TRANSISTOR AND METHODS OF FORMING THE SAME

BACKGROUND

Gate-all-around (GAA) transistors provide high device current density per device area by vertically stacking multiple channel plates. In addition, device density may be enhanced by forming gate electrodes for GAA transistors in proximity to one another. Ideally, interference and leakage current among neighboring GAA transistors may be minimized to enhance device isolation and to reduce interference among neighboring devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is vertical cross-sectional view of an exemplary structure after formation of an alternating stack of silicon-germanium layers and silicon layers, a hard mask layer, a semiconductor liner, a dielectric cover layer, and a semiconductor mandrel layer according to an embodiment of the present disclosure.

FIG. 1B is a top-down view of the exemplary structure of FIG. 1A. The vertical plane A-A' is the plane of the vertical cross-sectional view of FIG. 1A.

FIG. 2A is a vertical cross-sectional view of the exemplary structure after patterning semiconductor fin stacks according to an embodiment of the present disclosure.

FIG. 2B is a top-down view of the exemplary structure of FIG. 2A. The vertical plane A-A' is the plane of the vertical cross-sectional view of FIG. 2A.

FIG. 3A is a vertical cross-sectional view of the exemplary structure after formation of shallow trench isolation structures according to an embodiment of the present disclosure.

FIG. 3B is a top-down view of the exemplary structure of FIG. 3A. The vertical plane A-A' is the plane of the vertical cross-sectional view of FIG. 3A.

FIG. 4A is a vertical cross-sectional view of the exemplary structure after vertically recessing the shallow trench isolation structures according to an embodiment of the present disclosure.

FIG. 4B is a top-down view of the exemplary structure of FIG. 4A. The vertical plane A-A' is the plane of the vertical cross-sectional view of FIG. 4A.

FIG. 6A is a vertical cross-sectional view of the exemplary structure after formation of hybrid dielectric fins according to an embodiment of the present disclosure.

FIG. 6B is a top-down view of the exemplary structure of FIG. 6A. The vertical plane A-A' is the plane of the vertical cross-sectional view of FIG. 6A.

FIG. 7A is a vertical cross-sectional view of the exemplary structure after vertically recessing the hybrid dielectric fins according to an embodiment of the present disclosure.

FIG. 7B is a top-down view of the exemplary structure of FIG. 7A. The vertical plane A-A' is the plane of the vertical cross-sectional view of FIG. 7A.

FIG. 8A is a vertical cross-sectional view of the exemplary structure after formation of etch stop dielectric fins according to an embodiment of the present disclosure.

FIG. 8B is a top-down view of the exemplary structure of FIG. 8A. The vertical plane A-A' is the plane of the vertical cross-sectional view of FIG. 8A.

FIG. 9A is a vertical cross-sectional view of the exemplary structure after removal of hard mask plates and upper portions of the cladding silicon-germanium alloy structures according to an embodiment of the present disclosure.

FIG. 9B is a top-down view of the exemplary structure of FIG. 9A. The vertical plane A-A' is the plane of the vertical cross-sectional view of FIG. 9A.

FIG. 10A is a vertical cross-sectional view of the exemplary structure after formation of gate template structures including a respective set of a sacrificial gate liner, a sacrificial gate structure, a sacrificial gate cap, and a gate mask structure, and subsequent formation of dielectric gate spacers according to an embodiment of the present disclosure.

FIG. 10B is a top-down view of the exemplary structure of FIG. 10A. The vertical plane A-A' is the plane of the vertical cross-sectional view of FIG. 10A.

FIG. 11C is a vertical cross-sectional view along the vertical plane C-C' of FIG. 11B.

FIG. 11D is a vertical cross-sectional view along the vertical plane D-D' of FIG. 11B.

FIG. 12C is a vertical cross-sectional view along the vertical plane C-C' of FIG. 12B.

FIG. 12D is a vertical cross-sectional view along the vertical plane D-D' of FIG. 12B.

FIG. 13A is a vertical cross-sectional view of the exemplary structure after formation of outer dielectric channel spacers according to an embodiment of the present disclosure.

FIG. 13B is a top-down view of the exemplary structure of FIG. 13A. The vertical plane A-A' is the plane of the vertical cross-sectional view of FIG. 13A.

FIG. 13C is a vertical cross-sectional view along the vertical plane C-C' of FIG. 13B.

FIG. 13D is a vertical cross-sectional view along the vertical plane D-D' of FIG. 13B.

FIG. 14E is a vertical cross-sectional view along the vertical plane E-E' of FIG. 14B.

FIG. 15A is a vertical cross-sectional view of the exemplary structure after formation of inner dielectric channel spacers according to an embodiment of the present disclosure.

FIG. 15B is a top-down view of the exemplary structure of FIG. 15A. The vertical plane A-A' is the plane of the vertical cross-sectional view of FIG. 15A.

FIG. 15C is a vertical cross-sectional view along the vertical plane C-C' of FIG. 15B.

FIG. 15D is a vertical cross-sectional view along the vertical plane D-D' of FIG. 15B.

FIG. 16A is a vertical cross-sectional view of the exemplary structure after formation of a first dielectric mask layer according to an embodiment of the present disclosure.

FIG. 16B is a top-down view of the exemplary structure of FIG. 16A. The vertical plane A-A' is the plane of the vertical cross-sectional view of FIG. 16A.

FIG. 16C is a vertical cross-sectional view along the vertical plane C-C' of FIG. 16B.

FIG. 16D is a vertical cross-sectional view along the vertical plane D-D' of FIG. 16B.

FIG. 16E is a vertical cross-sectional view along the vertical plane E-E' of FIG. 16B.

FIG. 17A is a vertical cross-sectional view of the exemplary structure after formation of first source/drain regions according to an embodiment of the present disclosure.

FIG. 17B is a top-down view of the exemplary structure of FIG. 17A. The vertical plane A-A' is the plane of the vertical cross-sectional view of FIG. 17A.

FIG. 17E is a vertical cross-sectional view along the vertical plane E-E' of FIG. 17B.

FIG. 19C is a vertical cross-sectional view along the vertical plane C-C' of FIG. 19B.

FIG. 19D is a vertical cross-sectional view along the vertical plane D-D' of FIG. 19B.

FIG. 20A is a vertical cross-sectional view of the exemplary structure after formation of inter-device isolation structures according to an embodiment of the present disclosure.

FIG. 20B is a top-down view of the exemplary structure of FIG. 20A. The vertical plane A-A' is the plane of the vertical cross-sectional view of FIG. 20A.

FIG. 21A is a vertical cross-sectional view of the exemplary structure after formation of etch barrier structures according to an embodiment of the present disclosure.

FIG. 21B is a top-down view of the exemplary structure of FIG. 21A. The vertical plane A-A' is the plane of the vertical cross-sectional view of FIG. 21A.

FIG. 21C is a vertical cross-sectional view along the vertical plane C-C' of FIG. 21B.

FIG. 21D is a vertical cross-sectional view along the vertical plane D-D' of FIG. 21B.

FIG. 22A is a vertical cross-sectional view of the exemplary structure after removal of partial removal of sacrificial gate structures according to an embodiment of the present disclosure.

FIG. 22B is a top-down view of the exemplary structure of FIG. 22A. The vertical plane A-A' is the plane of the vertical cross-sectional view of FIG. 22A.

FIG. 23A is a vertical cross-sectional view of the exemplary structure after removal of sacrificial gate structures and sacrificial gate liners according to an embodiment of the present disclosure.

FIG. 23B is a top-down view of the exemplary structure of FIG. 23A. The vertical plane A-A' is the plane of the vertical cross-sectional view of FIG. 23A.

FIG. 23C is a vertical cross-sectional view along the vertical plane C-C' of FIG. 23B.

FIG. 23D is a vertical cross-sectional view along the vertical plane D-D' of FIG. 23B.

FIG. 24A is a vertical cross-sectional view of the exemplary structure after removal of silicon-germanium plates and formation of gate cavities according to an embodiment of the present disclosure.

FIG. 24B is a top-down view of the exemplary structure of FIG. 24A. The vertical plane A-A' is the plane of the vertical cross-sectional view of FIG. 24A.

FIG. 24C is a vertical cross-sectional view along the vertical plane C-C' of FIG. 24B.

FIG. 24D is a vertical cross-sectional view along the vertical plane D-D' of FIG. 24B.

FIG. 25A is a vertical cross-sectional view of the exemplary structure after formation of gate dielectric layer and gate electrode rails according to an embodiment of the present disclosure.

FIG. 25B is a top-down view of the exemplary structure of FIG. 25A. The vertical plane A-A' is the plane of the vertical cross-sectional view of FIG. 25A.

FIG. 25C is a vertical cross-sectional view along the vertical plane C-C' of FIG. 25B.

FIG. 25D is a vertical cross-sectional view along the vertical plane D-D' of FIG. 25B.

FIG. 26A is a vertical cross-sectional view of the exemplary structure after formation of gate stacks including a respective gate dielectric layer and a respective gate electrode according to an embodiment of the present disclosure.

FIG. 26B is a top-down view of the exemplary structure of FIG. 26A. The vertical plane A-A' is the plane of the vertical cross-sectional view of FIG. 26A.

FIG. 28A is a vertical cross-sectional view of the exemplary structure after vertically recessing gate electrodes and gate dielectric layers by performing a second anisotropic etch process according to an embodiment of the present disclosure.

FIG. 28B is a top-down view of the exemplary structure of FIG. 28A. The vertical plane A-A' is the plane of the vertical cross-sectional view of FIG. 28A.

FIG. 28E is a vertical cross-sectional view along the vertical plane E-E' of FIG. 28B.

FIG. 29A is a vertical cross-sectional view of the exemplary structure after formation of a contact-level dielectric layer according to an embodiment of the present disclosure.

FIG. 29B is a top-down view of the exemplary structure of FIG. 29A. The vertical plane A-A' is the plane of the vertical cross-sectional view of FIG. 29A.

FIG. 30D is a vertical cross-sectional view along the vertical plane D-D' of FIG. 30B.

FIG. 30E is a vertical cross-sectional view along the vertical plane E-E' of FIG. 30B.

FIG. 31 is a flowchart illustrating steps for forming the exemplary structure of the present disclosure according to an embodiment of the present disclosure.

DETAILED DESCRIPTION

Figures 5A, 5B:
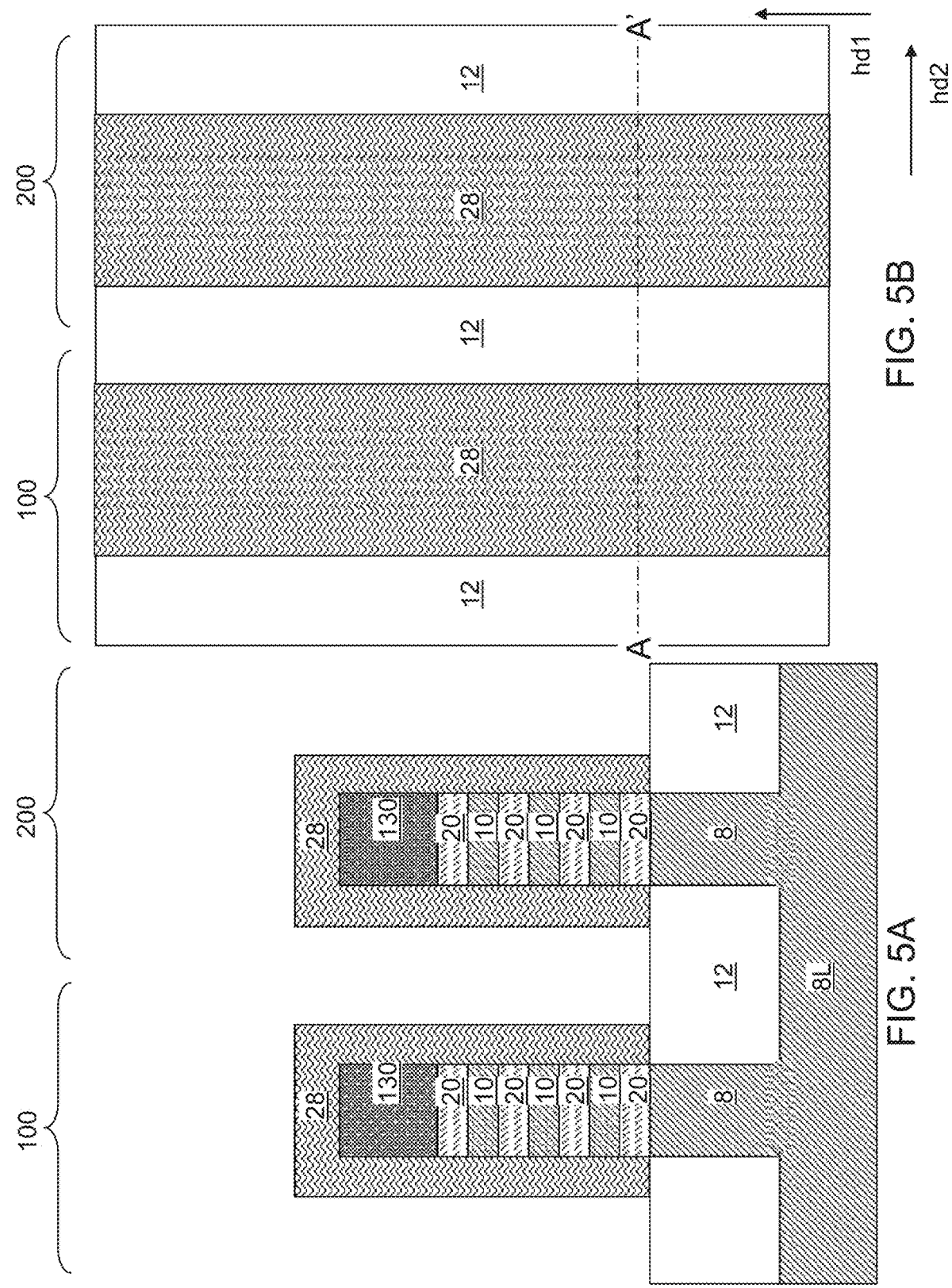
FIG. 5A is a vertical cross-sectional view of the exemplary structure after formation of cladding silicon-germanium alloy structures according to an embodiment of the present disclosure.
FIG. 5B is a top-down view of the exemplary structure of FIG. 5A. The vertical plane A-A' is the plane of the vertical cross-sectional view of FIG. 5A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to generally to semiconductor devices, and specifically to gate-all-around (GAA) field effect transistors including antenna-free high dielectric constant (high-k) gate dielectrics and methods of forming the same. Generally, a gate dielectric having a high dielectric constant greater than 7.9 may include a dielectric metal oxide material such as aluminum oxide, hafnium oxide, lanthanum oxide, etc. Other suitable dielectric materials are within the contemplated scope of disclosure. Etching a dielectric metal oxide material generates a metallic residue at the atomic level. For example, metal elements that are not fully covalently bonded to oxygen atoms are capable of releasing free electrons. Thus, an etched surface of a dielectric metal oxide material may function as a surface conduction path for electrons. A continuous etched surface of a gate dielectric material including a dielectric metal oxide that extends across multiple gate electrodes may provide a leakage path between neighboring transistors. Such a problem is more prominent in GAA transistors. The present disclosure is directed to structures the remove surface leakage paths on gate dielectric layers including a dielectric metal oxide, and methods for forming the same. The various embodiments of which are discussed in detail herebelow.

FIG. 1A is vertical cross-sectional view of an exemplary structure after formation of an alternating stack of silicon-germanium layers and silicon layers, a hard mask layer, a semiconductor liner, a dielectric cover layer, and a semiconductor mandrel layer according to an embodiment of the present disclosure. FIG. 1B is a top-down view of the exemplary structure of FIG. 1A. The vertical plane A-A' is the plane of the vertical cross-sectional view of FIG. 1A. Referring to FIGS. 1A and 1B, an exemplary structure according to an embodiment of the present disclosure is illustrated, which includes a substrate containing a substrate single crystalline semiconductor layer 8L. The substrate may include a semiconductor wafer such as a commercially available single crystalline silicon wafer. In one embodiment, the substrate single crystalline semiconductor layer 8L may comprise a substrate single crystalline semiconductor layer having a doping of a first conductivity type, which may be p-type or n-type. The atomic concentration dopants of the first conductivity type in the substrate single crystalline semiconductor layer 8L may be in a range from $1.0 \times 10^{14}/cm^3$ to $1.0 \times 10^{17}/cm^3$, although lesser and greater dopant concentrations may also be used. The thickness of the substrate may be in a range from 200 microns to 1 mm, although lesser and greater thicknesses may also be used.

An alternating stack of second single crystalline semiconductor layers 20L and first single crystalline semiconductor layers 10L may be deposited on the top surface of the substrate single crystalline semiconductor layer 8L by sequentially performing epitaxial deposition processes. The second single crystalline semiconductor layers 20L and the first single crystalline semiconductor layers 10L may be formed by respective epitaxial deposition processes in which a single crystalline silicon-germanium alloy material or a single crystalline silicon is deposited with epitaxial registry with underlying single crystalline semiconductor layers, i.e., the substrate single crystalline semiconductor layer 8L and any underlying second single crystalline semiconductor layer 20L and/or any underlying first single crystalline semiconductor layer 10L. In one embodiment, the second single crystalline semiconductor layers 20L may include a respective single crystalline silicon-germanium alloy material including germanium at an atomic concentration in a range from 15% to 35%, such as from 20% to 30%, although lesser and greater atomic concentrations may also be used. The thickness of each second single crystalline semiconductor layer 20L may be in a range from 4 nm to 20 nm, such as from 8 nm to 16 nm, although lesser and greater thicknesses may also be used. The second single crystalline semiconductor layer 20L may, or may not, be doped with electrical dopants.

In one embodiment, the first single crystalline semiconductor layers 10L may include single crystalline silicon. The thickness of each first single crystalline semiconductor layer 10L may be in a range from 4 nm to 20 nm, such as from 8 nm to 16 nm, although lesser and greater thicknesses may also be used. The exemplary structure may include a first device region 100 in which first-type gate-all-around (GAA) field effect transistors are to be subsequently formed, and a second device region 200 in which second GAA field effect transistors are to be subsequently formed. The portions of the first single crystalline semiconductor layers 10L located within the first device region 100 may be doped with dopants of the first conductivity type (for example, p-type), and the portions of the first single crystalline semiconductor layers 10L located within the second device region 200 may be doped with dopant atoms of the second conductivity type (for example, n-type). The atomic concentration of electrical dopants in each of the first device region 100 and the second device region 200 may be in a range from $1.0 \times 10^{14}/cm^3$ to $1.0 \times 10^{17}/cm^3$, although lesser and greater dopant concentrations may also be used. The p-type dopants and the n-type dopants may be introduced into the first device region 100 or into the second device region 200 by performing a respective masked ion implantation process.

Optionally, a silicon oxide liner (not shown) may be formed over the alternating stack of second single crystalline semiconductor layers 20L and first single crystalline semiconductor layers 10L. In embodiments in which the silicon oxide liner is present, the silicon oxide liner may have a thickness in a range from 1 nm to 3 nm, although lesser and greater thicknesses may also be used. A hard mask layer 130L may be deposited over the alternating stack of second single crystalline semiconductor layers 20L and first single crystalline semiconductor layers 10L. The hard mask layer 130L may include a hard mask material such as silicon nitride, and may have a thickness in a range from 20 nm to 40 nm, although lesser and greater thicknesses may also be used. Other suitable materials for the hard mask material layer may be within the contemplated scope of disclosure.

A semiconductor liner 132L may be optionally formed over the hard mask layer 130L. The semiconductor liner 132L includes a semiconductor material such as amorphous silicon, and may have a thickness in a range from 5 nm to 10 nm, although lesser and greater thicknesses may also be used. A dielectric cover layer 134L may be formed over the semiconductor liner 132L. The dielectric cover layer 134L includes a dielectric material such as silicon oxide, and may have a thickness in a range from 300 nm to 600 nm, although lesser and greater thicknesses may also be used. Other suitable dielectric materials may be within the contemplated scope of disclosure. A semiconductor mandrel layer 136L may be deposited over the dielectric cover layer 134L. The semiconductor mandrel layer 136L includes a semiconductor material such as polysilicon, and may have a thickness in a range from 100 nm to 200 nm, although lesser and greater thicknesses may also be used.

FIG. 2A is a vertical cross-sectional view of the exemplary structure after patterning semiconductor fin stacks according to an embodiment of the present disclosure. FIG. 2B is a top-down view of the exemplary structure of FIG. 2A. The vertical plane A-A' is the plane of the vertical cross-sectional view of FIG. 2A. Referring to FIGS. 2A and 2B, a photoresist layer (not shown) may be applied over the layer stack of FIGS. 1A and 1B, and may be lithographically patterned to form a line and space pattern that laterally extends along a first horizontal direction hd1 and laterally spaced apart along a second horizontal direction hd2 that is perpendicular to the first horizontal direction hd1. An anisotropic etch process may be performed to transfer the pattern in the photoresist layer through underlying material layers and into a top portion of the substrate single crystalline semiconductor layer 8L Fin stack structures including patterned portions of the underlying material layers and the top portion of the substrate single crystalline semiconductor layer 8L may be formed.

Each fin stack structure may include, from bottom to top, a single crystalline semiconductor fin 8 that is a patterned top portion of the substrate single crystalline semiconductor layer 8L, a semiconductor plate stack (10, 20) that is an alternating stack of second semiconductor plates 20 and first semiconductor plates 10, an optional silicon oxide liner, a hard mask plate 130 that is a patterned portion of the hard mask layer 130L, a semiconductor liner fin 132 that is a patterned portion of the semiconductor liner 132L, a dielectric cover fin 134 that is a patterned portion of the dielectric cover layer 134L, and an optional semiconductor mandrel fin 136 that is a patterned portion of the semiconductor mandrel layer 136L. In one embodiment, each single crystalline semiconductor fin 8 may be a single crystalline silicon fin. Each first semiconductor plate 10 is a patterned portion of a first single crystalline semiconductor layer 10L. Each second semiconductor plate 20 is a patterned portion of a second single crystalline semiconductor layer 20L.

Each fin stack structure (8, 10, 20, 130, 132, 134, 136) may have a uniform width, which may be in a range from 10 nm to 300 nm, such as from 20 nm to 150 nm, although lesser and greater widths may also be used. The spacing between neighboring fin stack structures (8, 10, 20, 130, 132, 134, 136) may be in a range from 50 nm to 250 nm, although lesser and greater thicknesses may also be used. Each fin stack structure (8, 10, 20, 130, 132, 134, 136) may laterally extend along the first horizontal direction hd1, and may be laterally spaced apart along the second horizontal direction hd2.

Generally, a semiconductor plate stack (10, 20) including at least one first semiconductor plate (such as at least one first semiconductor plate 10) and at least one second semiconductor plate (such as at least one second semiconductor plate 20) may be formed over a substrate. A hard mask plate 130 may be formed above the semiconductor plate stack (10, 20). In one embodiment, sidewalls of a fin stack structure (8, 10, 20, 130, 132, 134, 136) may be vertically coincident, i.e., may be located within a same vertical plane. For example, sidewalls of the hard mask plate 130 of a fin stack structure (8, 10, 20, 130, 132, 134, 136) may be vertically coincident with sidewalls of the semiconductor plate stack (10, 20).

FIG. 3A is a vertical cross-sectional view of the exemplary structure after formation of shallow trench isolation structures according to an embodiment of the present disclosure. FIG. 3B is a top-down view of the exemplary structure of FIG. 3A. The vertical plane A-A' is the plane of the vertical cross-sectional view of FIG. 3A. Referring to FIGS. 3A and 3B, a dielectric fill material such as silicon oxide may be deposited in the trenches between the fin stack structures (8, 10, 20, 130, 132, 134, 136). A planarization process such as a chemical mechanical planarization (CMP) process may be performed to remove portions of the dielectric fill material located above the horizontal plane including the top surfaces of the semiconductor liner fins 132, the optional semiconductor mandrel fins 136, and the dielectric cover fins 134. Remaining portions of the dielectric fill material comprise shallow trench isolation structures 12.

FIG. 4A is a vertical cross-sectional view of the exemplary structure after vertically recessing the shallow trench isolation structures according to an embodiment of the present disclosure. FIG. 4B is a top-down view of the exemplary structure of FIG. 4A. The vertical plane A-A' is the plane of the vertical cross-sectional view of FIG. 4A. Referring to FIGS. 4A and 4B, top surfaces of the shallow trench isolation structures 12 may be vertically recessed by an etch back process. The etch back process may use an isotropic etch process (such as a wet etch process) or an anisotropic etch process (such as a reactive ion etch process). In embodiments in which a reactive ion etch process, the semiconductor liner fins 132 and/or the hard mask plates 130 may be used as etch mask structures. The top surfaces of the shallow trench isolation structures 12 may be recessed such that the top surfaces of the shallow trench isolation structures 12 are at, or below, the interface between the single crystalline semiconductor fins 8 and the bottommost second semiconductor plates 20. In embodiments in which the top surfaces of the shallow trench isolation structures 12 are vertically recessed relative to the top surfaces of the single crystalline semiconductor fins 8, the vertical recess distance may be in a range from 1 nm to 15 nm, although lesser and greater vertical recess distances may also be used.

FIG. 5A is a vertical cross-sectional view of the exemplary structure after formation of cladding silicon-germanium alloy structures according to an embodiment of the present disclosure. FIG. 5B is a top-down view of the exemplary structure of FIG. 5A. The vertical plane A-A' is the plane of the vertical cross-sectional view of FIG. 5A. Referring to FIGS. 5A and 5B, a silicon-germanium alloy may be anisotropically deposited by an anisotropic deposition process such as a plasma-enhanced chemical vapor deposition (PECVD) process. A silicon-germanium alloy layer is deposited with a greater thickness over the top surfaces of the hard mask plates 130 than on the top surfaces of the shallow trench isolation structures 12 due to the anisotropic nature of the deposition process. The silicon-germanium alloy layer may include germanium at an atomic concentration in a range from 25% to 45%, such as from 30% to 40%, although lesser and greater atomic concentrations may also be used. In one embodiment, the atomic percentage of germanium in the silicon-germanium alloy layer may be higher than the atomic concentration of germanium in the second semiconductor plates 20 to provide selective lateral recessing of the material of the silicon-germanium alloy layer relative to the second semiconductor plates 20. The silicon-germanium alloy layer may be polycrystalline. In one embodiment, the anisotropic deposition process may be depletive to facilitate deposition of a thicker film on the top surfaces of the hard mask plates 130 than on the top surfaces of the shallow trench isolation structures 12. The silicon-germanium alloy may be formed on sidewalls of the semiconductor plate stacks (10, 20) and the hard mask plates 130.

An anisotropic etch process may be performed to vertically recess horizontal portions of the deposited silicon-germanium alloy layer. The duration of the anisotropic etch process may be selected such that horizontal portions of the silicon-germanium alloy layer located on top of the shallow trench isolation structures 12 are removed, while horizontal portions of the silicon-germanium alloy layer overlying the top surfaces of the hard mask plates 130 are not completely removed. Each continuous remaining portion of the silicon-germanium alloy layer is herein referred to as a claddingsilicon-germanium alloy structure 28. Each cladding silicon-germanium alloy structure 28 may have an inverted U-shaped vertical cross-sectional profile. Each sidewall of the cladding silicon-germanium alloy structures 28 may have a lateral thickness in a range from 6 nm to 20 nm, although lesser and greater thicknesses may also be used. The vertical thickness of the horizontal top portion of each cladding silicon-germanium alloy structure 28 may be in a range from 6 nm to 20 nm, although lesser and greater vertical thicknesses may also be used. The spacing between neighboring pairs of cladding silicon-germanium alloy structures 28 may be in a range from 20 nm to 200 nm, although lesser and greater spacings may also be used.

FIG. 6A is a vertical cross-sectional view of the exemplary structure after formation of hybrid dielectric fins according to an embodiment of the present disclosure. FIG. 6B is a top-down view of the exemplary structure of FIG. 6A. The vertical plane A-A' is the plane of the vertical cross-sectional view of FIG. 6A. Referring to FIGS. 6A and 6B, hybrid dielectric fins (14, 16) are formed in the trenches between cladding silicon-germanium alloy structures 28. Each hybrid dielectric fin (14, 16) may include a dielectric fin liner 14 and a silicon oxide fill material portion 16. The hybrid dielectric fins (14, 16) may be formed by conformally depositing a dielectric fin liner layer and a silicon oxide fill material, and by removing portions of the dielectric fin liner layer and the silicon oxide fill material from above the horizontal plane including the top surfaces of the cladding silicon-germanium alloy structures 28. Each dielectric fin liner 14 includes a dielectric material having a dielectric constant not greater than 7.9. For example, each dielectric fin liner 14 may include a material such as silicon nitride, silicon carbide nitride, or silicon carbide oxynitride. The thickness of each dielectric fin liner 14 may be in a range from 5 nm to 10 nm, although lesser and greater thicknesses may also be used. Each silicon oxide fill material portion 16 may include undoped silicate glass or a doped silicate glass. Each hybrid dielectric fin (14, 16) laterally extends along the first horizontal direction and may have a uniform width along the second horizontal direction. The width of each hybrid dielectric fin (14, 16) along the second horizontal direction hd2 may be in a range from 20 nm to 200 nm, although lesser and greater widths may also be used.

FIG. 7A is a vertical cross-sectional view of the exemplary structure after vertically recessing the hybrid dielectric fins according to an embodiment of the present disclosure. FIG. 7B is a top-down view of the exemplary structure of FIG. 7A. The vertical plane A-A' is the plane of the vertical cross-sectional view of FIG. 7A. Referring to FIGS. 7A and 7B, the top surfaces of the hybrid dielectric fins (14, 16) may be vertically recessed by performing at least one etch process, which may include at least one isotropic etch process (such as a wet etch process) and/or at least one anisotropic etch process (such as a reactive ion etch process). The top surfaces of the recessed hybrid dielectric fins (14,16) may be located between the horizontal plane including the interface between the topmost second semiconductor plates 20 and the hard mask plates 130 and the horizontal plane including the interface between the topmost second semiconductor plates 20 and the topmost first semiconductor plates 10.

FIG. 8A is a vertical cross-sectional view of the exemplary structure after formation of etch stop dielectric fins according to an embodiment of the present disclosure. FIG. 8B is a top-down view of the exemplary structure of FIG. 8A. The vertical plane A-A' is the plane of the vertical cross-sectional view of FIG. 8A. Referring to FIGS. 8A and 8B, an etch stop dielectric material may be deposited in the trenches overlying the hybrid dielectric fins (14, 16) between each neighboring pair of cladding silicon-germanium alloy structures 28. The etch stop dielectric material includes a dielectric material that may be subsequently used as an etch stop material. For example, the etch stop dielectric material may include aluminum oxide, hafnium oxide, lanthanum oxide, or silicon carbide nitride. In one embodiment, the etch stop dielectric material may include a metal oxide dielectric material having a dielectric constant greater than 7.9. Optionally, a silicon oxide material layer may be deposited over the etch stop dielectric material to facilitate a subsequent chemical mechanical planarization, which may be performed to remove the silicon oxide material layer and excess portions of the etch stop dielectric material from above the horizontal plane including the top surfaces of the cladding silicon-germanium alloy structures 28. Each remaining portion of the etch stop dielectric material comprises an etch stop dielectric fin 18. The top surfaces of the etch stop dielectric fins 18 may be in the same horizontal plane as the top surfaces of the cladding silicon-germanium alloy structures 28.

FIG. 9A is a vertical cross-sectional view of the exemplary structure after removal of hard mask plates and upper portions of the cladding silicon-germanium alloy structures according to an embodiment of the present disclosure. FIG. 9B is a top-down view of the exemplary structure of FIG. 9A. The vertical plane A-A' is the plane of the vertical cross-sectional view of FIG. 9A. Referring to FIGS. 9A and 9B, top portions of the cladding silicon-germanium alloy structures 28 may be removed, for example, by performing a wet etch process. In an illustrative example, the wet etch process may use a mixture of ammonium hydroxide and hydrogen peroxide, or a mixture of hydrofluoric acid, nitric acid, acetic acid, glycerin, and/or water.

Subsequently, the hard mask plates 130 may be removed selectively by an isotropic etch process. For example, a wet etch process using hot phosphoric acid may be performed to remove the hard mask plates 130. Physically exposed sidewall portions of the cladding silicon-germanium alloy structures 28 may be subsequently removed by performing another wet etch process. Each topmost second semiconductor plate 20 may be collaterally etched by the wet etch process simultaneously with removal of the physically exposed sidewall portions of the cladding silicon-germanium alloy structures 28. Remaining portions of the cladding silicon-germanium alloy structures 28 may be located below the horizontal plane including the top surfaces of the topmost first semiconductor plates 10. Inter-fin recesses 29 may be formed between neighboring pairs of etch stop dielectric fins 18.

FIG. 10A is a vertical cross-sectional view of the exemplary structure after formation of gate template structures including a respective set of a sacrificial gate liner, a sacrificial gate structure, a sacrificial gate cap, and a gate mask structure, and subsequent formation of dielectric gate spacers according to an embodiment of the present disclosure. FIG. 10B is a top-down view of the exemplary structure of FIG. 10A. The vertical plane A-A' is the plane of the vertical cross-sectional view of FIG. 10A. Referring to FIGS. 10A and 10B, gate template structures (30, 32, 34, 36) including a respective set of a sacrificial gate liner 30, a sacrificial gate structure 32, a sacrificial gate cap 34, and a gate mask structure 36 may be formed over the etch stop dielectric fins 18, the semiconductor plate stacks (10, 20), and the cladding silicon-germanium alloy structures 28, For example, a continuous sacrificial gate liner layer and a continuous sacrificial gate structure material layer may be deposited and planarized to provide a horizontal planar surface. The continuous sacrificial gate liner layer may include a conformal silicon oxide liner having a thickness in a range from 5 nm to 10 nm, although lesser and greater thicknesses may also be used. The continuous sacrificial gate structure material layer includes a sacrificial material that may be removed selective to the material of the continuous sacrificial gate liner layer. For example, the continuous sacrificial gate structure material layer may include, for example, polysilicon. The top surface of the continuous sacrificial gate structure material layer may be planarized by chemical mechanical planarization. The vertical thickness of the continuous sacrificial gate structure material layer over the etch stop dielectric fins 18 may be in a range from 100 nm to 200 nm, although lesser and greater thicknesses may also be used.

A continuous sacrificial gate cap material layer may be subsequently deposited over the continuous sacrificial gate structure material layer. The continuous sacrificial gate cap material layer may include, for example, silicon nitride. The thickness of the continuous sacrificial gate cap material layer may be in a range from 20 nm to 40 nm, although lesser and greater thicknesses may also be used. A continuous gate mask material layer may be deposited over the continuous sacrificial gate cap material layer. The continuous gate mask material layer includes a hard gate mask material such as silicon oxide. The thickness of the continuous gate mask material layer may be in a range from 20 nm to 40 nm, although lesser and greater thicknesses may also be used.

The layer stack of the continuous gate mask material layer, the continuous sacrificial gate cap material layer, the continuous sacrificial gate structure material layer, and the continuous sacrificial gate liner layer may be patterned into the gate template structures (30, 32, 34, 36), for example, by applying and patterning a photoresist layer (not shown) thereabove, and by performing an anisotropic etch process that transfers the pattern in the photoresist material layer thorough the layer stack. The pattern in the photoresist layer may be a line and space pattern in which each line laterally extends along the second horizontal direction hd2, and each space laterally extends along the second horizontal direction hd2. The anisotropic etch process may include multiple anisotropic etch processes for removing the various material layers in the layer stack. The terminal step of the anisotropic etch process may etch through unmasked portions of the continuous sacrificial gate liner layer. Alternatively, the unmasked portions of the continuous sacrificial gate liner layer may be removed by an isotropic etch process such as a wet etch process using dilute hydrofluoric acid. The photoresist layer may be subsequently removed, for example, by ashing.

Each patterned portion of the continuous sacrificial gate liner layer comprises a sacrificial gate liner 30. Each patterned portion of the continuous sacrificial gate structure material layer comprises a sacrificial gate structure 32. Each patterned portion of the continuous sacrificial gate cap material layer comprises a sacrificial gate cap 34. Each patterned portion of the continuous gate mask material layer comprises a gate mask structure 36. Each gate template structures (30, 32, 34, 36) may have a uniform width along the first horizontal direction hd1, which may be in a range from 10 nm to 200 nm, such as from 20 nm to 100 nm, although lesser and greater widths may also be used. The spacing between a neighboring pair of gate template structures (30, 32, 34, 36) may be in a range from 40 nm to 400 nm, such as from 80 nm to 200 nm, although lesser and greater spacings may also be used.

A dielectric gate spacer material layer may be conformally deposited over the gate template structures (30, 32, 34, 36). The dielectric gate spacer material layer includes a dielectric material such as silicon nitride or silicon carbide nitride. Other suitable dielectric materials are within the contemplated scope of disclosure. The thickness of the dielectric gate spacer material layer may be in a range from 5 nm to 15 nm, although lesser and greater thicknesses may also be used. An anisotropic etch process may be performed to etch horizontal portions of the dielectric gate spacer material layer. Each remaining vertical portion of the dielectric gate spacer material layer comprises a dielectric gate spacer 38. Each dielectric gate spacer 38 may contact a sidewall of a respective gate template structure (30, 32, 34, 36), and may have laterally extend along the second horizontal direction hd2 with a uniform thickness, which may be in a range from 5 nm to 15 nm, though lesser and greater thicknesses may also be used.

Figure 11B:
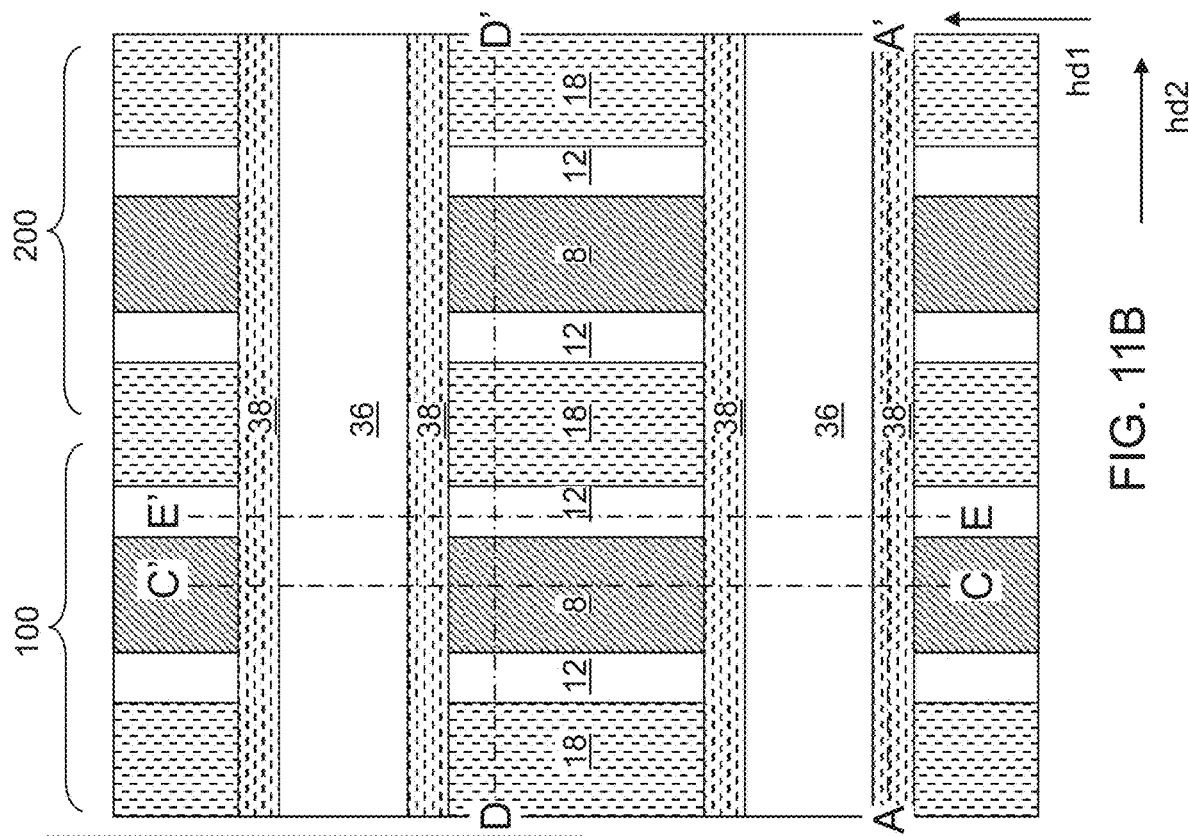
FIG. 11B is a top-down view of the exemplary structure of FIG. 11A. The vertical plane A-A' is the plane of the vertical cross-sectional view of FIG. 11A.
Figure 11A:
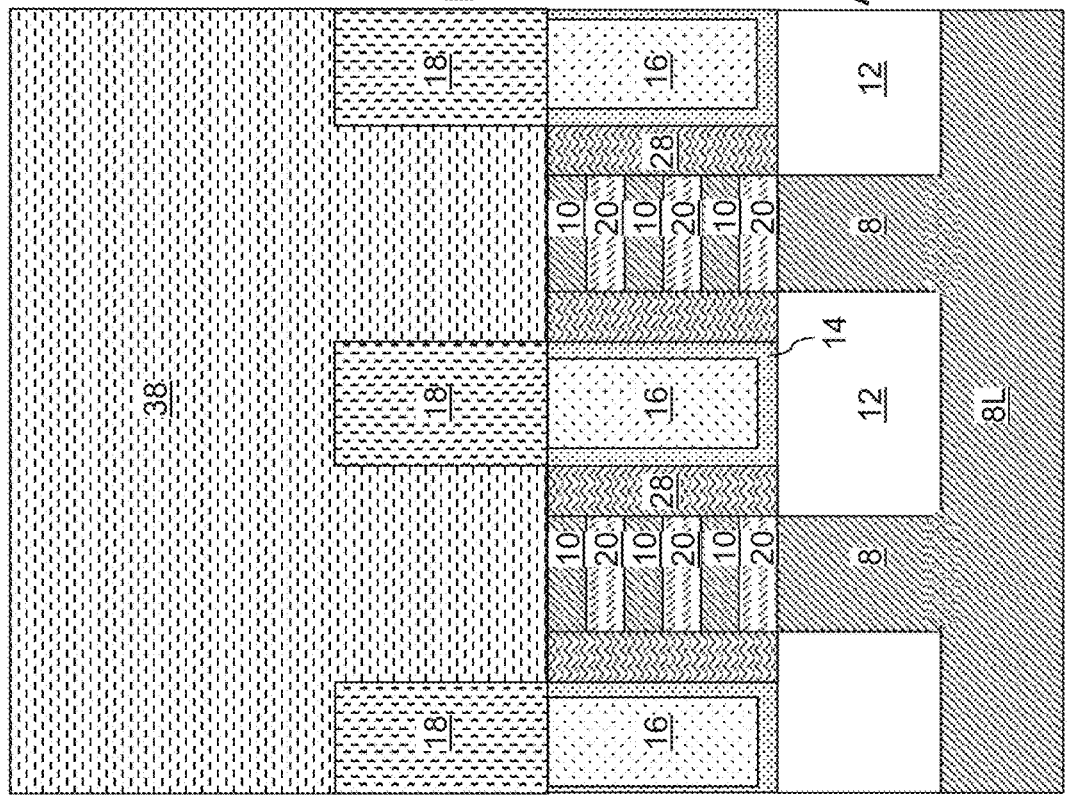
FIG. 11A is a vertical cross-sectional view of the exemplary structure after removing end portions of semiconductor fin stacks according to an embodiment of the present disclosure.
Figure 11E:
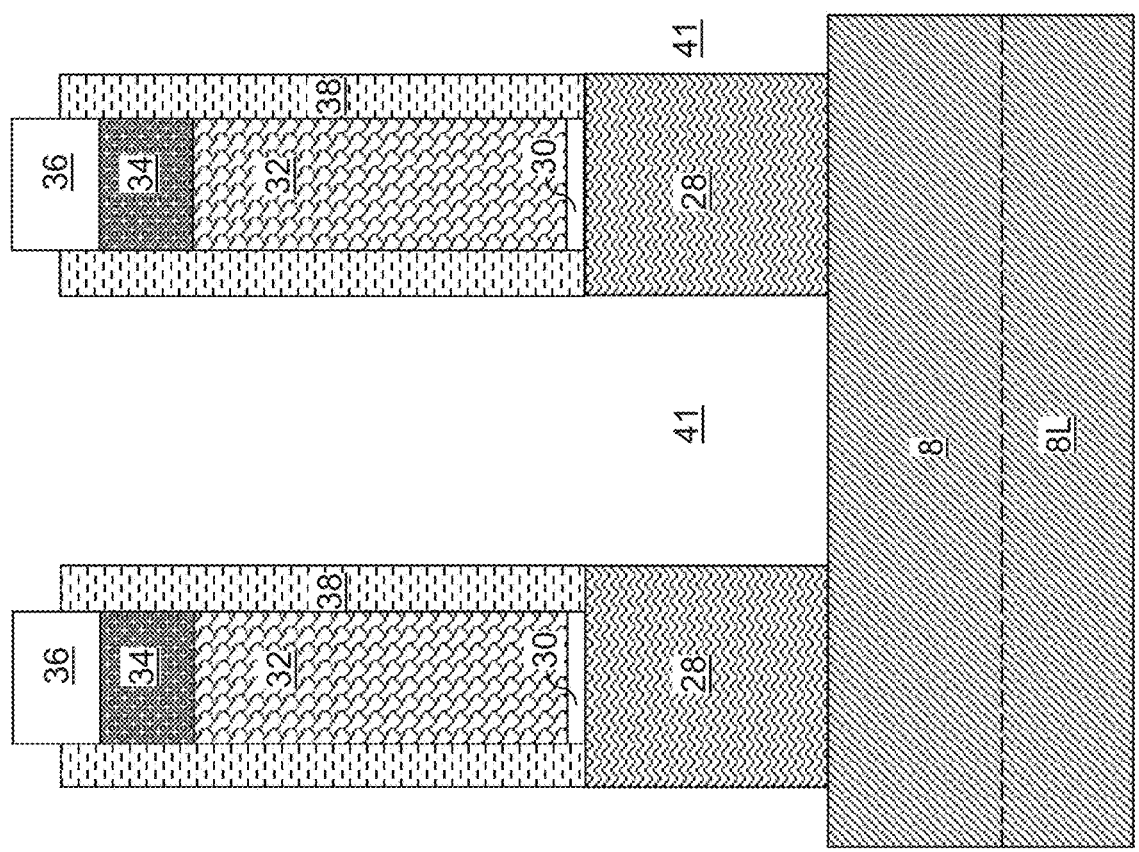
FIG. 11E is a vertical cross-sectional view along the vertical plane E-E' of FIG. 11B.

FIG. 11A is a vertical cross-sectional view of the exemplary structure after removing end portions of semiconductor fin stacks according to an embodiment of the present disclosure. FIG. 11B is a top-down view of the exemplary structure of FIG. 11A. The vertical plane A-A' is the plane of the vertical cross-sectional view of FIG. 11A. FIG. 11C is a vertical cross-sectional view along the vertical plane C-C' of FIG. 11B. FIG. 11D is a vertical cross-sectional view along the vertical plane D-D' of FIG. 11B. FIG. 11E is a vertical cross-sectional view along the vertical plane E-E' of FIG. 11B. Referring to FIGS. 11A-11E, an anisotropic etch process may be performed to etch portions of the semiconductor plate stacks (10, 20) and the cladding silicon-germanium alloy structures 28 that are not masked by the gate template structure (30, 32, 34, 36), the dielectric gate spacers 38, or the etch stop dielectric fins 18. The anisotropic etch formed a source/drain cavity 41 in volumes from which portions of the semiconductor plate stacks (10, 20) and the cladding silicon-germanium alloy structures 28 are removed. The source/drain cavities 41 collectively refer to source cavities and drain cavities. A top surface of a single crystalline semiconductor fin 8 may be physically exposed at the bottom each source/drain cavity 41.

Each semiconductor plate stack (10, 20) may be divided into multiple discrete semiconductor plate stacks (10, 20) that underlie a respective one of the gate template structures (30, 32, 34, 36). The multiple discrete semiconductor plate stacks (10, 20) formed by dividing a semiconductor plate stack (10, 20) are arranged along the first horizontal direction hd1, and laterally spaced apart along the first horizontal direction hd1. Each semiconductor plate stack (10, 20) may have vertical sidewalls that are vertically coincident with overlying sidewalls of the dielectric gate spacers 38. Further, each cladding silicon-germanium alloy structure 28 may be divided into a plurality of cladding silicon-germanium alloy structures 28 that underlie a respective one of the gate template structures (30, 32, 34, 36). Sidewall of the plurality of cladding silicon-germanium alloy structures 28 may be vertically coincident with sidewalls of the gate template structures (30, 32, 34, 36).

Figure 12B:
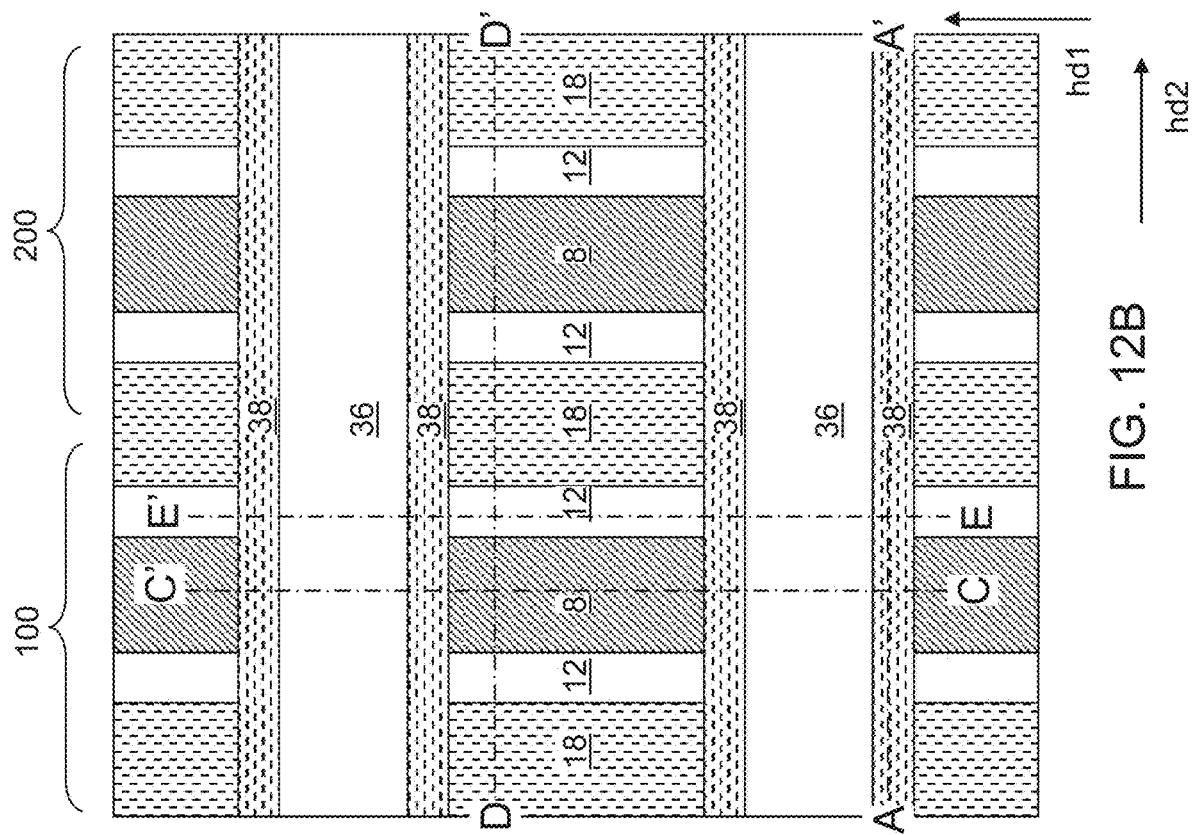
FIG. 12B is a top-down view of the exemplary structure of FIG. 12A. The vertical plane A-A' is the plane of the vertical cross-sectional view of FIG. 12A.
Figure 12A:
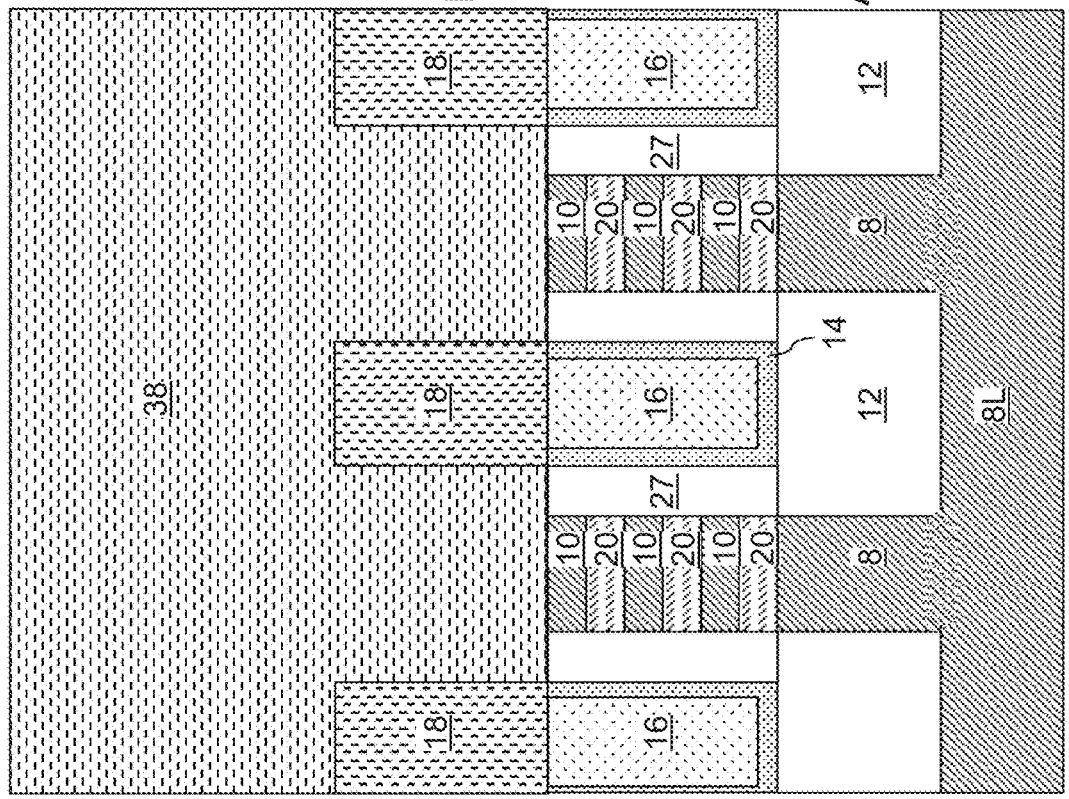
FIG. 12A is a vertical cross-sectional view of the exemplary structure after laterally recessing cladding silicon-germanium alloy structures according to an embodiment of the present disclosure.
Figure 12E:
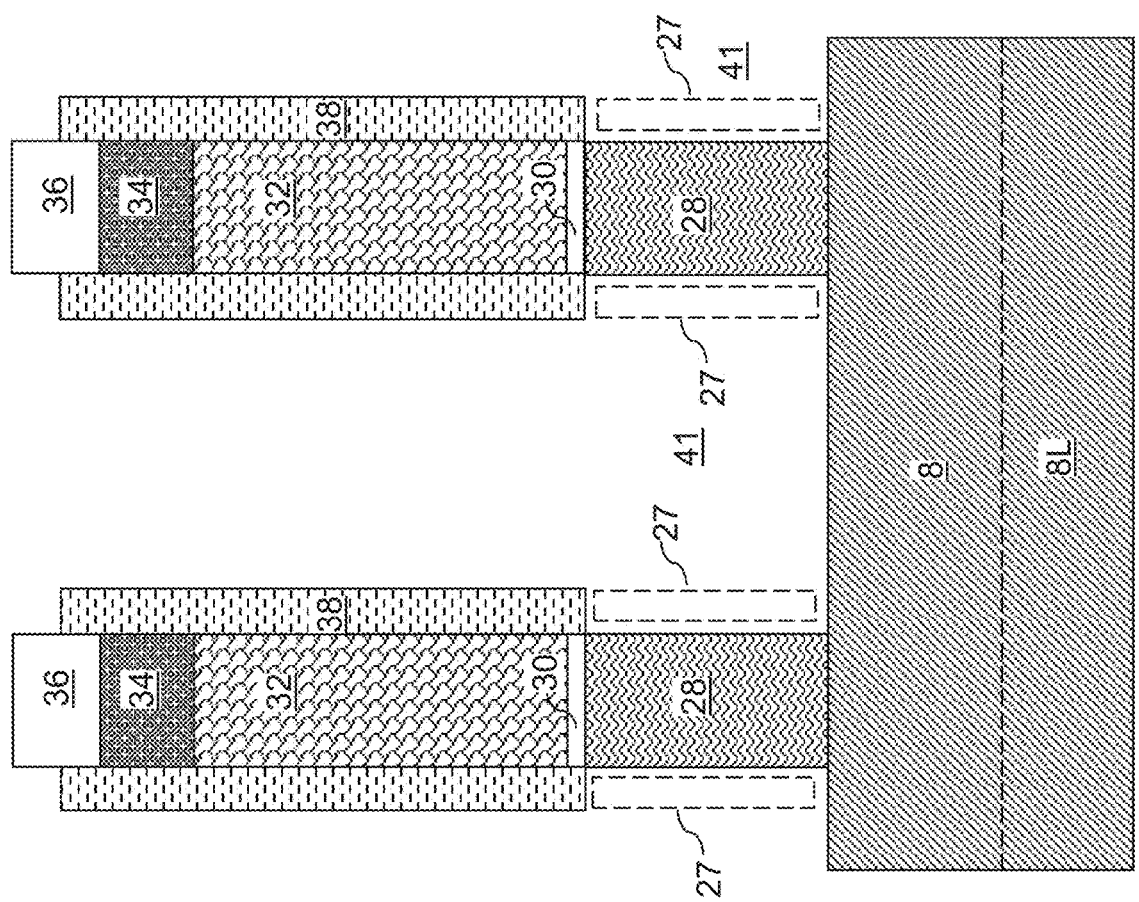
FIG. 12E is a vertical cross-sectional view along the vertical plane E-E' of FIG. 12B.

FIG. 12A is a vertical cross-sectional view of the exemplary structure after laterally recessing cladding silicon-germanium alloy structures according to an embodiment of the present disclosure. FIG. 12B is a top-down view of the exemplary structure of FIG. 12A. The vertical plane A-A' is the plane of the vertical cross-sectional view of FIG. 12A. FIG. 12C is a vertical cross-sectional view along the vertical plane C-C' of FIG. 12B. FIG. 12D is a vertical cross-sectional view along the vertical plane D-D' of FIG. 12B. FIG. 12E is a vertical cross-sectional view along the vertical plane E-E' of FIG. 12B. Referring to FIGS. 12A-12E, the cladding silicon-germanium alloy structures 28 may be laterally recessed by performing an isotropic etch process. The isotropic etch process may laterally recess the polycrystalline material of the cladding silicon-germanium alloy structure 28 selective to the materials of the first semiconductor plates 10 and the second semiconductor plates 20. The higher germanium atomic concentration in the cladding silicon-germanium alloy structure 28 than the germanium atomic concentration in the second semiconductor plates 20 and the polycrystalline nature of the cladding silicon-germanium alloy structure 28 (compared to the single crystalline nature of the second semiconductor plates 20) provides a higher etch rate for the cladding silicon-germanium alloy structures 28 relative to the second semiconductor plates 20. The isotropic etch process may include a wet etch process using a mixture of ammonium hydroxide and hydrogen peroxide.

Outer recess cavities 27 may be formed in volumes from which the materials of the cladding silicon-germanium alloy structures 28 are removed. The recessed sidewalls of the cladding silicon-germanium alloy structures 28 may be at, or about, a vertical plane including an overlying interface between a gate template structure (30, 32, 34, 36) and a dielectric gate spacer 38.

Figure 13E:
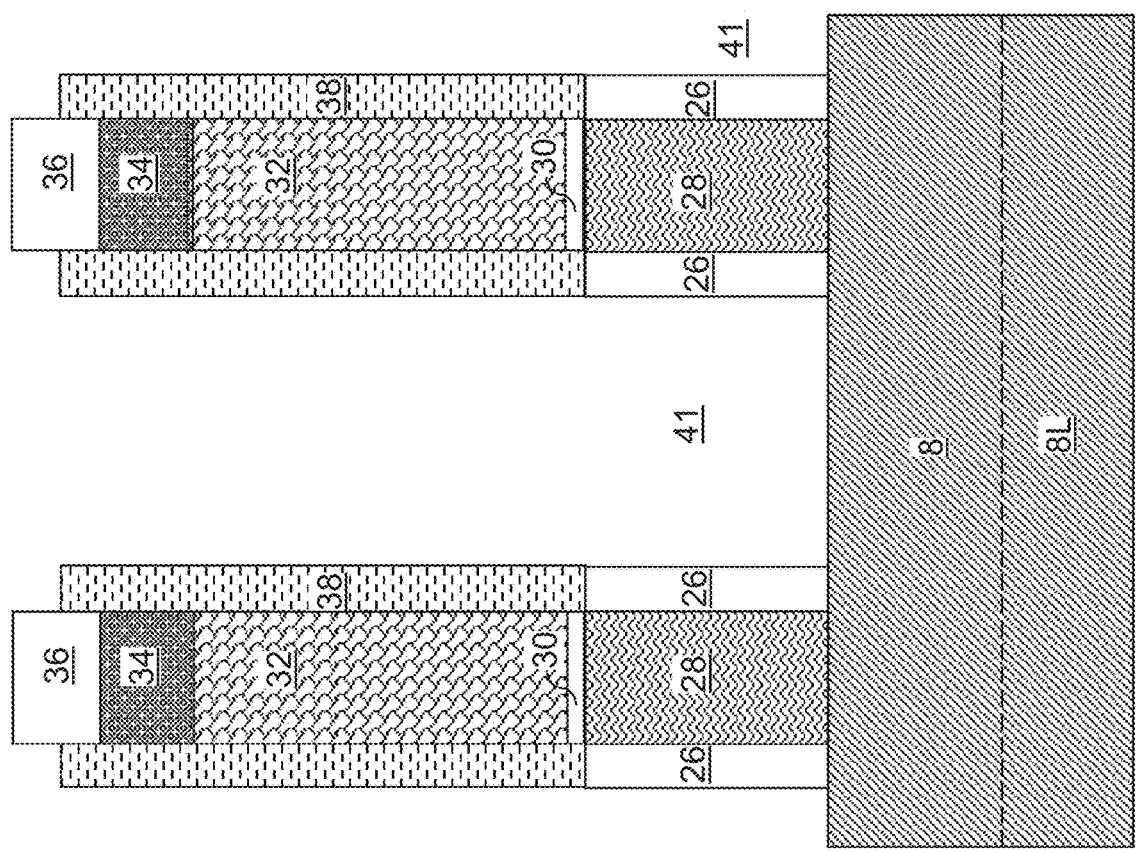
FIG. 13E is a vertical cross-sectional view along the vertical plane E-E' of FIG. 13B.

FIG. 13A is a vertical cross-sectional view of the exemplary structure after formation of outer dielectric channel spacers according to an embodiment of the present disclosure. FIG. 13B is a top-down view of the exemplary structure of FIG. 13A. The vertical plane A-A' is the plane of the vertical cross-sectional view of FIG. 13A. FIG. 13C is a vertical cross-sectional view along the vertical plane C-C' of FIG. 13B. FIG. 13D is a vertical cross-sectional view along the vertical plane D-D' of FIG. 13B. FIG. 13E is a vertical cross-sectional view along the vertical plane E-E' of FIG. 13B. Referring to FIGS. 13A-13E, a dielectric fill material such as silicon oxide may be conformally deposited to fill the outer recess cavities 27. Portions of the dielectric fill material deposited outside the outer recess cavities 27 may be removed by an anisotropic etch process. Each remaining vertical portion of the dielectric fill material that fills a respective one of the outer recess cavities 27 comprises an outer dielectric channel spacer 26. Each outer dielectric channel spacer 26 is laterally offset outward from an adjacent semiconductor plate stack (10 20) along the second horizontal direction hd2.

Figure 14B:
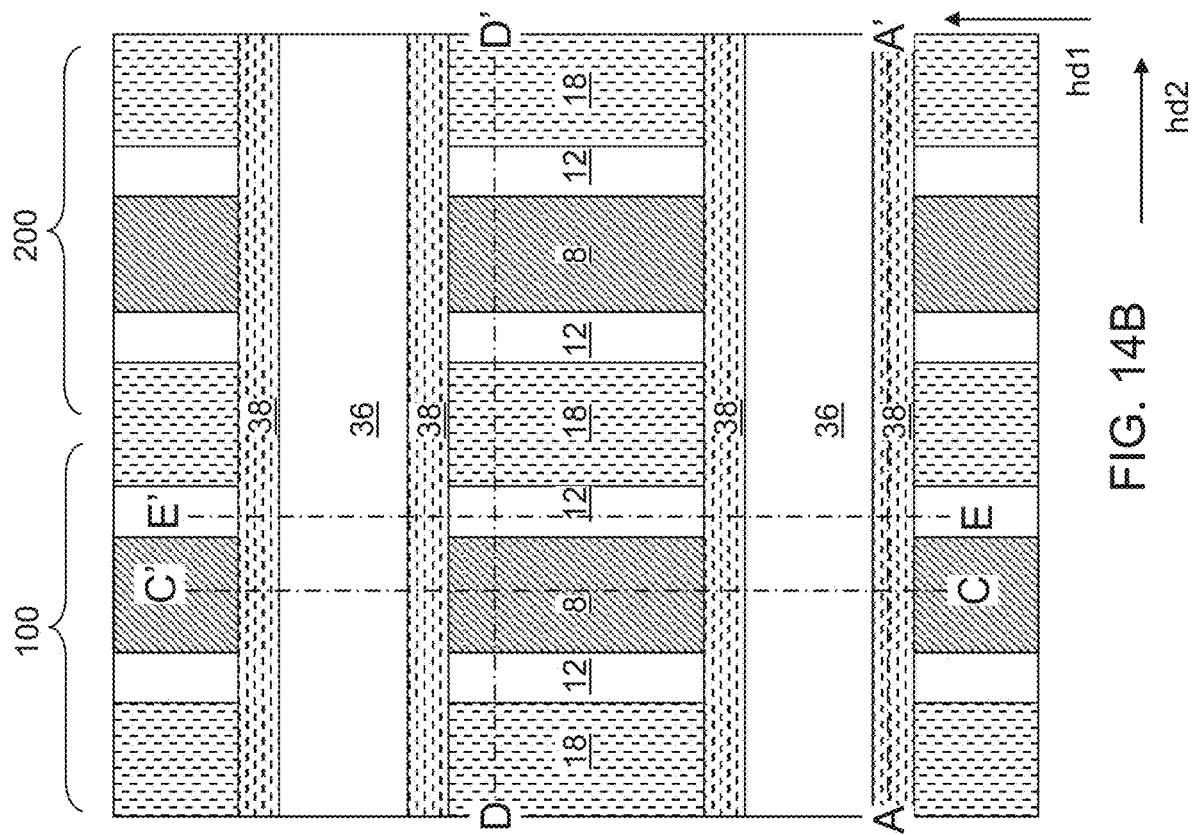
FIG. 14B is a top-down view of the exemplary structure of FIG. 14A. The vertical plane A-A' is the plane of the vertical cross-sectional view of FIG. 14A.
Figure 14A:
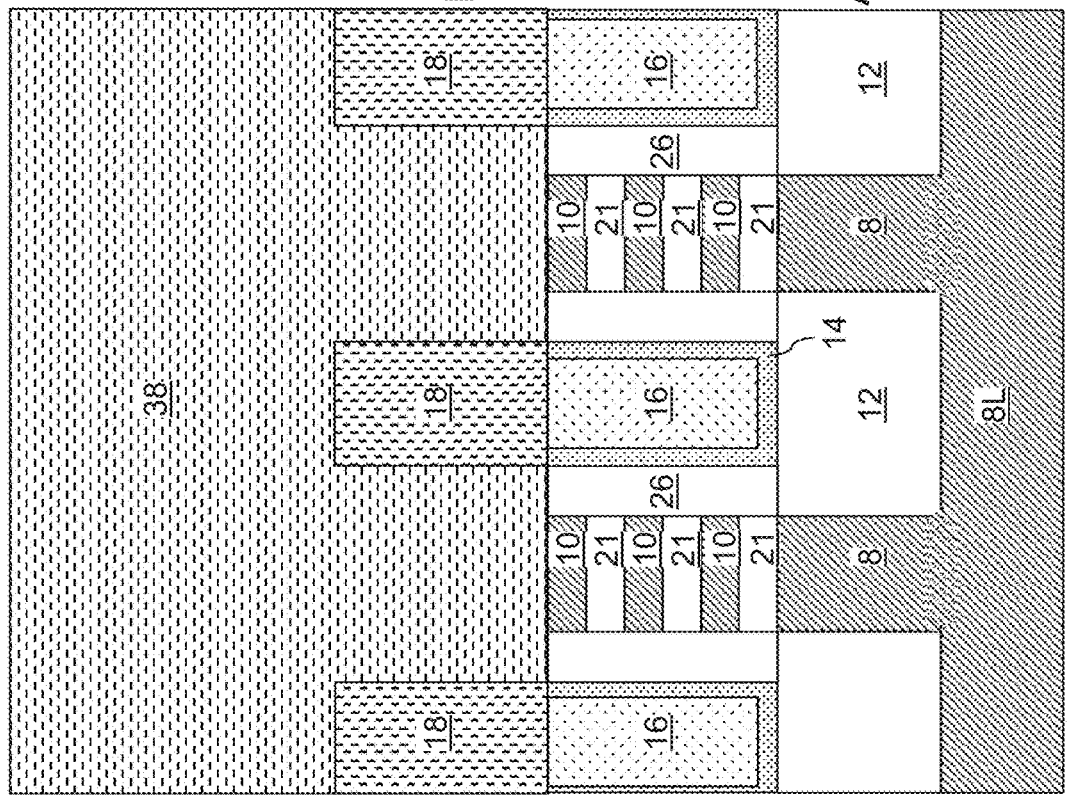
FIG. 14A is a vertical cross-sectional view of the exemplary structure after formation of inter-plate recess regions according to an embodiment of the present disclosure.
Figure 14C:
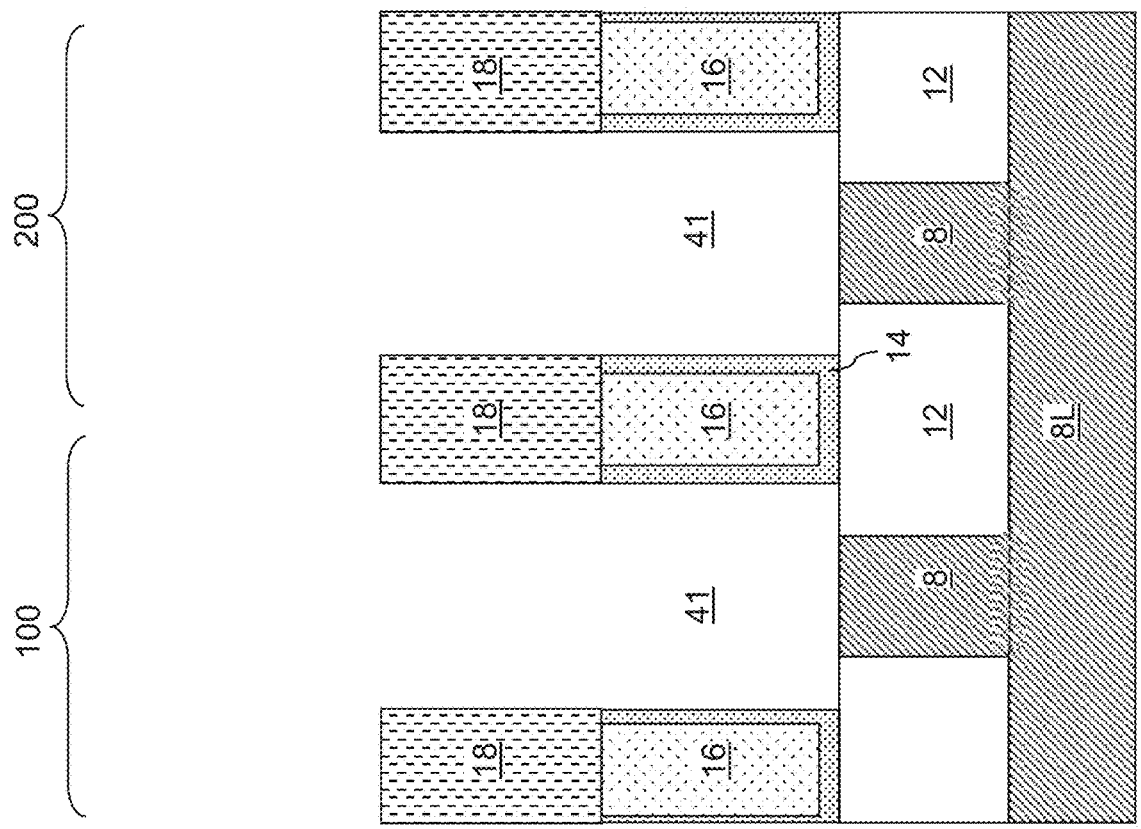
FIG. 14C is a vertical cross-sectional view along the vertical plane C-C' of FIG. 14B.
Figure 14D:
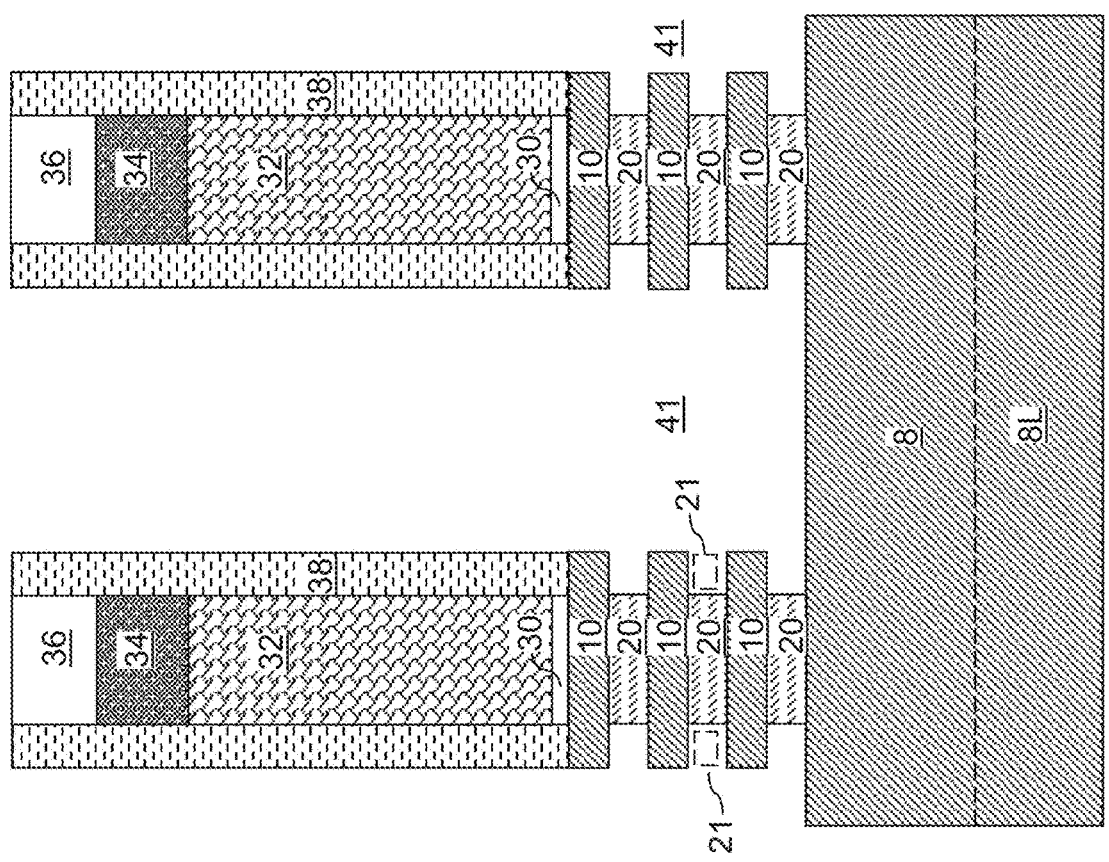
FIG. 14D is a vertical cross-sectional view along the vertical plane D-D' of FIG. 14B.

FIG. 14A is a vertical cross-sectional view of the exemplary structure after formation of inter-plate recess regions according to an embodiment of the present disclosure. FIG. 14B is a top-down view of the exemplary structure of FIG. 14A. The vertical plane A-A' is the plane of the vertical cross-sectional view of FIG. 14A. FIG. 14C is a vertical cross-sectional view along the vertical plane C-C' of FIG. 14B. FIG. 14D is a vertical cross-sectional view along the vertical plane D-D' of FIG. 14B. FIG. 14E is a vertical cross-sectional view along the vertical plane E-E' of FIG. 14B. Referring to FIGS. 14A-14E, the end portions of each second semiconductor plate 20 may be removed selective to the first semiconductor plates 10 by performing an isotropic etch process that etches the material of the second semiconductor plates 20 selective to the material of the first semiconductor plates 10. The isotropic etch process may laterally recess the second semiconductor plates 20 selective to the first semiconductor plates 10. The isotropic etch process may include a wet etch process using a mixture of ammonium hydroxide and hydrogen peroxide. Inner recess cavities 21 are formed in volumes from which the materials of the end portions of the second semiconductor plates 20 are removed. The recessed sidewalls of the second semiconductor plates 20 may be at, or about, a vertical plane including an overlying interface between a gate template structure (30, 32, 34, 36) and a dielectric gate spacer 38.

FIG. 15A is a vertical cross-sectional view of the exemplary structure after formation of inner dielectric channel spacers according to an embodiment of the present disclosure. FIG. 15B is a top-down view of the exemplary structure of FIG. 15A. The vertical plane A-A' is the plane of the vertical cross-sectional view of FIG. 15A.

Figure 15E:
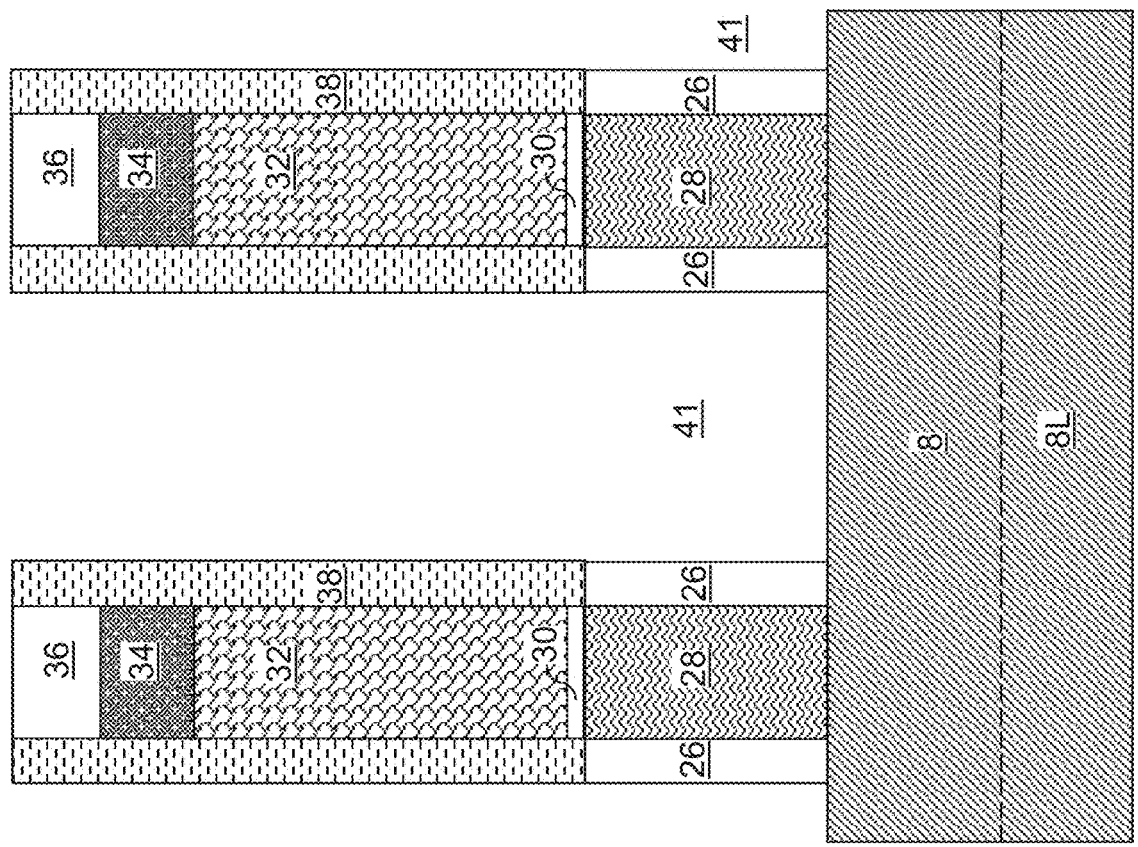
FIG. 15E is a vertical cross-sectional view along the vertical plane E-E' of FIG. 15B.

FIG. 15C is a vertical cross-sectional view along the vertical plane C-C' of FIG. 15B. FIG. 15D is a vertical cross-sectional view along the vertical plane D-D' of FIG. 15B. FIG. 15E is a vertical cross-sectional view along the vertical plane E-E' of FIG. 15B. Referring to FIGS. 15A-15E, a dielectric fill material such as silicon oxide may be conformally deposited to fill the inner recess cavities 21. Portions of the dielectric fill material deposited outside the inner recess cavities 21 may be removed by an anisotropic etch process. Each remaining vertical portion of the dielectric fill material that fills a respective one of the inner recess cavities 21 comprises an inner dielectric channel spacer 22. Each inner dielectric channel spacer 22 contacts a bottom surface of an end portion of an overlying first semiconductor plate 10 and/or a top surface of an end portion of an underlying first semiconductor plate 10. Each inner dielectric channel spacer 22 may contact a pair of outer dielectric channel spacers 26. A plurality of inner dielectric channel spacers 22 may be located between a pair of outer dielectric channel spacers 26. Each combination of a pair of outer dielectric channel spacers 26 and at least one inner dielectric channel spacer 22 is herein referred to as a dielectric channel spacer (22, 26) or as a composite dielectric channel spacer (22, 26).

FIG. 16A is a vertical cross-sectional view of the exemplary structure after formation of a first dielectric mask layer according to an embodiment of the present disclosure. FIG. 16B is a top-down view of the exemplary structure of FIG. 16A. The vertical plane A-A' is the plane of the vertical cross-sectional view of FIG. 16A. FIG. 16C is a vertical cross-sectional view along the vertical plane C-C' of FIG. 16B. FIG. 16D is a vertical cross-sectional view along the vertical plane D-D' of FIG. 16B. FIG. 16E is a vertical cross-sectional view along the vertical plane E-E' of FIG. 16B. Referring to FIGS. 16A-16E, a first hard mask layer 42 may be deposited over the exemplary structure, and may be patterned to cover the second device region 200 while not covering the first device region 100. The first hard mask layer 42 includes a dielectric hard mask material such as silicon oxide or silicon nitride. Other hard mask materials are within the contemplated scope of disclosure. The first hard mask layer 42 can be deposited by a conformal deposition process such as a chemical vapor deposition process. The thickness of the first hard mask layer 42 may be in a range from 5 nm to 10 nm, although lesser and greater thicknesses may also be used.

Figure 17D:
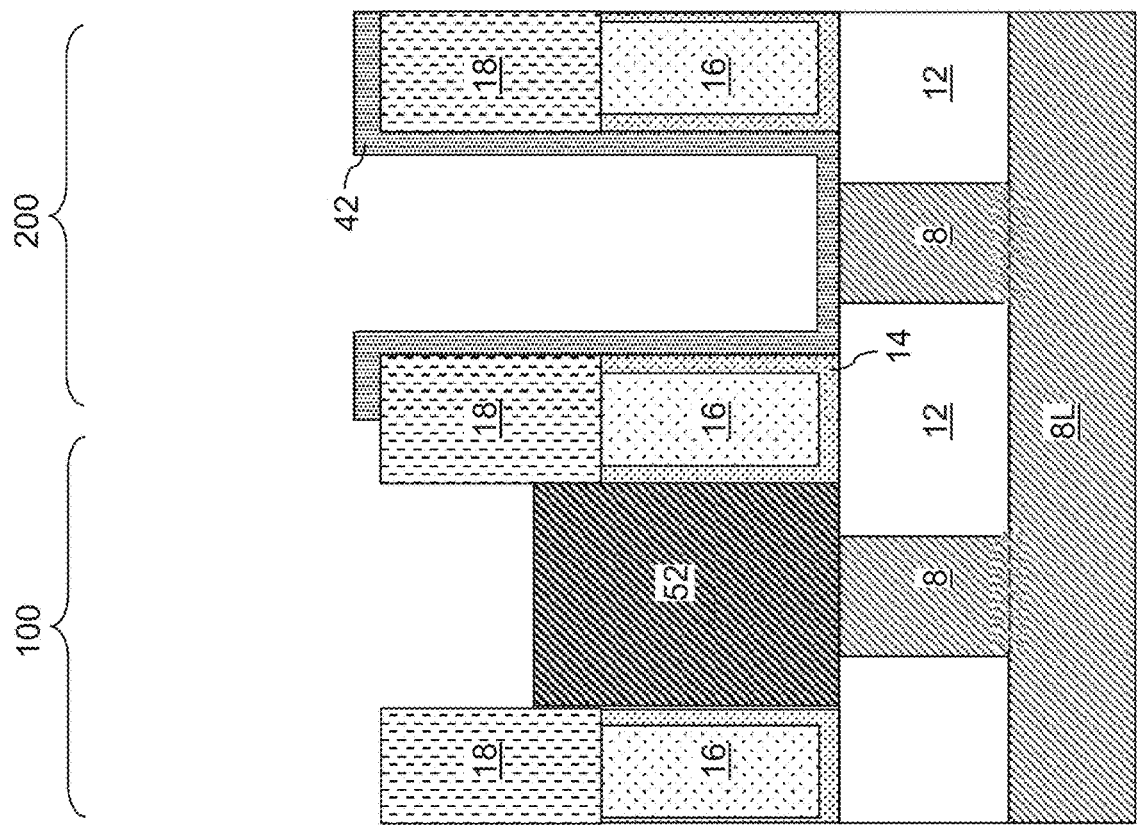
FIG. 17D is a vertical cross-sectional view along the vertical plane D-D' of FIG. 17B.
Figure 17C:
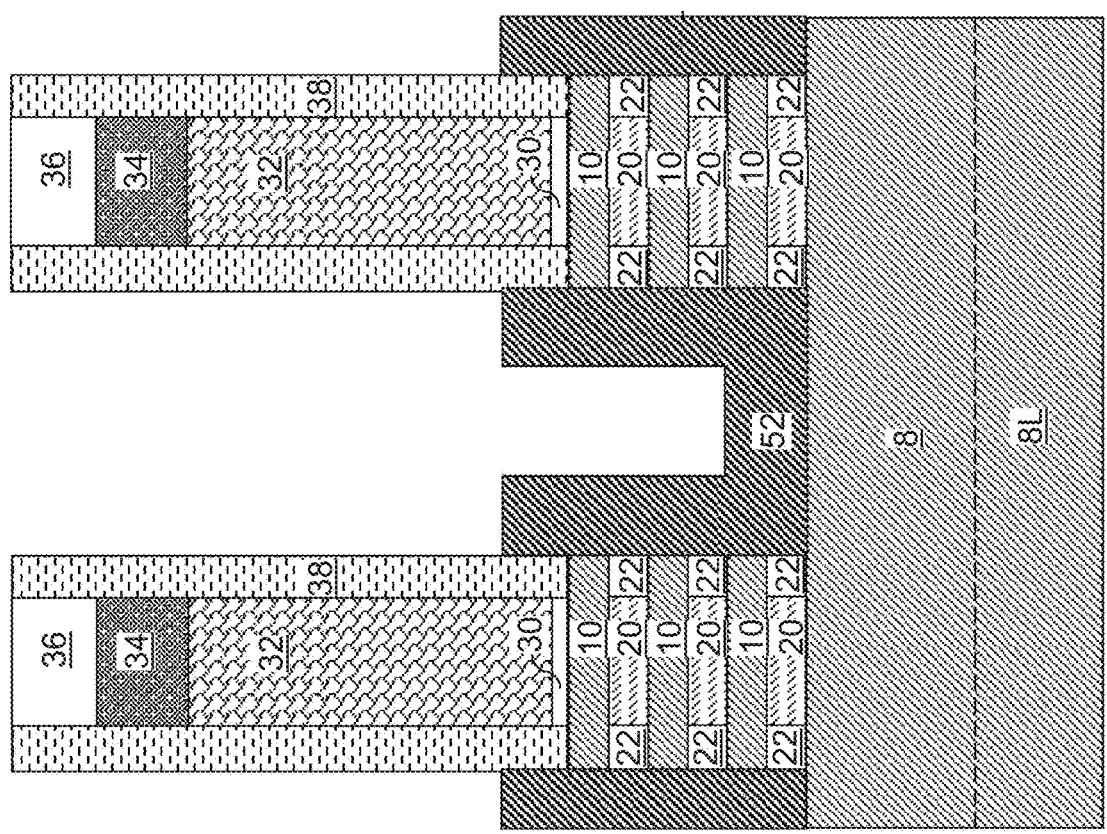
FIG. 17C is a vertical cross-sectional view along the vertical plane C-C' of FIG. 17B.

FIG. 17A is a vertical cross-sectional view of the exemplary structure after formation of first source/drain regions according to an embodiment of the present disclosure. FIG. 17B is a top-down view of the exemplary structure of FIG. 17A. The vertical plane A-A' is the plane of the vertical cross-sectional view of FIG. 17A. FIG. 17C is a vertical cross-sectional view along the vertical plane C-C' of FIG.

17B. FIG. 17D is a vertical cross-sectional view along the vertical plane D-D' of FIG. 17B. FIG. 17E is a vertical cross-sectional view along the vertical plane E-E' of FIG. 17B. Referring to FIGS. 17A-17E, a first selective epitaxy process may be performed to epitaxially grow first source/drain regions 52 from physically exposed semiconductor surfaces of the first semiconductor plates 10, the second semiconductor plates 20, and the single crystalline semiconductor fins 8. A source/drain region may be a source region or a drain region. For example, the exemplary structure may be placed in an epitaxial deposition process chamber, and a silicon-containing precursor gas (such as silane, disilane, dichlorosilane, or trichlorosilane) may be flowed concurrent with an etchant gas (such as hydrogen chloride gas) to grow a silicon-containing semiconductor material from the physically exposed semiconductor surfaces. In one embodiment, dopants of a second conductivity type may be concurrently flowed into the epitaxial deposition process chamber to provide in-situ doping of the first source/drain regions 52. The first semiconductor plates 10 may have a doping of the first conductivity type (such as p-type), and the first source/drain regions 52 may have a doping of the second conductivity type (such as n-type) that is the opposite of the first conductivity type. The atomic concentration of dopants of the second conductivity type in the first source/drain regions 52 may be in a range from $5.0 \times 10^{19}/cm^3$ to $2.0 \times 10^{21}/cm^3$, although lesser and greater atomic concentrations may also be used. The thickness of the first source/drain regions 52 may be in a range from 10 nm to 50 nm, although lesser and greater thicknesses may also be used. The first hard mask layer 42 may be subsequently removed, for example, by an isotropic etch process such as a wet etch process.

Figure 18B:
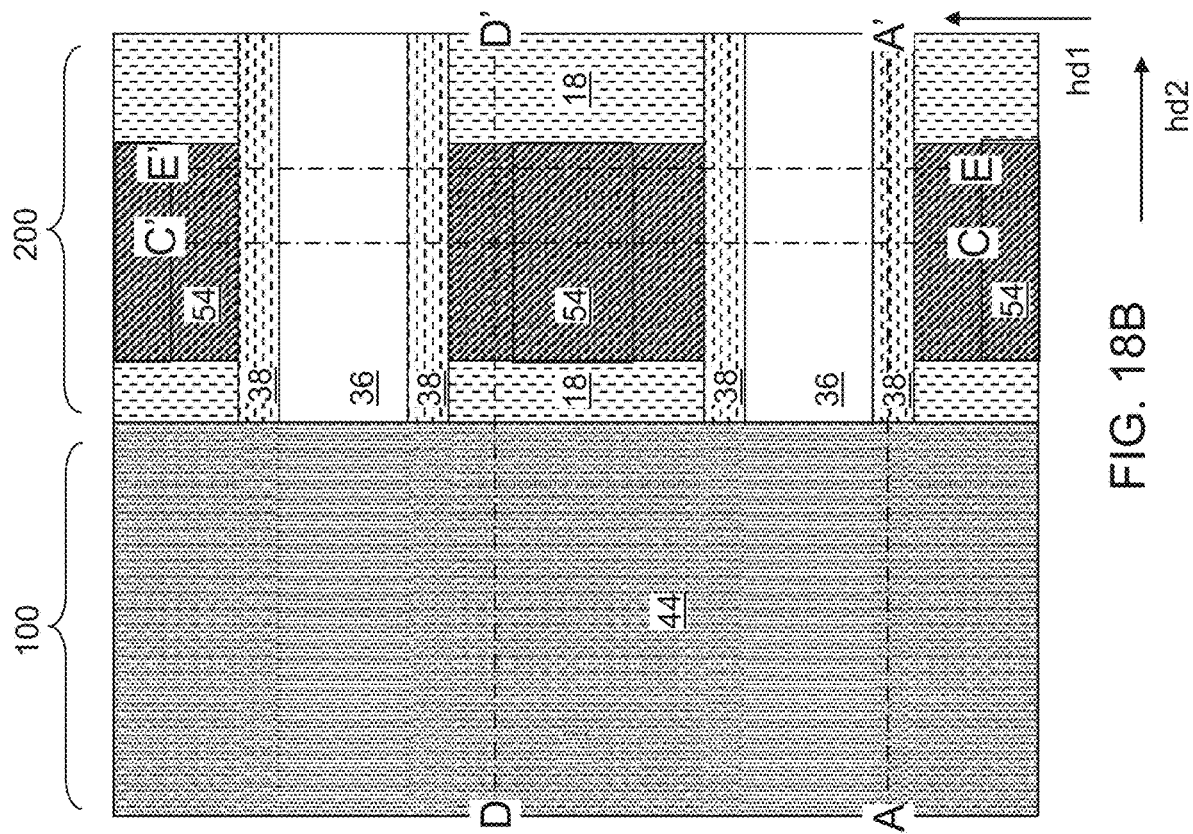
FIG. 18B is a top-down view of the exemplary structure of FIG. 18A. The vertical plane A-A' is the plane of the vertical cross-sectional view of FIG. 18A.
Figure 18A:
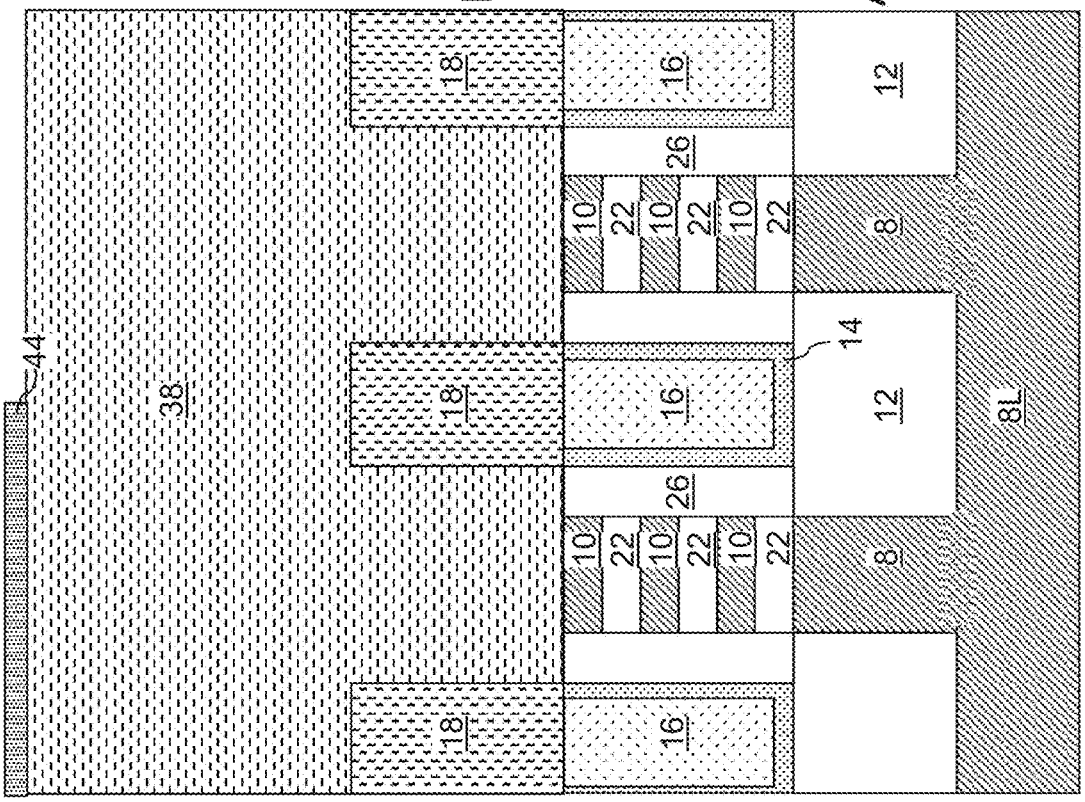
FIG. 18A is a vertical cross-sectional view of the exemplary structure after formation of a second dielectric mask layer and second source/drain regions according to an embodiment of the present disclosure.
Figure 18D:
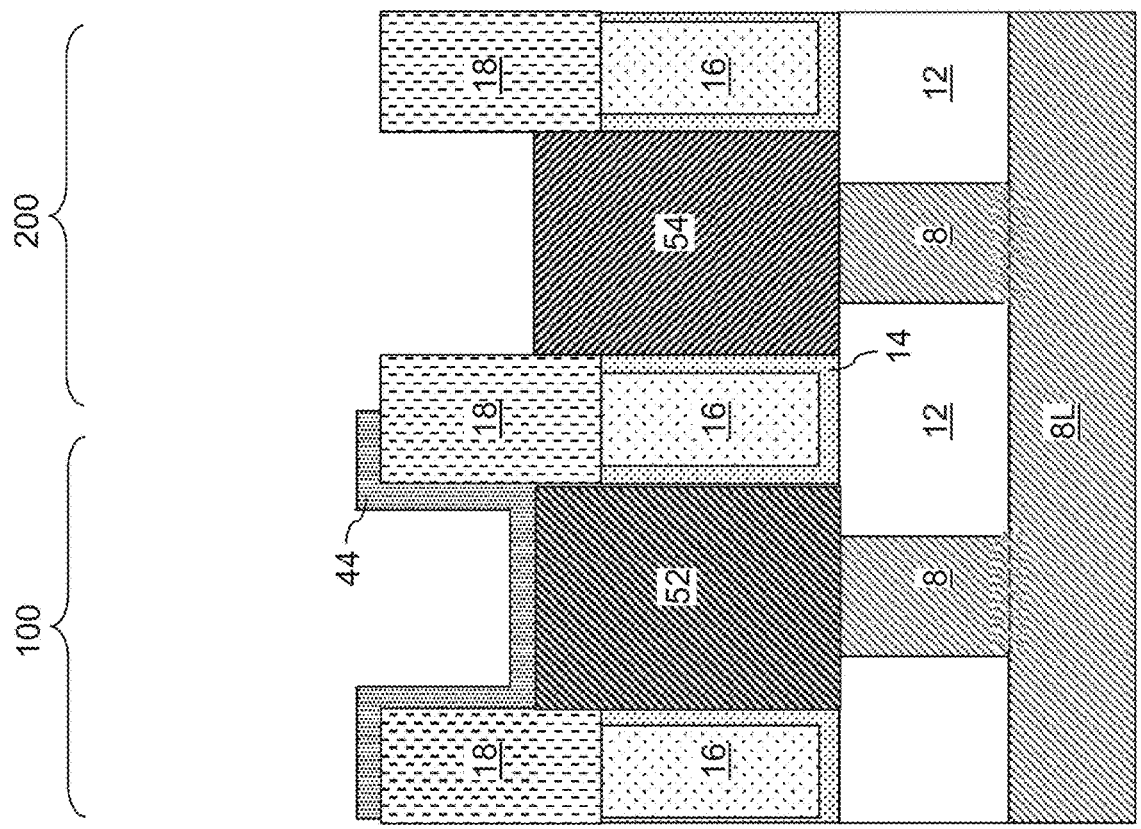
FIG. 18D is a vertical cross-sectional view along the vertical plane D-D' of FIG. 18B.
Figure 18C:
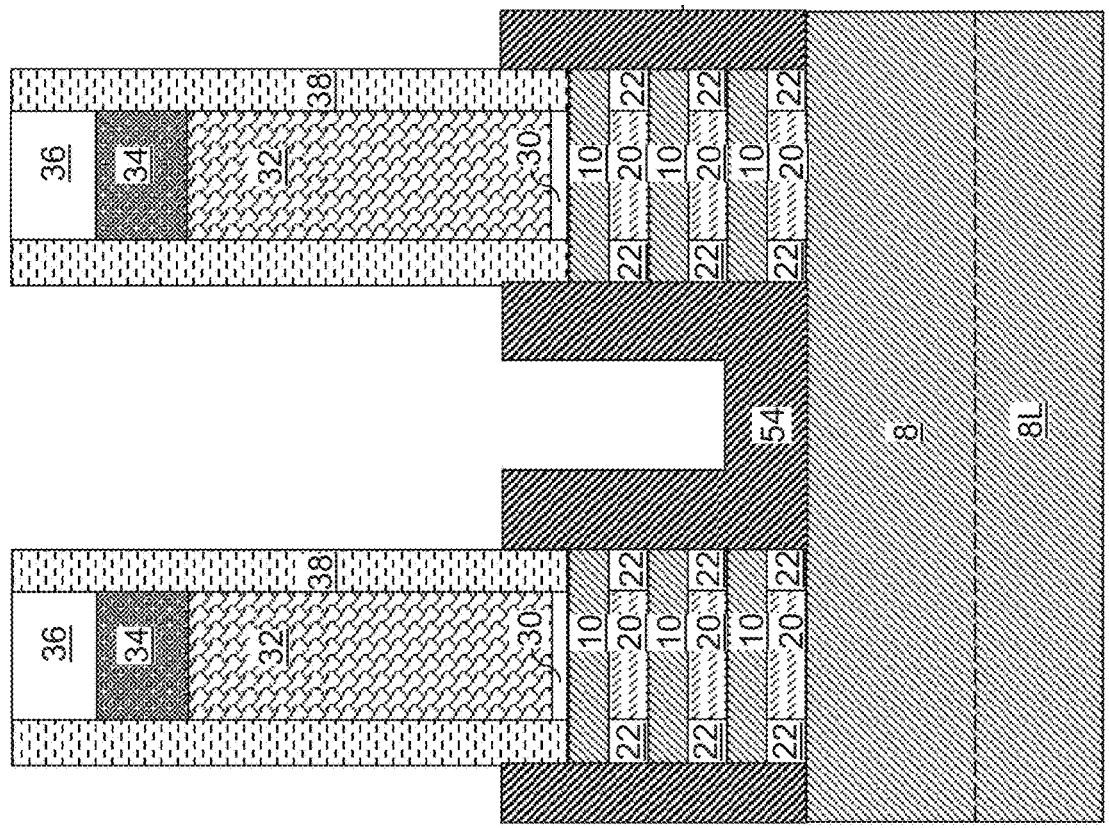
FIG. 18C is a vertical cross-sectional view along the vertical plane C-C' of FIG. 18B.
Figure 18E:
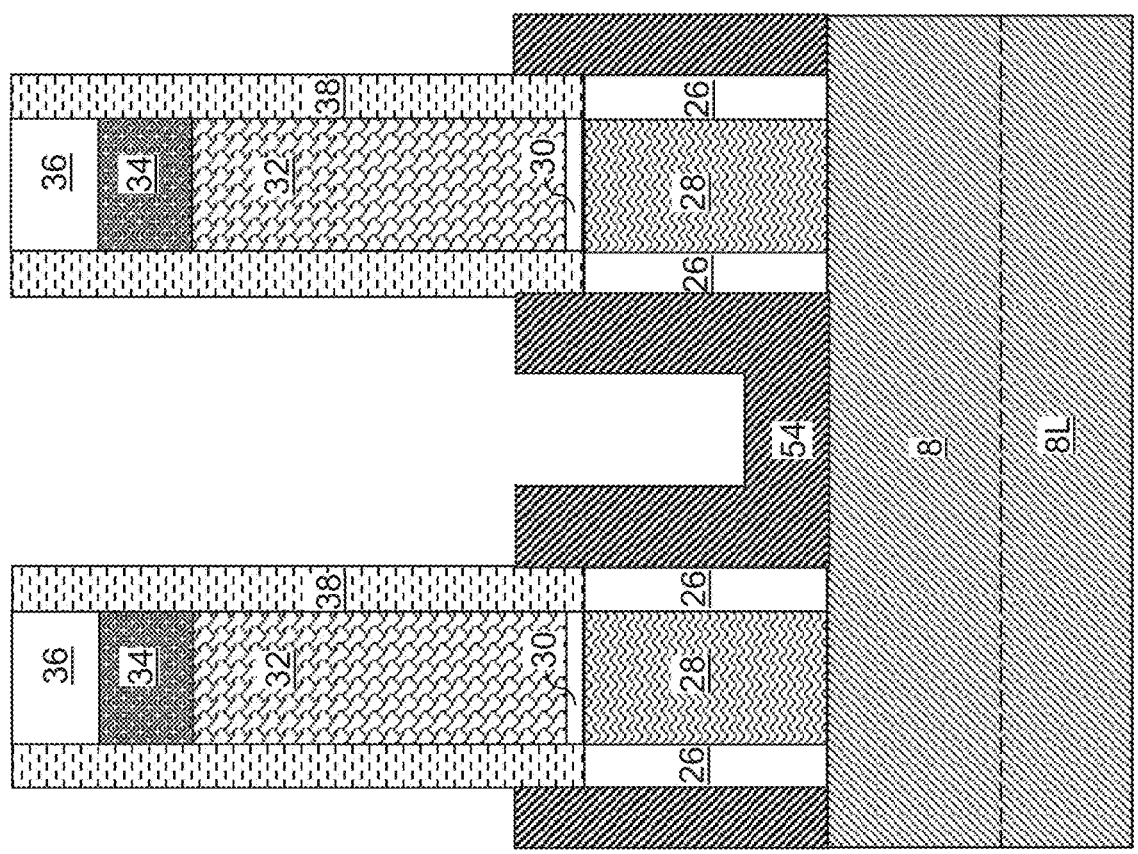
FIG. 18E is a vertical cross-sectional view along the vertical plane E-E' of FIG. 18B.

FIG. 18A is a vertical cross-sectional view of the exemplary structure after formation of a second dielectric mask layer and second source/drain regions according to an embodiment of the present disclosure. FIG. 18B is a top-down view of the exemplary structure of FIG. 18A. The vertical plane A-A' is the plane of the vertical cross-sectional view of FIG. 18A. FIG. 18C is a vertical cross-sectional view along the vertical plane C-C' of FIG. 18B. FIG. 18D is a vertical cross-sectional view along the vertical plane D-D' of FIG. 18B. FIG. 18E is a vertical cross-sectional view along the vertical plane E-E' of FIG. 18B. Referring to FIGS. 18A-18E, a second hard mask layer 44 may be deposited over the exemplary structure, and may be patterned to cover the first device region 100 while not covering the second device region 200. The second hard mask layer 44 includes a dielectric hard mask material such as silicon oxide or silicon nitride. The second hard mask layer 44 can be deposited by a conformal deposition process such as a chemical vapor deposition process. The thickness of the second hard mask layer 44 may be in a range from 5 nm to 10 nm, although lesser and greater thicknesses may also be used.

A second selective epitaxy process may be performed to epitaxially grow second source/drain regions 54 from physically exposed semiconductor surfaces of the first semiconductor plates 10, the second semiconductor plates 20, and the single crystalline semiconductor fins 8. For example, the exemplary structure may be placed in an epitaxial deposition process chamber, and a silicon-containing precursor gas (such as silane, disilane, dichlorosilane, or trichlorosilane) may be flowed concurrent with an etchant gas (such as hydrogen chloride gas) to grow a silicon-containing semiconductor material from the physically exposed semiconductor surfaces. In one embodiment, dopants of the first conductivity type may be concurrently flowed into the epitaxial deposition process chamber to provide in-situ doping of the second source/drain regions 54. The second semiconductor plates 20 may have a doping of the second conductivity type (such as n-type), and the second source/drain regions 54 may have a doping of the first conductivity type (such as p-type) that is the opposite of the second conductivity type. The atomic concentration of dopants of the first conductivity type in the second source/drain regions 54 may be in a range from $5.0 \times 10^{19}/cm^3$ to $2.0 \times 10^{21}/cm^3$, although lesser and greater atomic concentrations may also be used. The thickness of the second source/drain regions 54 may be in a range from 10 nm to 50 nm, although lesser and greater thicknesses may also be used. The second hard mask layer 44 may be subsequently removed, for example, by an isotropic etch process such as a wet etch process.

Figures 19A, 19B:
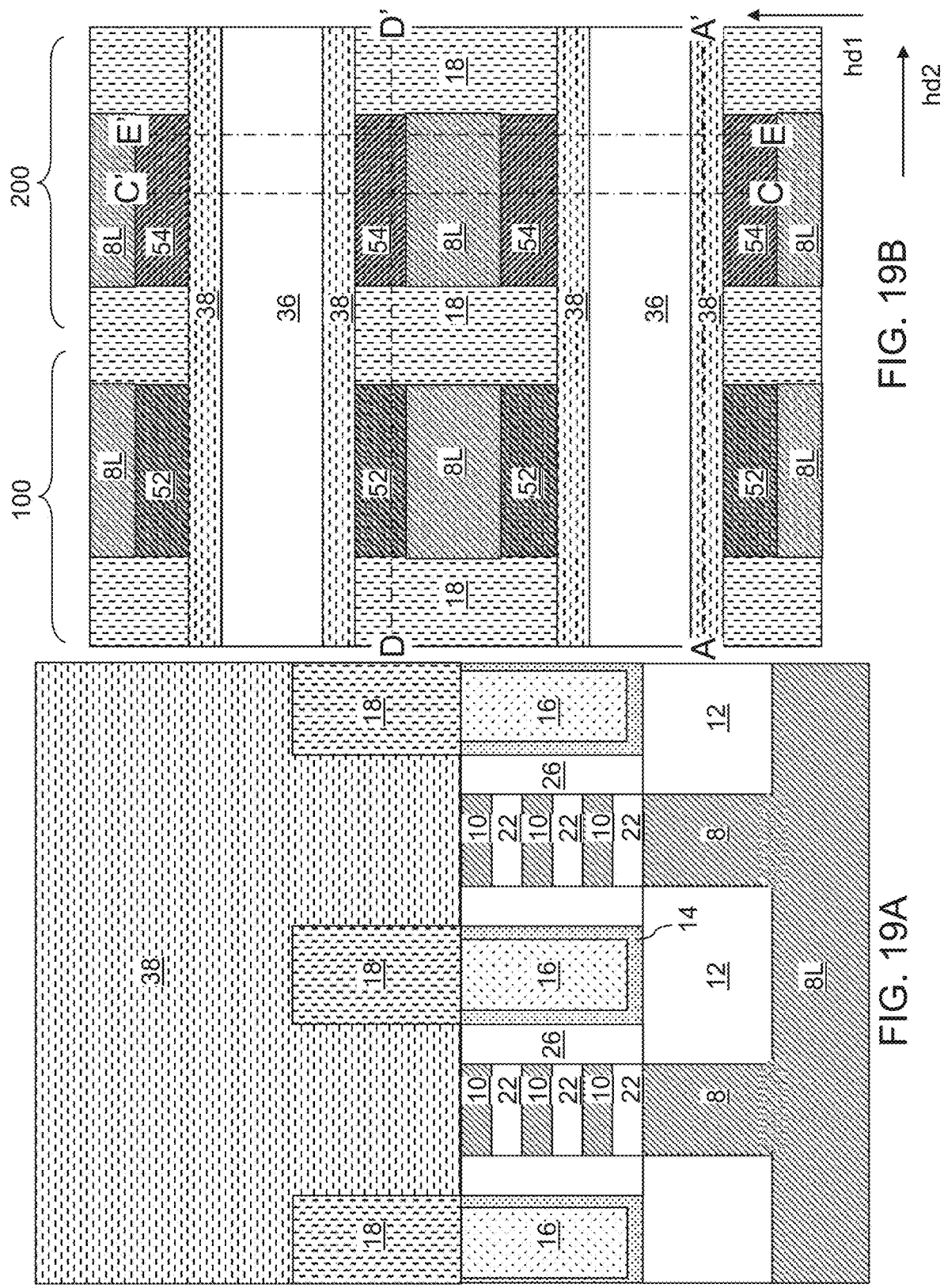
FIG. 19A is a vertical cross-sectional view of the exemplary structure after an optional step of patterning the source/drain regions according to an embodiment of the present disclosure.
FIG. 19B is a top-down view of the exemplary structure of FIG. 19A. The vertical plane A-A' is the plane of the vertical cross-sectional view of FIG. 19A.
Figure 19E:
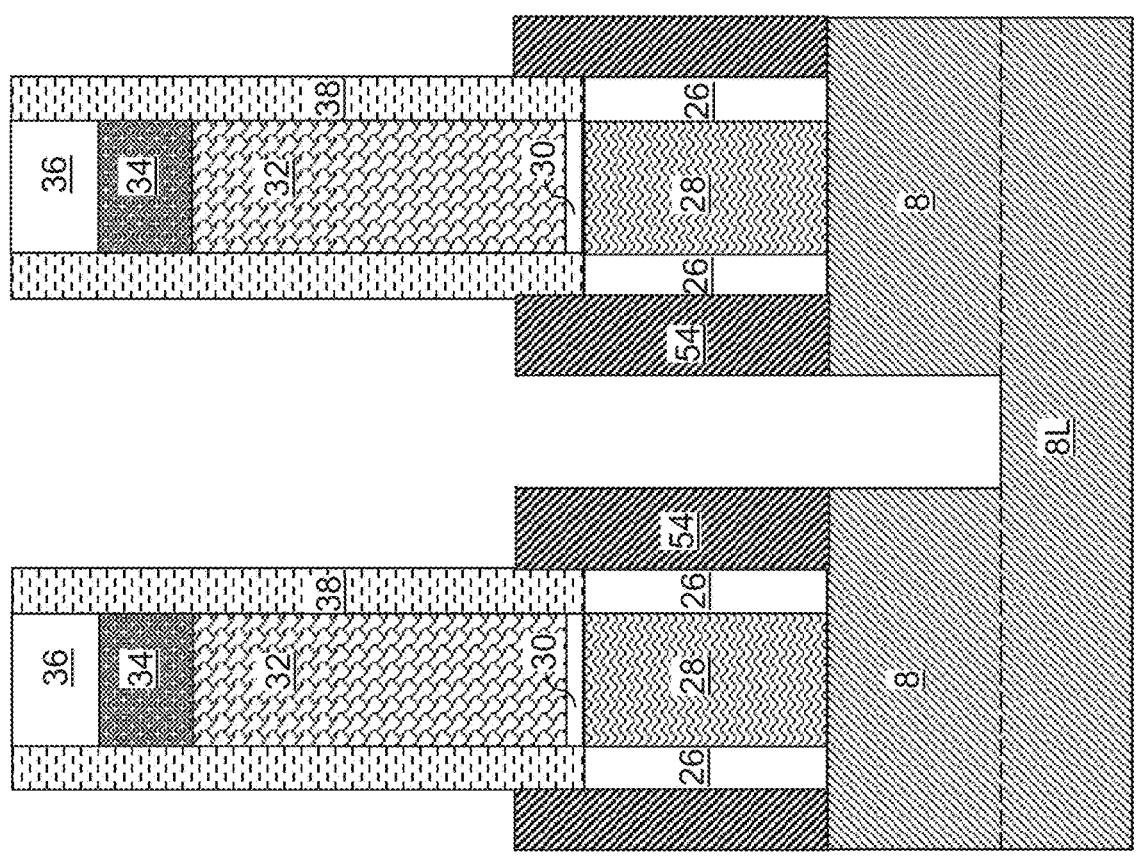
FIG. 19E is a vertical cross-sectional view along the vertical plane E-E' of FIG. 19B.

FIG. 19A is a vertical cross-sectional view of the exemplary structure after an optional step of patterning the source/drain regions according to an embodiment of the present disclosure. FIG. 19B is a top-down view of the exemplary structure of FIG. 19A. The vertical plane A-A' is the plane of the vertical cross-sectional view of FIG. 19A. FIG. 19C is a vertical cross-sectional view along the vertical plane C-C' of FIG. 19B. FIG. 19D is a vertical cross-sectional view along the vertical plane D-D' of FIG. 19B. FIG. 19E is a vertical cross-sectional view along the vertical plane E-E' of FIG. 19B. Referring to FIGS. 19A-19E, a photoresist layer (not shown) may be optionally applied over the exemplary structure, and may be patterned to form openings in areas from which portions of the first source/drain regions 52 and the second source/drain regions 54 are to be removed. An anisotropic etch process may be performed to trim horizontal portions of the first source/drain regions 52 and the second source/drain regions 54 between neighboring field effect transistor as needed. Optionally, the single crystalline semiconductor fins 8 may be patterned to electrically isolate neighboring field effect transistors. The photoresist layer may be subsequently removed, for example, by ashing.

Figure 20D:
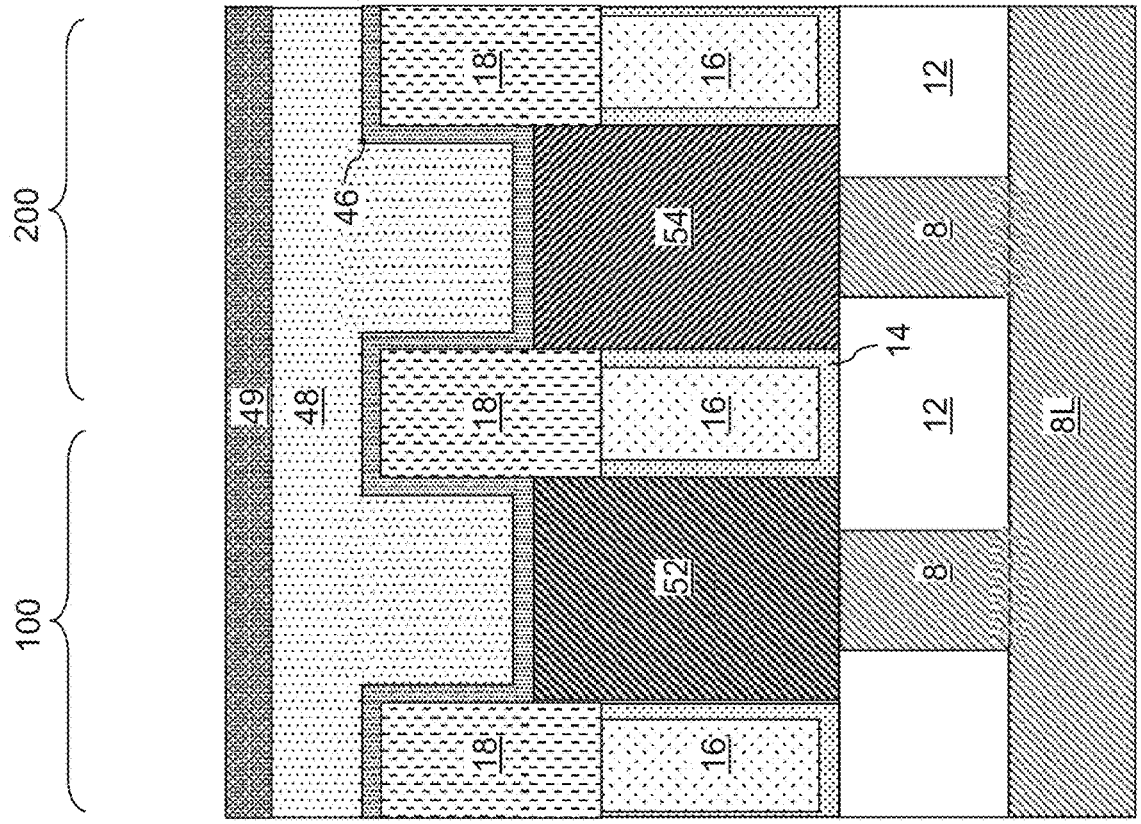
FIG. 20D is a vertical cross-sectional view along the vertical plane D-D' of FIG. 20B.
Figure 20C:
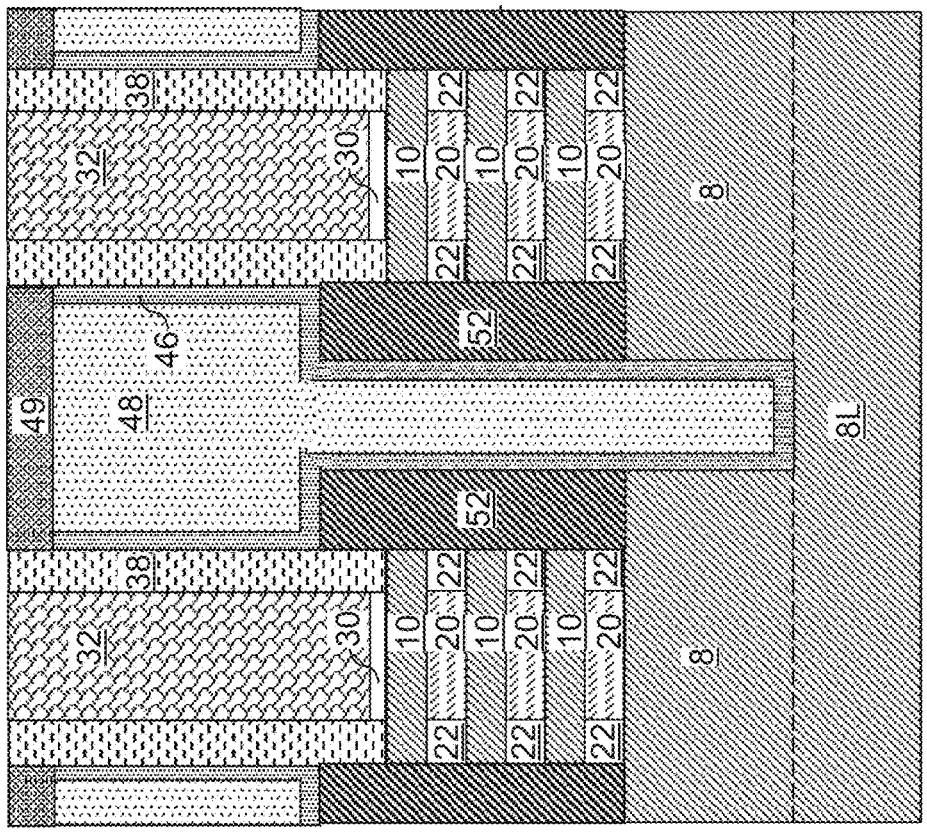
FIG. 20C is a vertical cross-sectional view along the vertical plane C-C' of FIG. 20B.
Figure 20E:
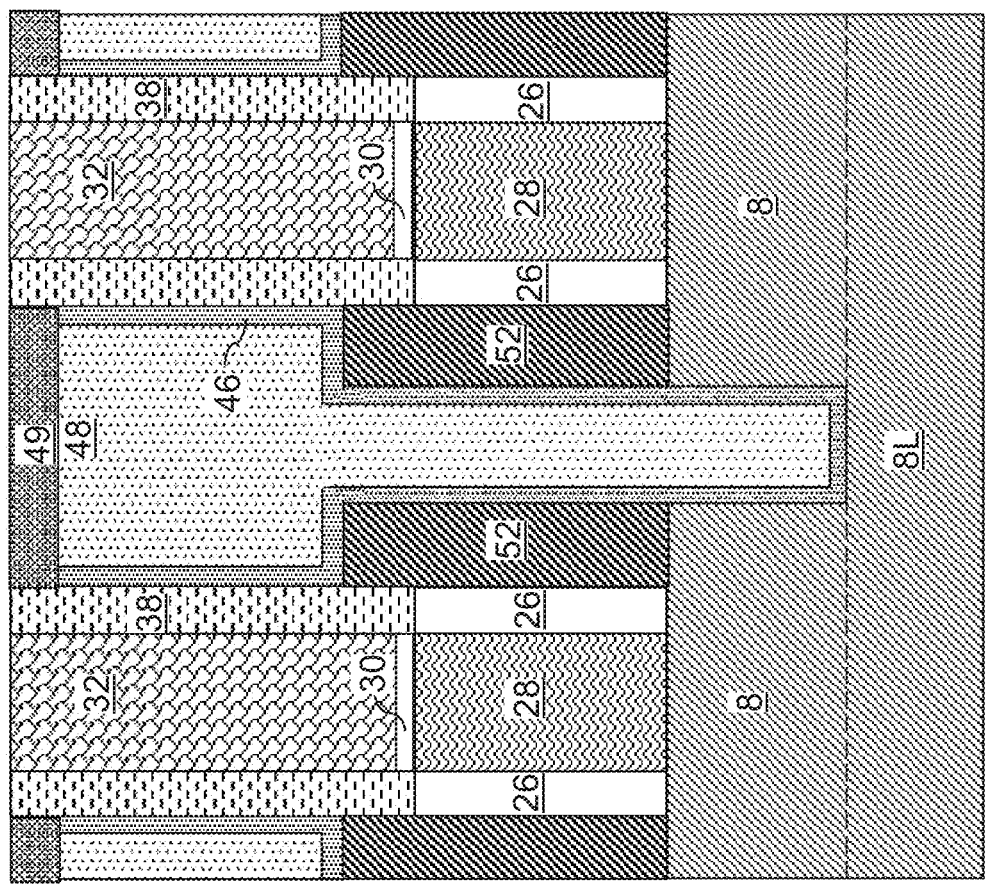
FIG. 20E is a vertical cross-sectional view along the vertical plane E-E' of FIG. 20B.

FIG. 20A is a vertical cross-sectional view of the exemplary structure after formation of inter-device isolation structures according to an embodiment of the present disclosure. FIG. 20B is a top-down view of the exemplary structure of FIG. 20A. The vertical plane A-A' is the plane of the vertical cross-sectional view of FIG. 20A. FIG. 20C is a vertical cross-sectional view along the vertical plane C-C' of FIG. 20B. FIG. 20D is a vertical cross-sectional view along the vertical plane D-D' of FIG. 20B. FIG. 20E is a vertical cross-sectional view along the vertical plane E-E' of FIG. 20B. Referring to FIGS. 20A-20E, inter-device isolation structures (46, 48, 49) may be formed between neighboring pairs of semiconductor plate stacks (10, 20). For example, a continuous isolation dielectric liner including an etch stop dielectric material may be deposited. The continuous isolation dielectric liner may include a dielectric material such as aluminum oxide, hafnium oxide, or silicon carbide nitride. Other liner materials are within the contemplated scope of disclosure. The thickness of the continuous isolation dielectric liner may be in a range from 10 nm to 50 nm, although lesser and greater thicknesses may also be used.

A dielectric fill material such as undoped silicate glass or a doped silicate glass may be deposited over the isolation dielectric liner to fill cavities between neighboring pairs of gate template structures (30, 32, 34, 36). A chemical mechanical planarization process may be performed to remove the gate mask structures 36, the sacrificial gate caps 34, and portions of the dielectric fill material, the continuous isolation dielectric liner, and the dielectric gate spacers 38 that are located above the horizontal plane including the top surface of the sacrificial gate structures 32. Each remaining portion of the continuous isolation dielectric liner comprises an isolation dielectric liner 46. Each remaining portion of the dielectric fill material comprises an isolation dielectric fill material portion 48.

Top portions of the isolation dielectric liners 46 and the isolation dielectric fill material portions 48 may be vertically recessed. At least one isotropic etch process may be used to vertically recess the isolation dielectric liners 46 and the isolation dielectric fill material portions 48. An etch stop dielectric material such as silicon nitride may be deposited in the recesses overlying the isolation dielectric liners 46 and the isolation dielectric fill material portions 48. Excess portions of the etch stop dielectric material may be removed from above the horizontal plane including the top surfaces of the sacrificial gate structures 32. Each remaining portion of the etch stop dielectric material that fills the recesses comprise isolation etch stop plate 49. The thickness of each isolation etch stop plate 49 may be in a range from 10 nm to 20 nm, although lesser and greater thicknesses may also be used. Each combination of an isolation dielectric liner 46, an isolation dielectric fill material portion 48, and an isolation etch stop plate 49 constitutes an inter-device isolation structures (46, 48, 49).

Figure 21E:
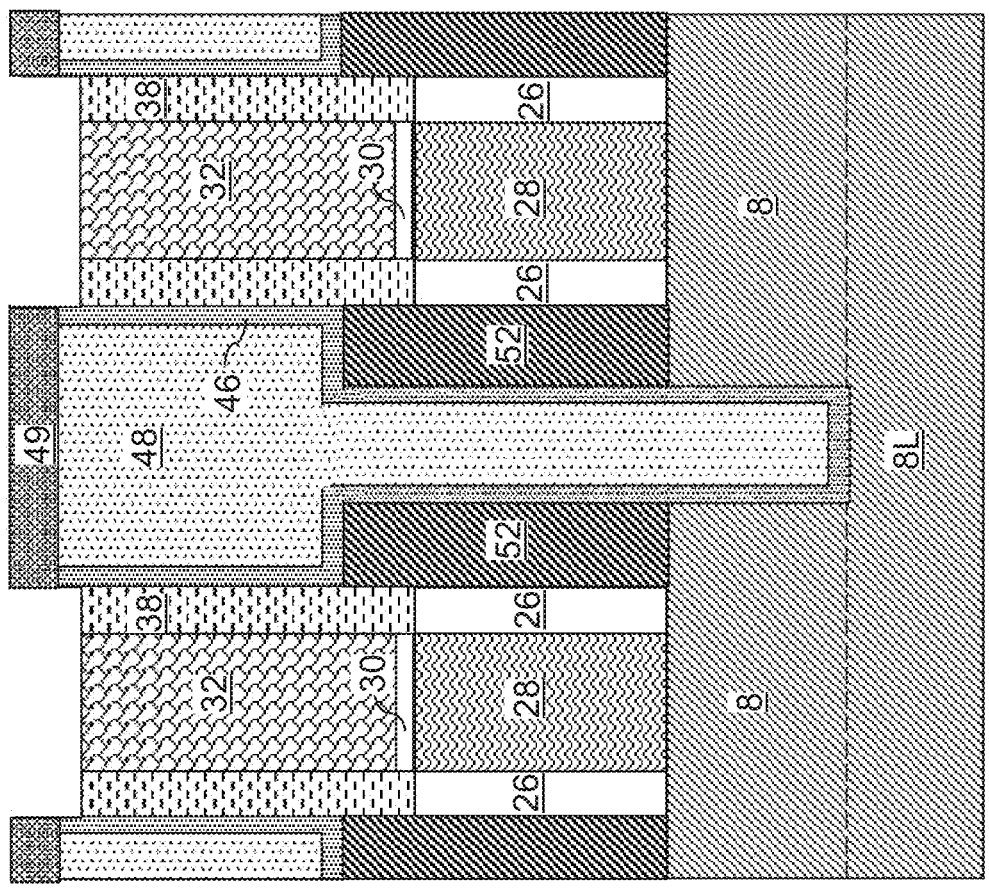
FIG. 21E is a vertical cross-sectional view along the vertical plane E-E' of FIG. 21B.

FIG. 21A is a vertical cross-sectional view of the exemplary structure after formation of etch barrier structures according to an embodiment of the present disclosure. FIG. 21B is a top-down view of the exemplary structure of FIG. 21A. The vertical plane A-A' is the plane of the vertical cross-sectional view of FIG. 21A. FIG. 21C is a vertical cross-sectional view along the vertical plane C-C' of FIG. 21B. FIG. 21D is a vertical cross-sectional view along the vertical plane D-D' of FIG. 21B. FIG. 21E is a vertical cross-sectional view along the vertical plane E-E' of FIG. 21B. Referring to FIGS. 21A-21E, etch barrier structures 62 laterally extending along the first horizontal direction hd1 and overlying the etch stop dielectric fins 18 may be formed. For example, the etch barrier structures 62 may be patterned strips of a photoresist material formed by application and patterning of a photoresist layer.

Figure 22D:
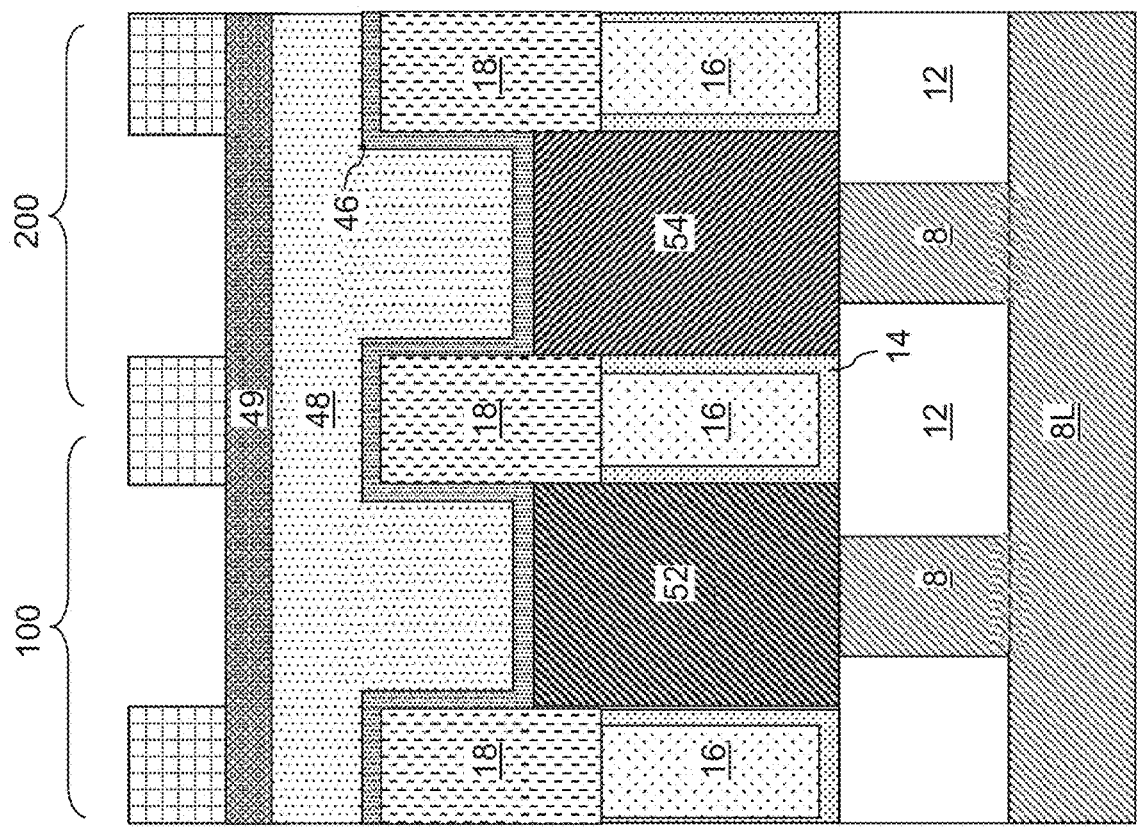
FIG. 22D is a vertical cross-sectional view along the vertical plane D-D' of FIG. 22B.
Figure 22C:
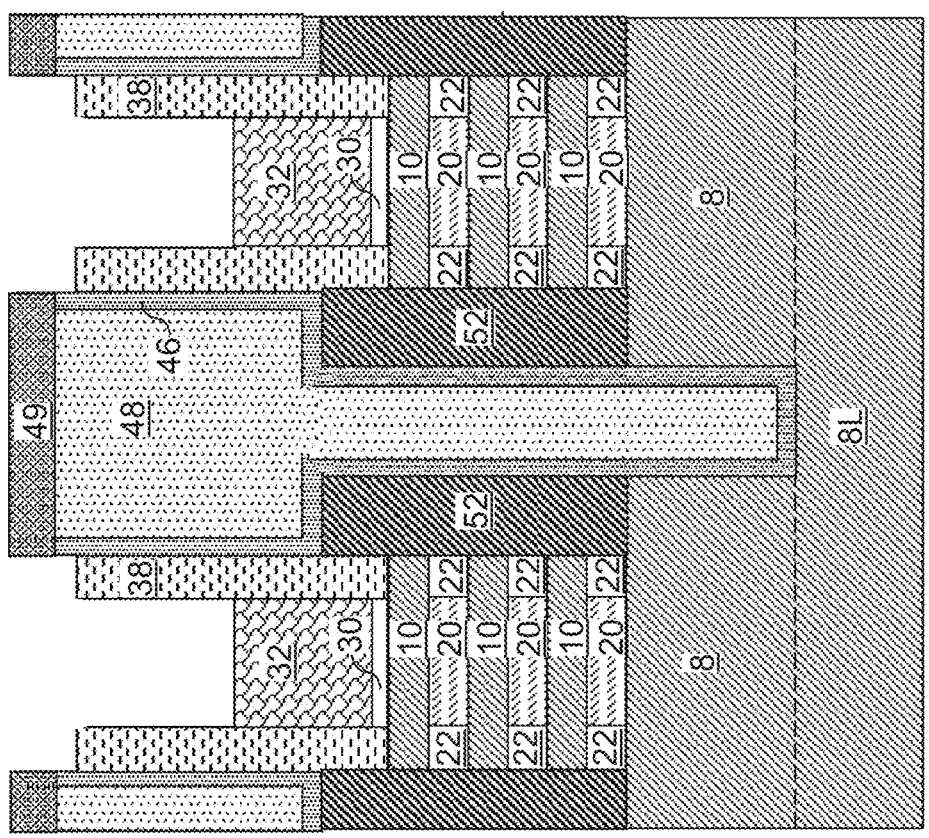
FIG. 22C is a vertical cross-sectional view along the vertical plane C-C' of FIG. 22B.
Figure 22E:
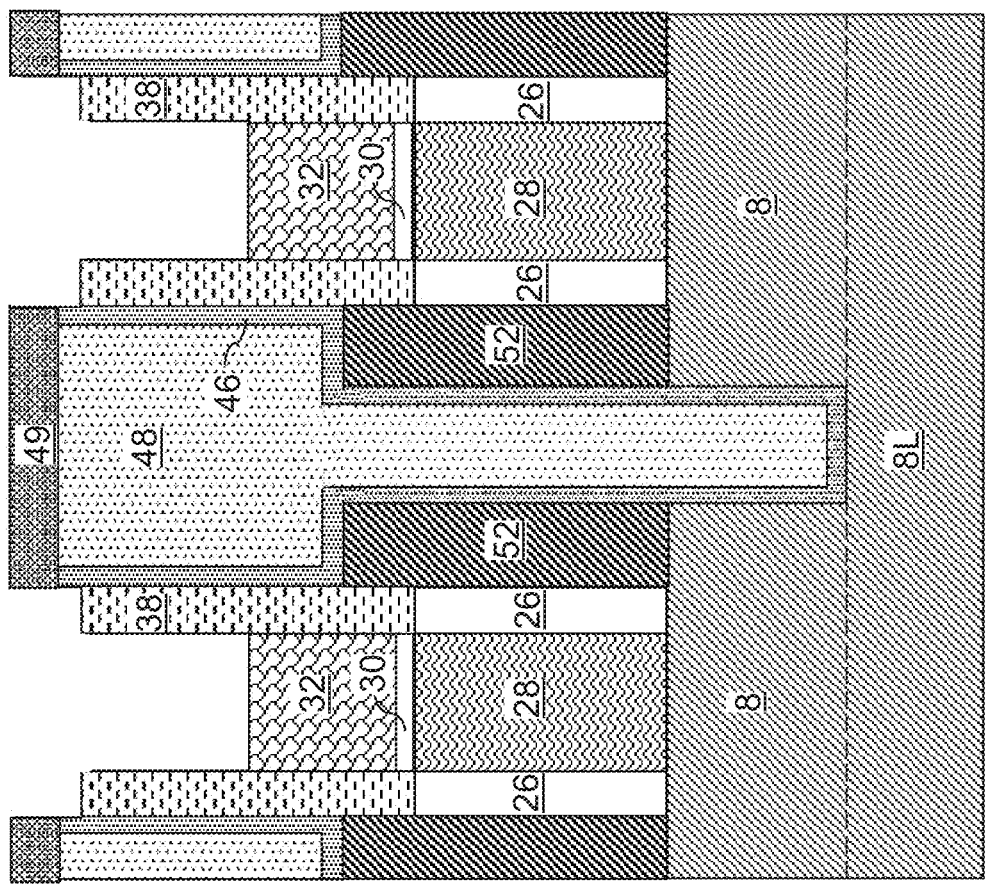
FIG. 22E is a vertical cross-sectional view along the vertical plane E-E' of FIG. 22B.

FIG. 22A is a vertical cross-sectional view of the exemplary structure after removal of partial removal of sacrificial gate structures according to an embodiment of the present disclosure. FIG. 22B is a top-down view of the exemplary structure of FIG. 22A. The vertical plane A-A' is the plane of the vertical cross-sectional view of FIG. 22A. FIG. 22C is a vertical cross-sectional view along the vertical plane C-C' of FIG. 22B. FIG. 22D is a vertical cross-sectional view along the vertical plane D-D' of FIG. 22B. FIG. 22E is a vertical cross-sectional view along the vertical plane E-E' of FIG. 22B. Referring to FIGS. 22A-22E, an anisotropic etch process may be performed to partially etch physically exposed portions of the sacrificial gate structures 32 selective to the sacrificial gate liners 30. Each sacrificial gate structure 32 may be divided into a plurality of sacrificial gate structures 32.

Figure 23E:
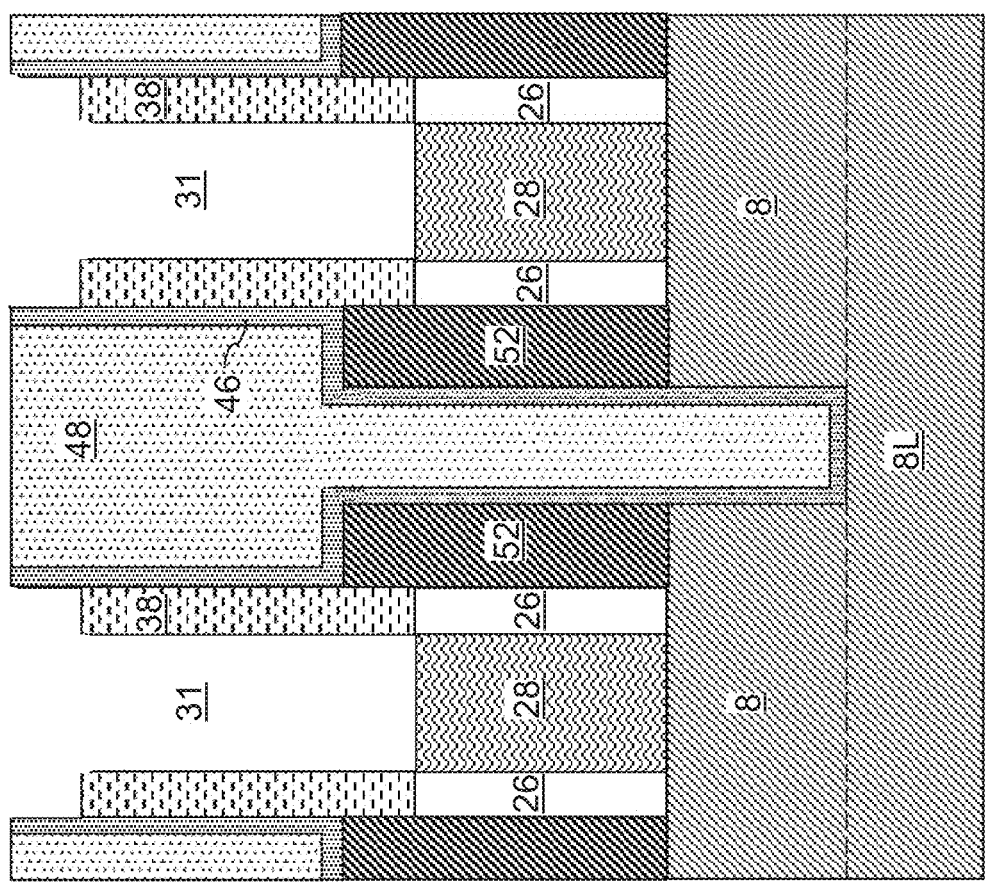
FIG. 23E is a vertical cross-sectional view along the vertical plane E-E' of FIG. 23B.

FIG. 23A is a vertical cross-sectional view of the exemplary structure after removal of sacrificial gate structures and sacrificial gate liners according to an embodiment of the present disclosure. FIG. 23B is a top-down view of the exemplary structure of FIG. 23A. The vertical plane A-A' is the plane of the vertical cross-sectional view of FIG. 23A. FIG. 23C is a vertical cross-sectional view along the vertical plane C-C' of FIG. 23B. FIG. 23D is a vertical cross-sectional view along the vertical plane D-D' of FIG. 23B. FIG. 23E is a vertical cross-sectional view along the vertical plane E-E' of FIG. 23B. Referring to FIGS. 23A-23E, the etch barrier structures 62 may be subsequently removed, for example, by ashing. The sacrificial gate structures 32 may be removed by an etch process. For example, a wet etch process using nitric acid, ammonium fluoride, potassium hydroxide, and/or hydrofluoric acid may be used. The sacrificial gate liners 30 may be subsequently removed by an isotropic etch process such as a wet etch process using dilute hydrofluoric acid.

Figure 24E:
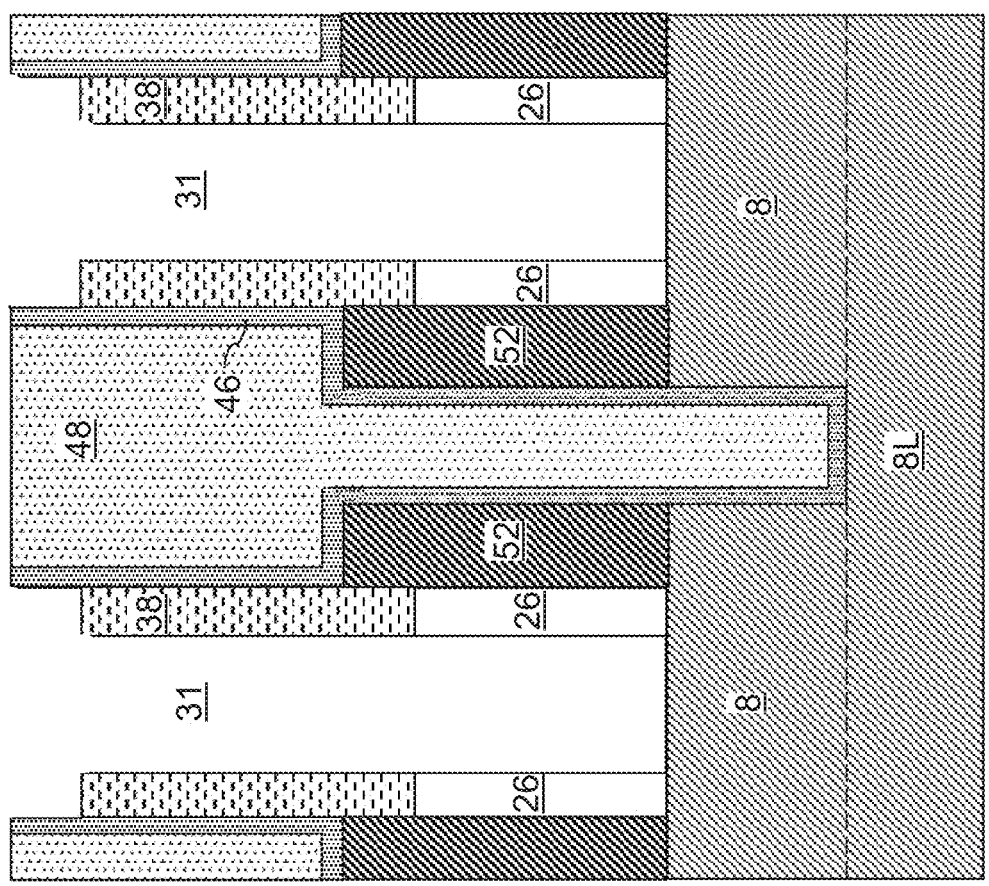
FIG. 24E is a vertical cross-sectional view along the vertical plane E-E' of FIG. 24B.

FIG. 24A is a vertical cross-sectional view of the exemplary structure after removal of silicon-germanium plates and formation of gate cavities according to an embodiment of the present disclosure. FIG. 24B is a top-down view of the exemplary structure of FIG. 24A. The vertical plane A-A' is the plane of the vertical cross-sectional view of FIG. 24A. FIG. 24C is a vertical cross-sectional view along the vertical plane C-C' of FIG. 24B. FIG. 24D is a vertical cross-sectional view along the vertical plane D-D' of FIG. 24B. FIG. 24E is a vertical cross-sectional view along the vertical plane E-E' of FIG. 24B. Referring to FIGS. 24A-24E, a wet etch process that etches the material of the cladding silicon-germanium alloy structures 28 and the second semiconductor plates 20 selective to the material of the first semiconductor plates 10 may be performed. For example, if the second semiconductor plates 20 include silicon-germanium plates, a wet etch process using a mixture of ammonium hydroxide and hydrogen peroxide may be used to remove the cladding silicon-germanium alloy structures 28 and the second semiconductor plates 20. At least one suspended first semiconductor plate 10, such as a plurality of suspended first semiconductor plates 10, may be formed within each gate cavity 31. Each gate cavity 31 includes an empty volume formed by removal of the sacrificial gate structures 32, the sacrificial gate liners 30, the cladding silicon-germanium alloy structures 28, and the second semiconductor plates 20, and underlies the horizontal plane including the top surfaces of the etch stop dielectric fins 18. Horizontal surfaces and vertical surfaces of the first semiconductor plates 10 are physically exposed within each gate cavity 31. Each stack of first semiconductor plates 10 located within a respective gate cavity comprises channel portions of a field effect transistor.

Figure 25E:
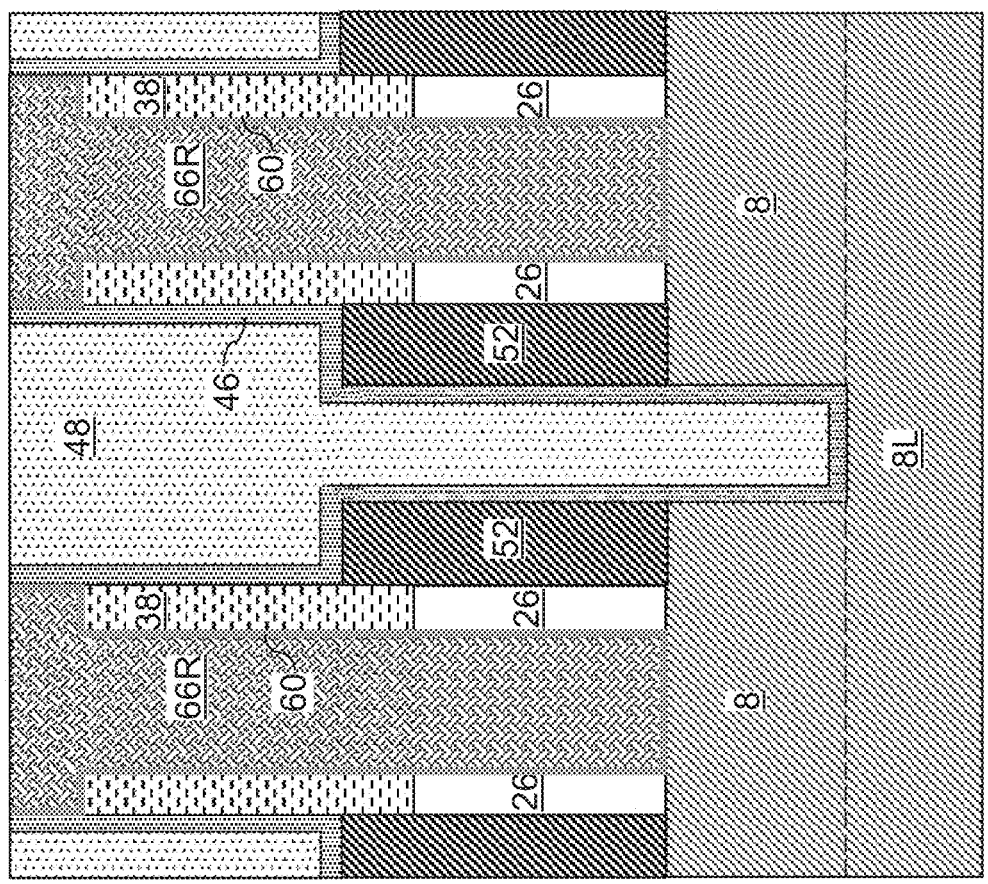
FIG. 25E is a vertical cross-sectional view along the vertical plane E-E' of FIG. 25B.

FIG. 25A is a vertical cross-sectional view of the exemplary structure after formation of gate dielectric layer and gate electrode rails according to an embodiment of the present disclosure. FIG. 25B is a top-down view of the exemplary structure of FIG. 25A. The vertical plane A-A' is the plane of the vertical cross-sectional view of FIG. 25A. FIG. 25C is a vertical cross-sectional view along the vertical plane C-C' of FIG. 25B. FIG. 25D is a vertical cross-sectional view along the vertical plane D-D' of FIG. 25B. FIG. 25E is a vertical cross-sectional view along the vertical plane E-E' of FIG. 25B. Referring to FIGS. 25A-25E, a gate dielectric layer 60 and a gate electrode rail 66R may be formed within each gate cavity 31. For example, a continuous gate dielectric material layer may be conformally deposited, for example, by atomic layer deposition. The continuous gate dielectric material layer may include a dielectric metal oxide material having a dielectric constant greater than 7.9. Dielectric metal oxide materials having a dielectric constant greater than 7.9 are referred to high dielectric constant (high-k) metal oxide materials. Exemplary high-k dielectric metal oxide materials include, but are not limited to, aluminum oxide, hafnium oxide, yttrium oxide, lanthanum oxide, zirconium oxide, tantalum oxide, and strontium oxide. Optionally, the continuous gate dielectric material layer may additionally include a silicon oxide layer. The thickness of the continuous gate dielectric material layer may be in a range from 1 nm to 6 nm, such as from 1.5 nm to 3 nm, although lesser and greater thicknesses may also be used.

A continuous gate electrode metal layer may be deposited over the continuous gate dielectric material layer. The continuous gate electrode metal layer includes an optional metallic liner layer including a conductive metallic nitride material such as TiN, TaN, or WN, and a metallic fill material such as tungsten, ruthenium, molybdenum, cobalt, tantalum, or titanium.

Excess portions of the continuous gate electrode metal layer and the continuous gate dielectric material layer may be removed from above the horizontal plane including the top surfaces of the etch stop dielectric fins 18. A chemical mechanical planarization (CMP) process may be performed in which the top surfaces of the etch stop dielectric fins 18 are used as stopping surfaces. Each remaining portion of the continuous gate dielectric material layer comprises a gate dielectric layer 60. Each remaining portion of the continuous gate electrode material layer comprises a gate electrode rail 66R. Each gate dielectric layer 60 and each gate electrode rail 66R may laterally extend along the second horizontal direction hd2 over multiple stacks of first semiconductor plates 10.

Generally, each combination of a sacrificial gate structures 32 and underlying middle portions of the second semiconductor plates 20 is replaced with a combination of a gate dielectric layer 60 and a gate electrode rail 66R, which is subsequently divided into multiple gate electrodes.

Figure 26D:
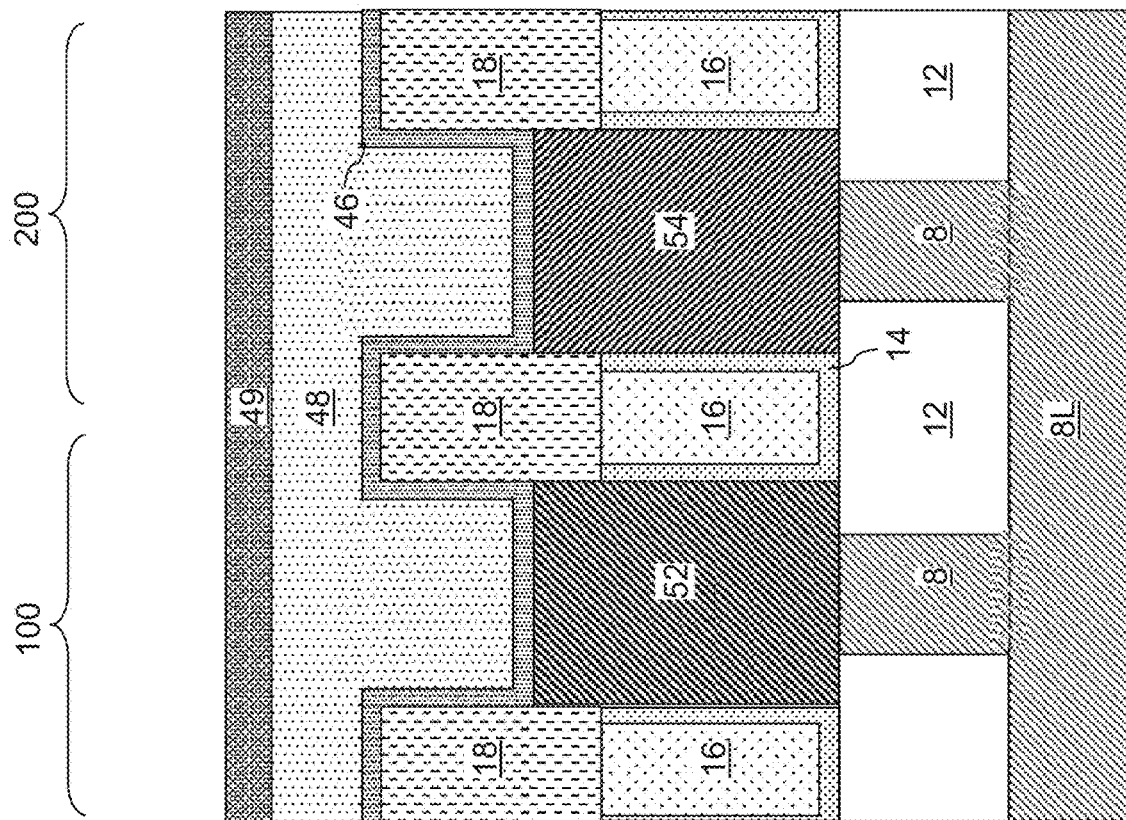
FIG. 26D is a vertical cross-sectional view along the vertical plane D-D' of FIG. 26B.
Figure 26C:
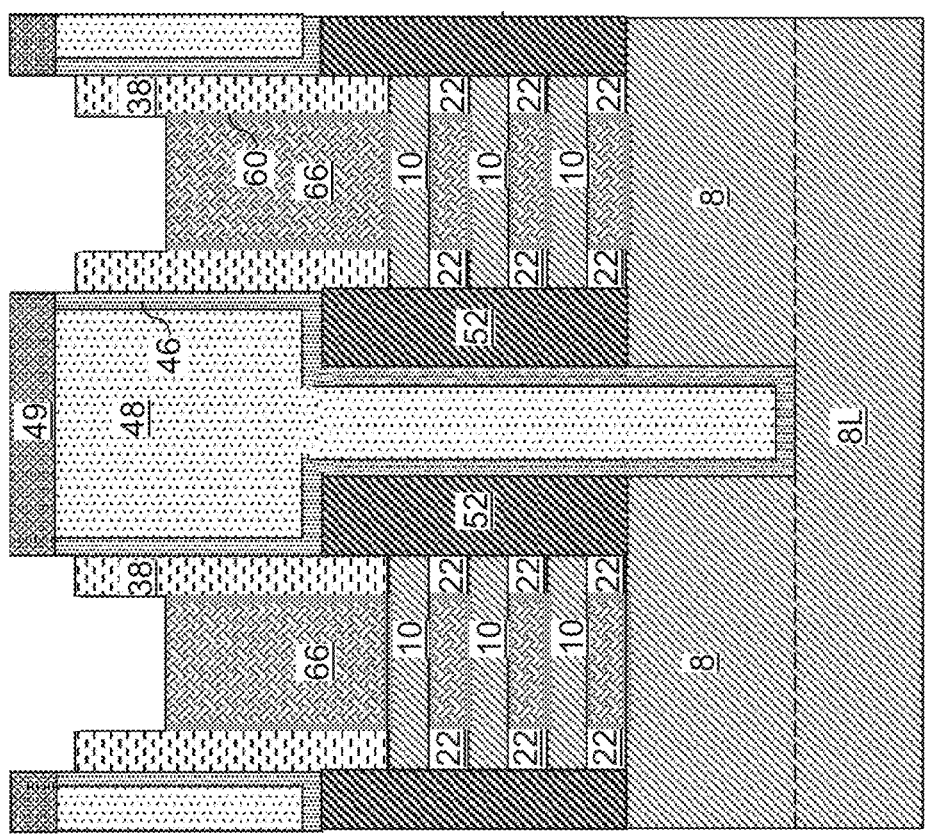
FIG. 26C is a vertical cross-sectional view along the vertical plane C-C' of FIG. 26B.
Figure 26E:
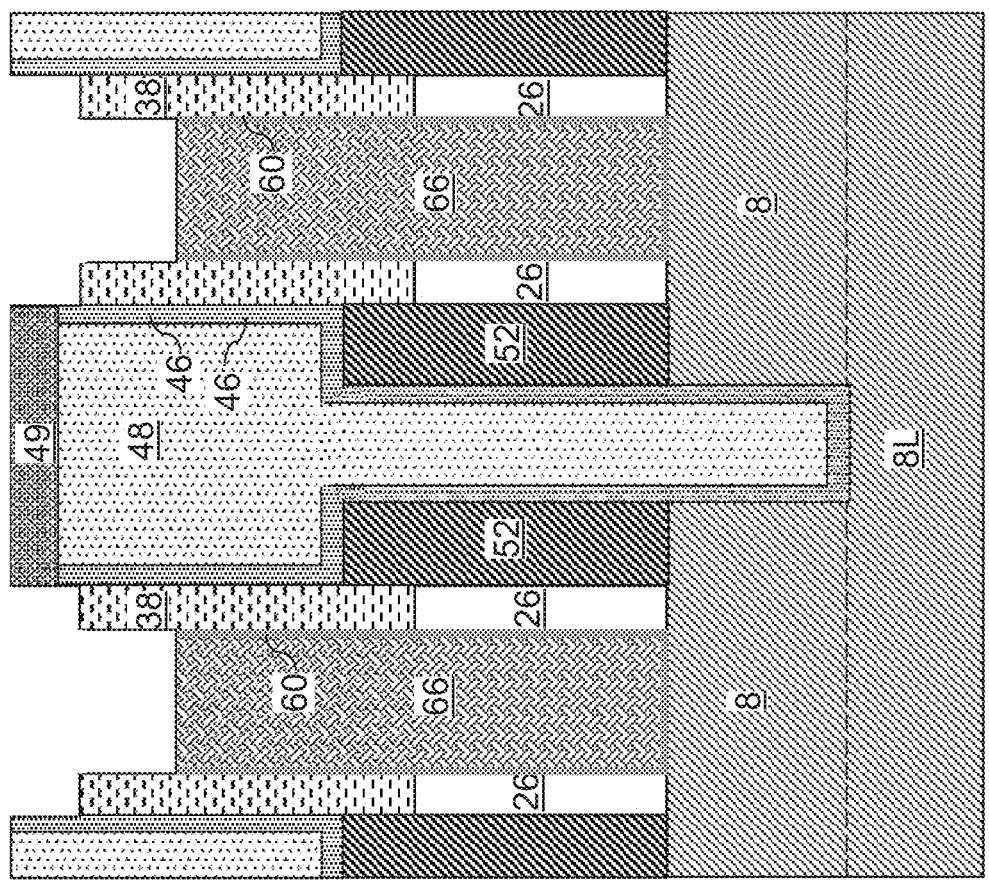
FIG. 26E is a vertical cross-sectional view along the vertical plane E-E' of FIG. 26B.

FIG. 26A is a vertical cross-sectional view of the exemplary structure after formation of gate stacks including a respective gate dielectric layer and a respective gate electrode according to an embodiment of the present disclosure. FIG. 26B is a top-down view of the exemplary structure of FIG. 26A. The vertical plane A-A' is the plane of the vertical cross-sectional view of FIG. 26A. FIG. 26C is a vertical cross-sectional view along the vertical plane C-C' of FIG. 26B. FIG. 26D is a vertical cross-sectional view along the vertical plane D-D' of FIG. 26B. FIG. 26E is a vertical cross-sectional view along the vertical plane E-E' of FIG. 26B. Referring to FIGS. 26A-26E, portions of the gate electrode rails 66R and the gate dielectric layers 60 that overlie the top surfaces of the inter-device isolation structures (46, 48, 49) may be removed by performing an etch back process. The etch back process may use an anisotropic etch process or an isotropic etch process. In one embodiment, top portions of the dielectric gate spacers 38 may be vertically recessed collaterally during the etch back process.

Each gate electrode rail 66R is divided into multiple gate electrodes 66. Each gate dielectric layer 60 may be divided into multiple gate dielectric layers 60. A combination of a gate dielectric layer 60 and a gate electrode 66 is formed in each gate cavity 31. Each gate dielectric layer 60 contacts, and surrounds, at least one first semiconductor plate 10, which may include a plurality of first semiconductor plates 10. A gate electrode 66 laterally surrounds each first semiconductor plate 10 of a field effect transistor. Each first field effect transistor formed in a first device region 100 includes a respective subset of the first semiconductor plates 10 having a doping of the first conductivity type and respective source/drain regions 52 having a doping of the second conductivity type. Each second field effect transistor formed in the second device region 200 includes a respective subset of the first semiconductor plates 10 having a doping of the second conductivity type and respective source/drain regions 54 having a doping of the first conductivity type.

Figure 27B:
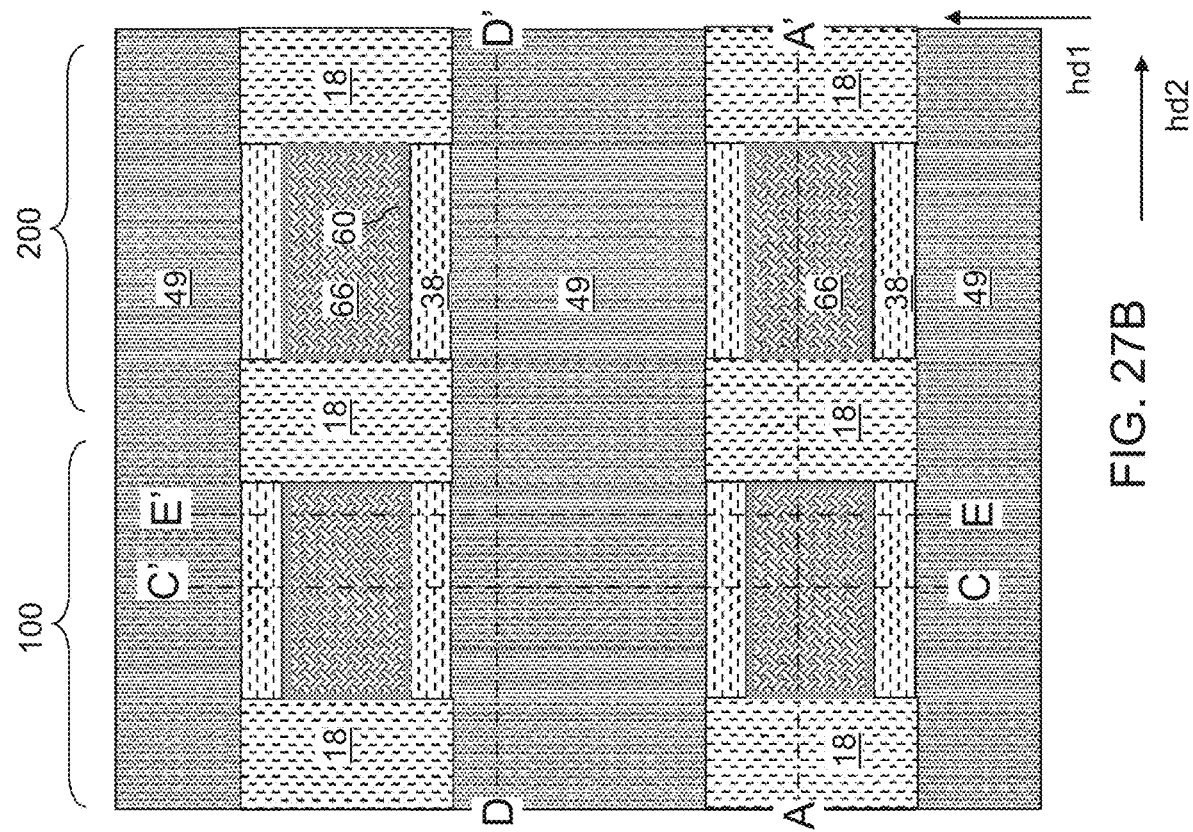
FIG. 27B is a top-down view of the exemplary structure of FIG. 27A. The vertical plane A-A' is the plane of the vertical cross-sectional view of FIG. 27A.
Figure 27A:
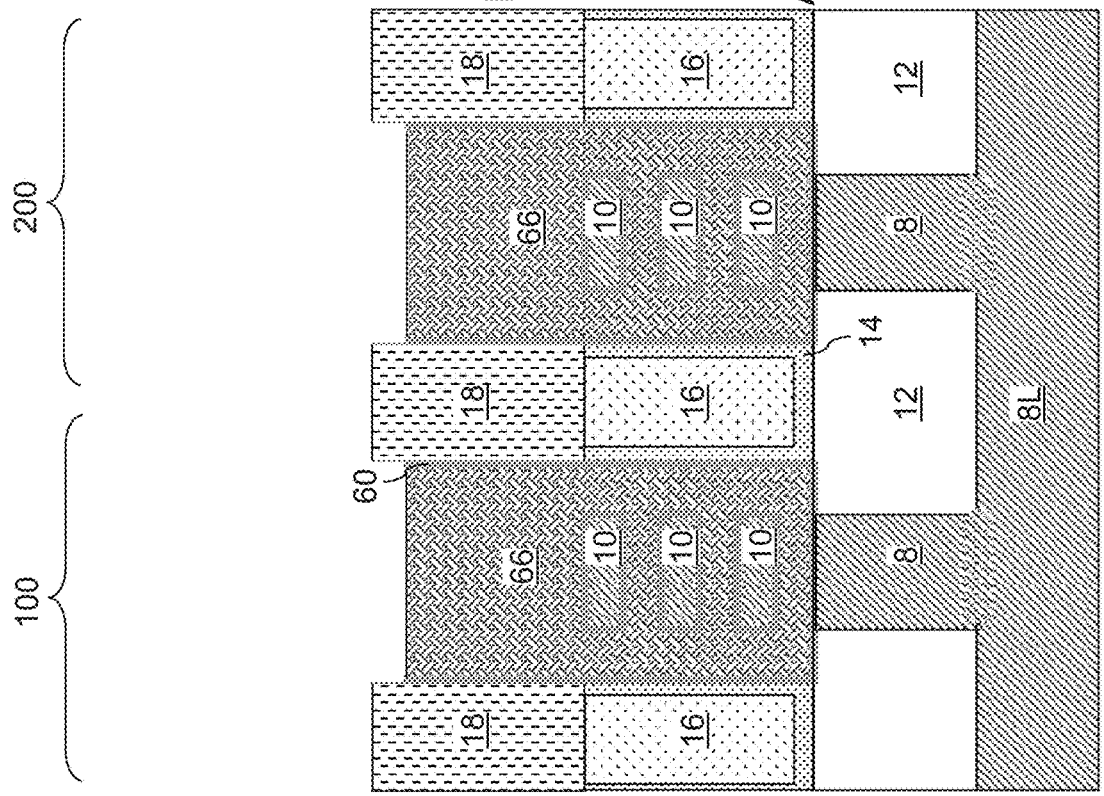
FIG. 27A is a vertical cross-sectional view of the exemplary structure after vertically recessing gate electrodes and gate dielectric layers by performing a first anisotropic etch process according to an embodiment of the present disclosure.
Figure 27D:
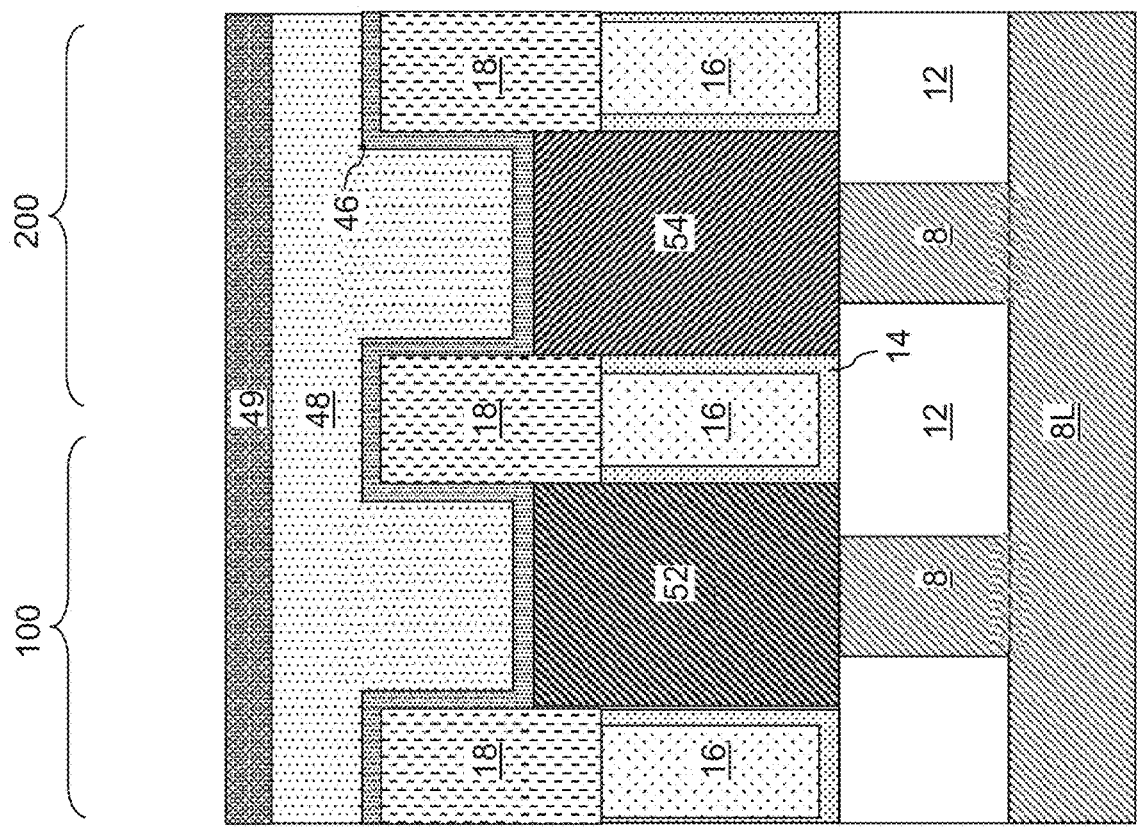
FIG. 27D is a vertical cross-sectional view along the vertical plane D-D' of FIG. 27B.
Figure 27C:
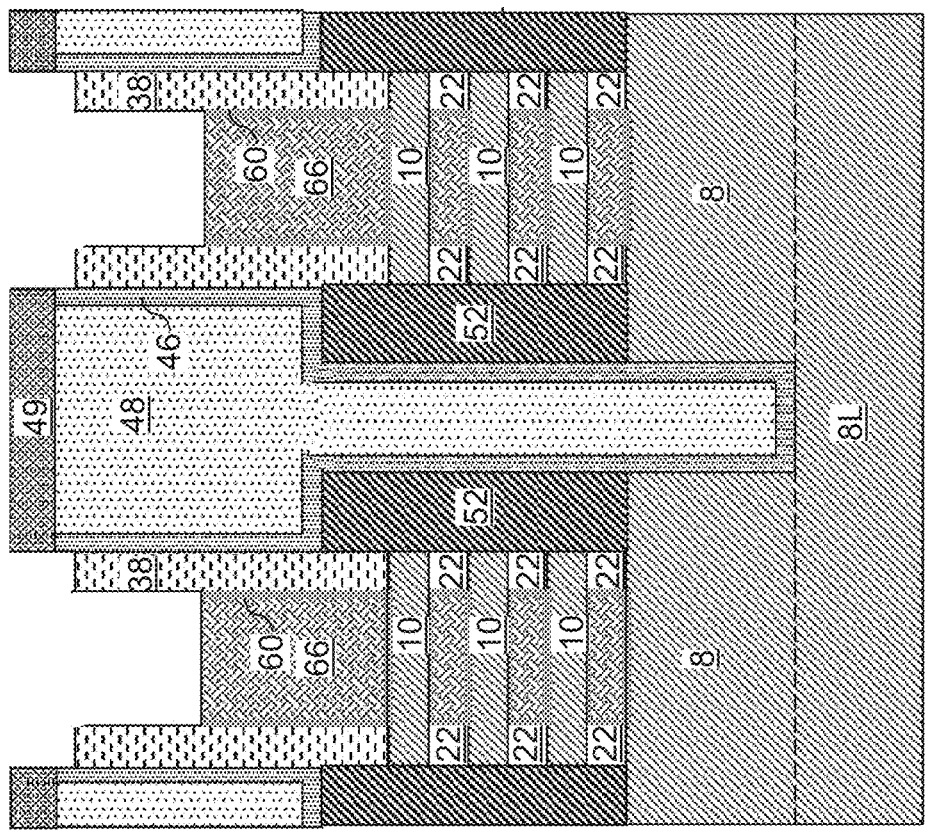
FIG. 27C is a vertical cross-sectional view along the vertical plane C-C' of FIG. 27B.
Figure 27E:
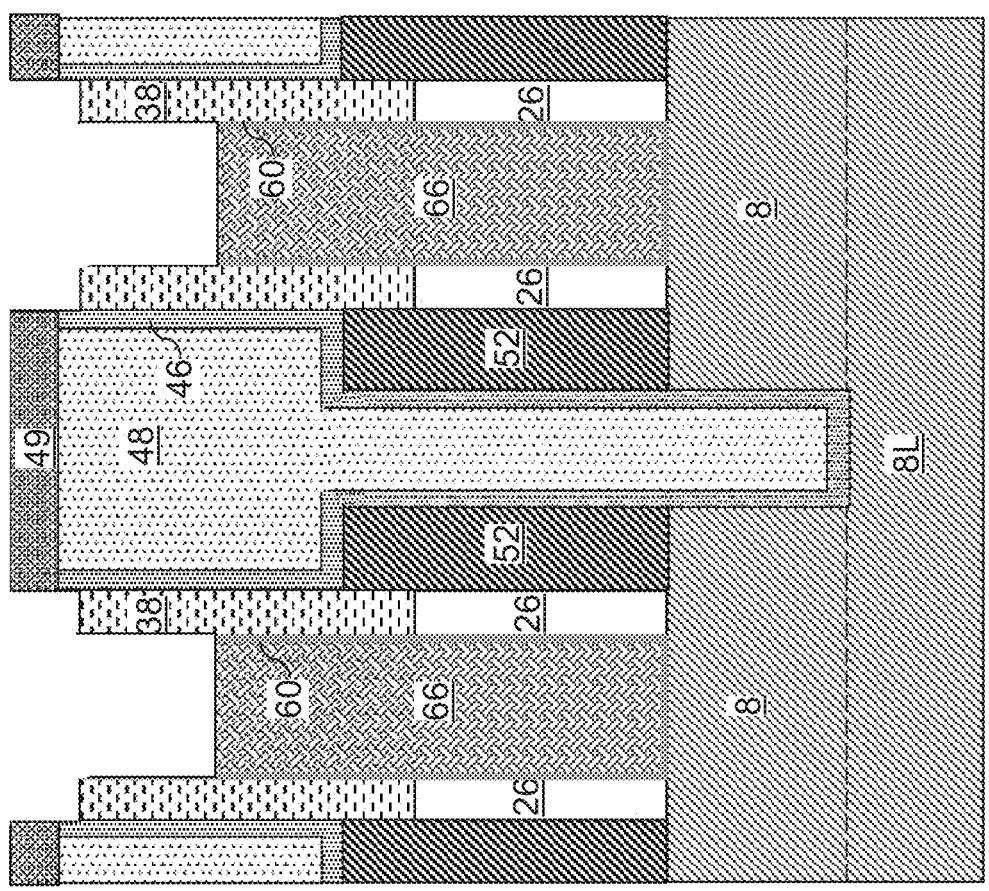
FIG. 27E is a vertical cross-sectional view along the vertical plane E-E' of FIG. 27B.

FIG. 27A is a vertical cross-sectional view of the exemplary structure after vertically recessing gate electrodes and gate dielectric layers by performing a first anisotropic etch process according to an embodiment of the present disclosure. FIG. 27B is a top-down view of the exemplary structure of FIG. 27A. The vertical plane A-A' is the plane of the vertical cross-sectional view of FIG. 27A. FIG. 27C is a vertical cross-sectional view along the vertical plane C-C' of FIG. 27B. FIG. 27D is a vertical cross-sectional view along the vertical plane D-D' of FIG. 27B. FIG. 27E is a vertical cross-sectional view along the vertical plane E-E' of FIG. 27B. Referring to FIGS. 27A and 27B, the gate electrodes 66 and the gate dielectric layers 60 may be vertically recessed selective to the dielectric gate spacers 38 by anisotropically etching the gate dielectric layers 60 and the gate electrodes 66 by performing a first anisotropic etch process. The first anisotropic etch process etches the material of the gate electrode 66 and the gate dielectric layers 60 concurrently at comparable etch rates. For example, the first anisotropic etch process provides a first etch rate ratio between the etch rate of the material of the gate electrodes 66 to the etch rate of the material of the gate dielectric layers 60. In one embodiment, the first etch rate ratio may be in a range from 0.75 to 1.25, such as from 0.85 to 1.15 and/or from 0.90 to 1.10. In one embodiment, the first etch ratio may be at least 1.0, and may be in a range from 1.00 to 1.25, such as from 1.00 to 1.15 and/or from 1.00 to 1.10. The first anisotropic etch process may include a reactive ion etch process having an etch chemistry using a combination of $CF_4$ and $BCl_4$ at a process pressure in a range from 1 mTorr to 10 mTorr. In one embodiment, the top surfaces of the gate dielectric layers 60 may be vertically recessed below a horizontal plane including top surfaces of the dielectric gate spacers 38 by the first anisotropic etch process. In one embodiment, the first anisotropic etch process may be terminated when recessed top surfaces of the gate electrodes 66 are formed below the horizontal plane including top surfaces of the etch stop dielectric fins 18.

Figure 28D:
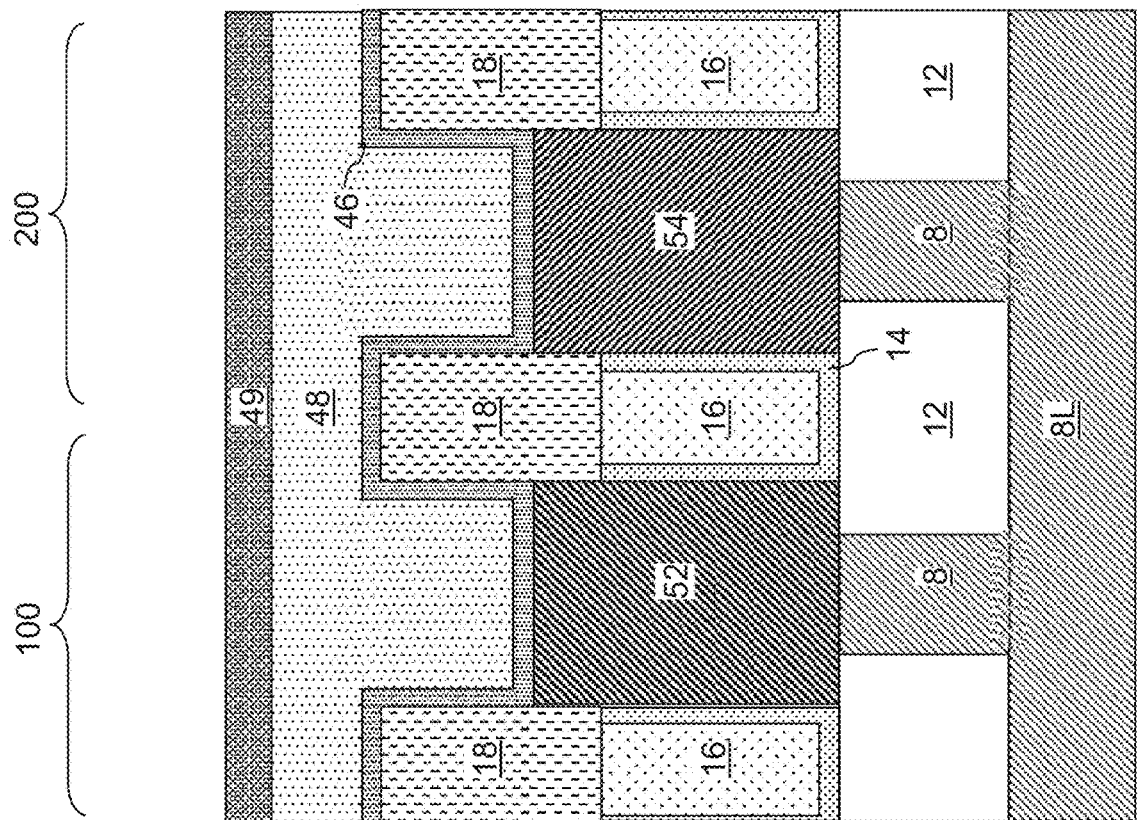
FIG. 28D is a vertical cross-sectional view along the vertical plane D-D' of FIG. 28B.
Figure 28C:
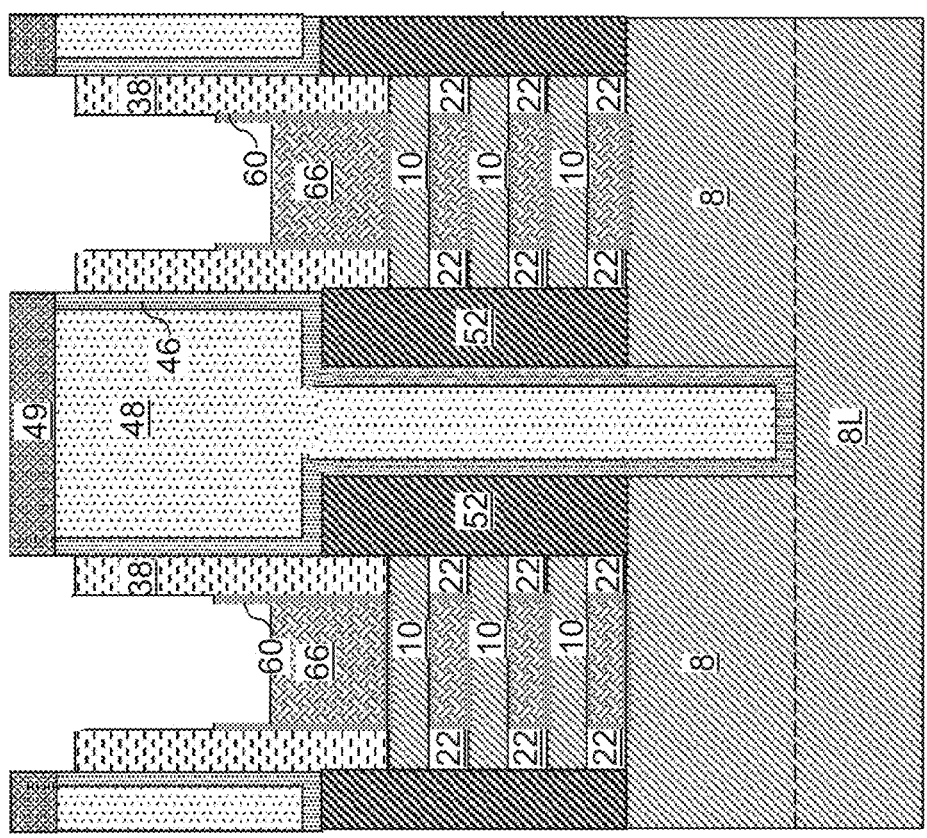
FIG. 28C is a vertical cross-sectional view along the vertical plane C-C' of FIG. 28B.

FIG. 28A is a vertical cross-sectional view of the exemplary structure after vertically recessing gate electrodes and gate dielectric layers by performing a second anisotropic etch process according to an embodiment of the present disclosure. FIG. 28B is a top-down view of the exemplary structure of FIG. 28A. The vertical plane A-A' is the plane of the vertical cross-sectional view of FIG. 28A. FIG. 28C is a vertical cross-sectional view along the vertical plane C-C' of FIG. 28B. FIG. 28D is a vertical cross-sectional view along the vertical plane D-D' of FIG. 28B. FIG. 28E is a vertical cross-sectional view along the vertical plane E-E' of FIG. 28B. Referring to FIGS. 28A-28E, a second anisotropic etch process may be performed after terminating the first anisotropic etch process to further recess the gate dielectric layers 60 and the gate electrodes 66. According to an aspect of the present disclosure, the chemistry of the second anisotropic etch process is different from the chemistry of the first anisotropic etch process such that the material of the gate electrodes 66 is etched at a higher etch rate than the material of the gate dielectric layers 60. In one embodiment, the second anisotropic etch process provides a second etch rate ratio in a range from 1.5 to 10, such as from 2.0 to 5 and/or from 2.5 to 4. The second etch rate ratio is the ratio of the etch rate of the material of the gate dielectric layer in the second anisotropic etch process to the etch rate of the material of the gate electrode in the second anisotropic etch process. In one embodiment, the chemistry of the second anisotropic etch process may be modified from the chemistry of the first anisotropic etch process by addition of $O_2$ as a process gas. The addition of $O_2$ decreases the etch rate for the metal oxide material in the gate dielectric layers 60. In one embodiment, the second anisotropic etch process may be a reactive ion etch process using a combination of $BCl_4$, $CF_4$, and $O_2$ as process gases.

The top surfaces of the etch stop dielectric fins 18 may be physically exposed after the second anisotropic etch process. The second anisotropic etch process vertically recesses top surfaces of the gate electrodes 66 below a horizontal plane including the top surfaces of the etch stop dielectric fins 18. The second anisotropic etch process vertically recesses the top surface of each gate electrode by a vertical recess distance that is less than the height of the etch stop dielectric fins 18. The height different between the top surfaces of the gate electrodes 66 and the horizontal plane including the top surfaces of the etch stop dielectric fins 18 may be in a range from 5 nm to 20 nm, although lesser and greater height differences may also be used. In one embodiment, the topmost surface of each gate dielectric layer 60 may be recessed to a height within 3 nm from a horizontal plane including the top surface of the etch stop dielectric fins 18 upon termination of the second anisotropic etch process. In one embodiment, each gate dielectric layer 60 may have a thickness not greater than 3 nm, and the topmost surface of each gate dielectric layer 60 may be recessed to a height within the thickness of the gate dielectric layers 60 from a horizontal plane including the top surface of the etch stop dielectric fins 18 upon termination of the second anisotropic etch process.

The first anisotropic etch process may remove portions of the gate dielectric layers 60 that overlie the etch stop dielectric fins 18, thereby removing a potential leakage current path that would be otherwise formed with the etch residues of the gate dielectric layers 60. The second anisotropic etch process ensures that any etch residue of the gate dielectric layers 60 is removed from above the etch stop dielectric fins 18 as the top surfaces of the etch stop dielectric fins 18 are collaterally etched.

Figure 29D:
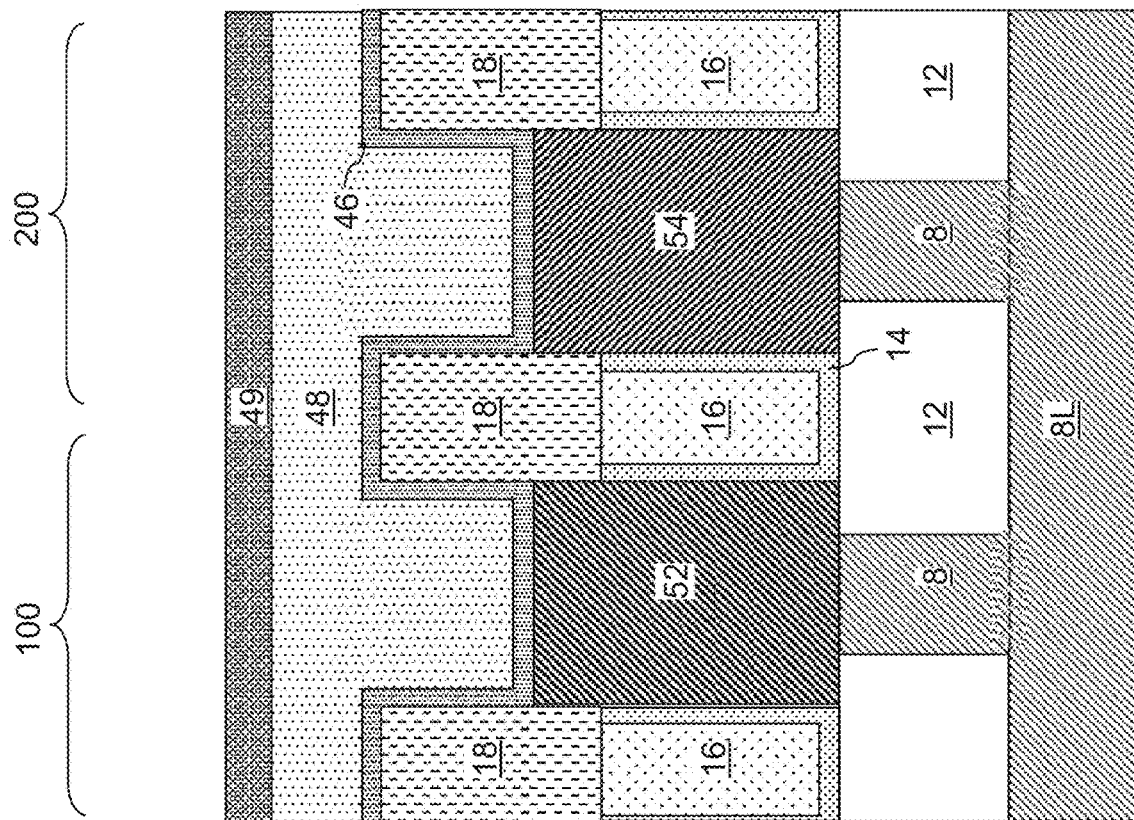
FIG. 29D is a vertical cross-sectional view along the vertical plane D-D' of FIG. 29B.
Figure 29C:
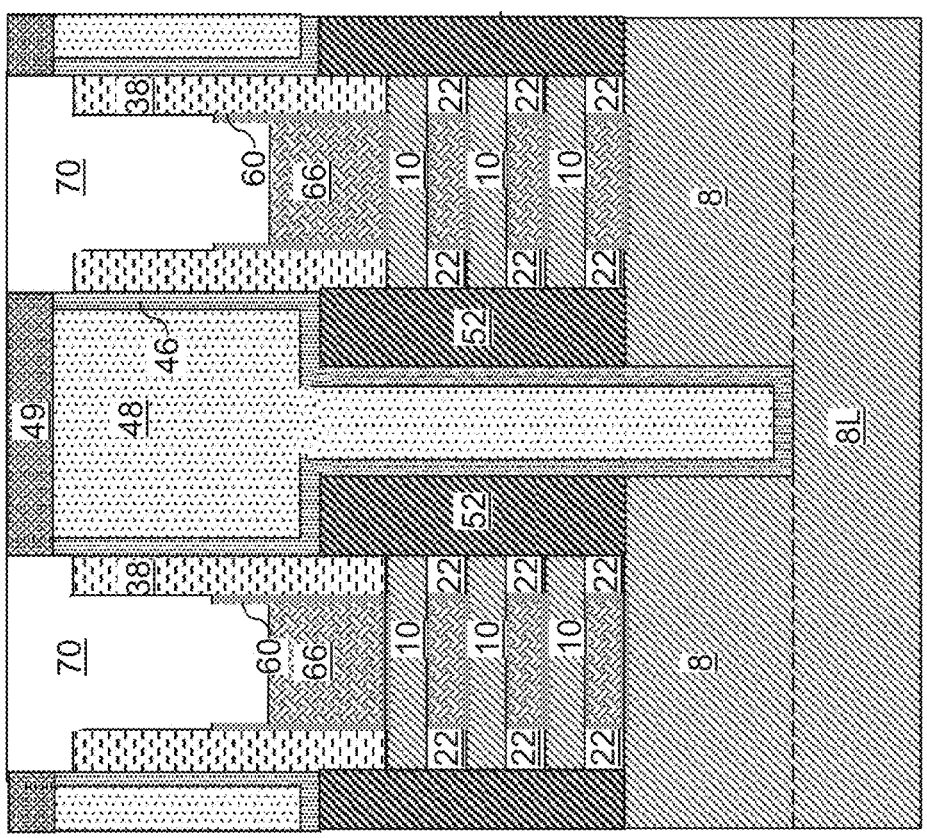
FIG. 29C is a vertical cross-sectional view along the vertical plane C-C' of FIG. 29B.
Figure 29E:
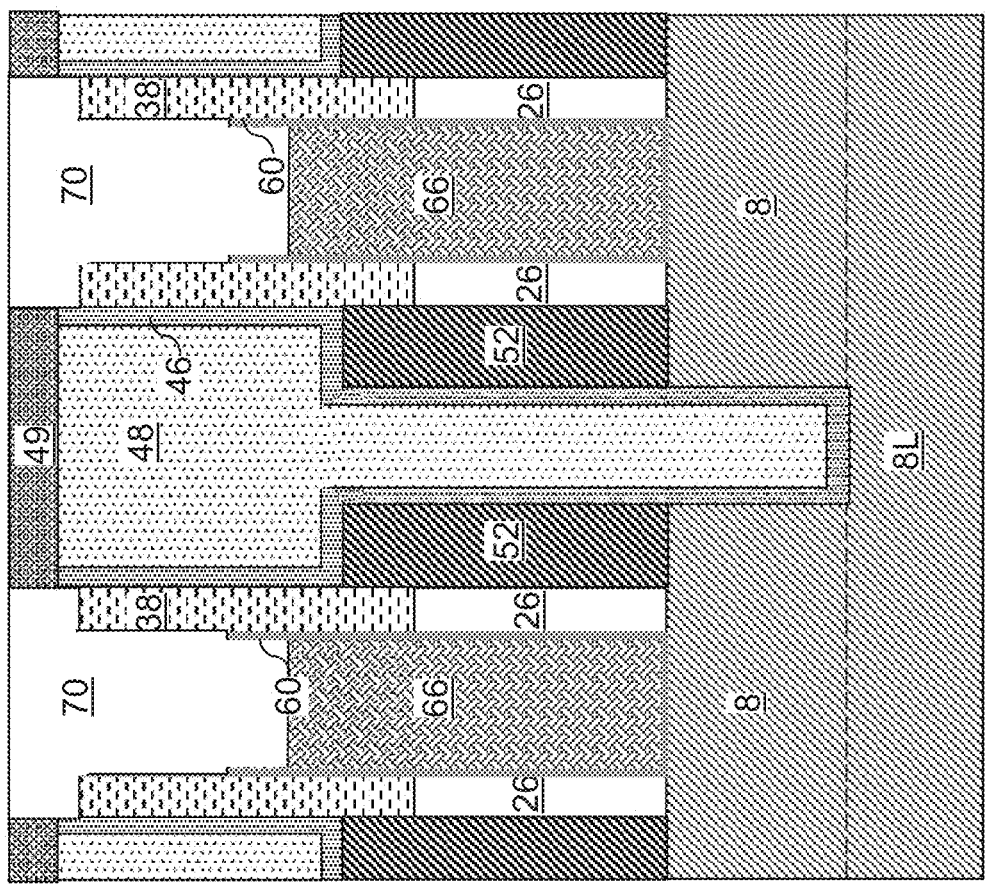
FIG. 29E is a vertical cross-sectional view along the vertical plane E-E' of FIG. 29B.

FIG. 29A is a vertical cross-sectional view of the exemplary structure after formation of a contact-level dielectric layer according to an embodiment of the present disclosure. FIG. 29B is a top-down view of the exemplary structure of FIG. 29A. The vertical plane A-A' is the plane of the vertical cross-sectional view of FIG. 29A. FIG. 29C is a vertical cross-sectional view along the vertical plane C-C' of FIG. 29B. FIG. 29D is a vertical cross-sectional view along the vertical plane D-D' of FIG. 29B. FIG. 29E is a vertical cross-sectional view along the vertical plane E-E' of FIG. 29B. Referring to FIGS. 29A-29E, a contact-level dielectric layer 70 may be deposited over the gate structures (60, 66). The contact-level dielectric layer 70 includes a dielectric fill material such as undoped silicate glass or a doped silicate glass. The dielectric fill material may be deposited by a conformal deposition process such as a chemical mechanical deposition process. Excess portions of the dielectric fill material may be removed from above the horizontal plane including the top surfaces of the inter-device isolation structures (46, 48, 49) by a planarization process such as a chemical mechanical planarization process.

Referring to FIGS. 1A-29E and according to various embodiments of the present disclosure, a gate-all-around (GAA) field effect transistor is provided. The GAA field effect transistor comprises at least one semiconductor plate (such as the first semiconductor plates 10) surrounded at a middle portion by a gate structure (60, 66) including a combination of a gate dielectric layer 60 and a gate electrode 66; a source region (52 or 54) located at a first end of each of the at least one semiconductor plate; a drain region (52 or 54) located at a second end of each of the at least one semiconductor plate; and a dielectric gate spacer 38 laterally surrounding the gate structure (60, 66). The gate dielectric layer 60 comprises, and/or consists essentially of, a dielectric metal oxide material such as aluminum oxide, lanthanum oxide, hafnium oxide, titanium oxide, tantalum oxide, or combinations thereof. A top surface of the gate dielectric layer 60 is located below a horizontal plane including a top surface of the dielectric gate spacer 38 and above a horizontal plane including a top surface of the gate electrode 66 by at least 3 nm. In one embodiment, each gate dielectric layer 60 may have a thickness not greater than 3 nm, and the top surface of each gate dielectric layer 60 may be located above the horizontal plane including the top surfaces of the gate electrodes 66 by at least the thickness of the gate dielectric layers 60.

In one embodiment, etch stop dielectric fins 18 may be located adjacent to the at least one semiconductor plate (such as the first semiconductor plates 10) and may protrude above a horizontal plane including a topmost surface of the at least one semiconductor plate. The top surface of the gate electrode 66 is located below a horizontal plane including top surfaces of the etch stop dielectric fins 18. In one embodiment, the top surface of the gate dielectric layer 60 may be substantially coplanar with the top surfaces of the etch stop dielectric fins 18. For example, the top surfaces of the gate dielectric layer 60 may be located at a height within 3 nm from the horizontal plane including the top surfaces of the etch stop dielectric fins 18. In one embodiment, the gate dielectric layer 60 may have a thickness not greater than 3 nm, and the top surface of the gate dielectric layer 60 may be located at a height within the thickness of the gate dielectric layer 60 from the horizontal plane including the top surfaces of the etch stop dielectric fins 18. In one embodiment, the gate dielectric layer 60 comprises, and/or consists essentially of, a first dielectric metal oxide having a dielectric constant greater than 7.9. The etch stop dielectric fins 18 comprise, and/or consist essentially of, a second dielectric metal oxide having a dielectric constant greater than 7.9. The first dielectric metal oxide may be the same as, or may be different from, the second dielectric metal oxide.

Referring to FIGS. 30A-30E, an alternative configuration of the exemplary structure according to an embodiment of the present disclosure may be derived from the exemplary structure of FIGS. 29A-29E by modifying the etch processes to recess the gate dielectric layers 60 and the gate electrodes 66. In this embodiment, the first anisotropic etch process may be terminated when recessed top surfaces of the gate electrodes 66 are formed below a horizontal plane including top surfaces of the etch stop dielectric fins 18. In this embodiment, the topmost surface of the gate dielectric layers 60 may be recessed to a height within 3 nm from the horizontal plane including the top surfaces of the etch stop dielectric fins 18 upon termination of the first anisotropic etch process. In one embodiment, the gate dielectric layer 60 may have a thickness not greater than 3 nm, and the topmost surface of the gate dielectric layers 60 may be recessed to a height within the thickness of the gate dielectric layer 60 from the horizontal plane including the top surfaces of the etch stop dielectric fins 18 upon termination of the first anisotropic etch process. In this embodiment, the second anisotropic etch process may be omitted.

Figure 30A:
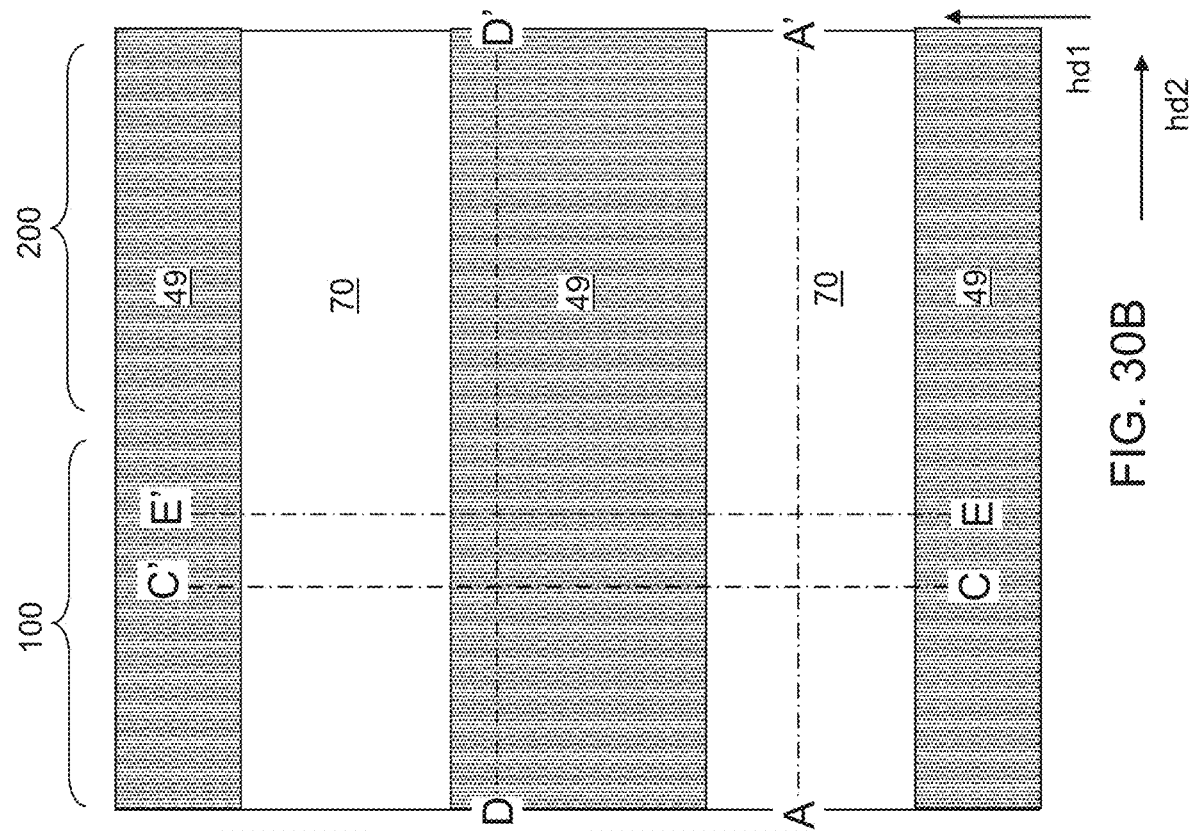
FIG. 30A is a vertical cross-sectional view of an alternative configuration of the exemplary structure according to an embodiment of the present disclosure.
Figure 30B:
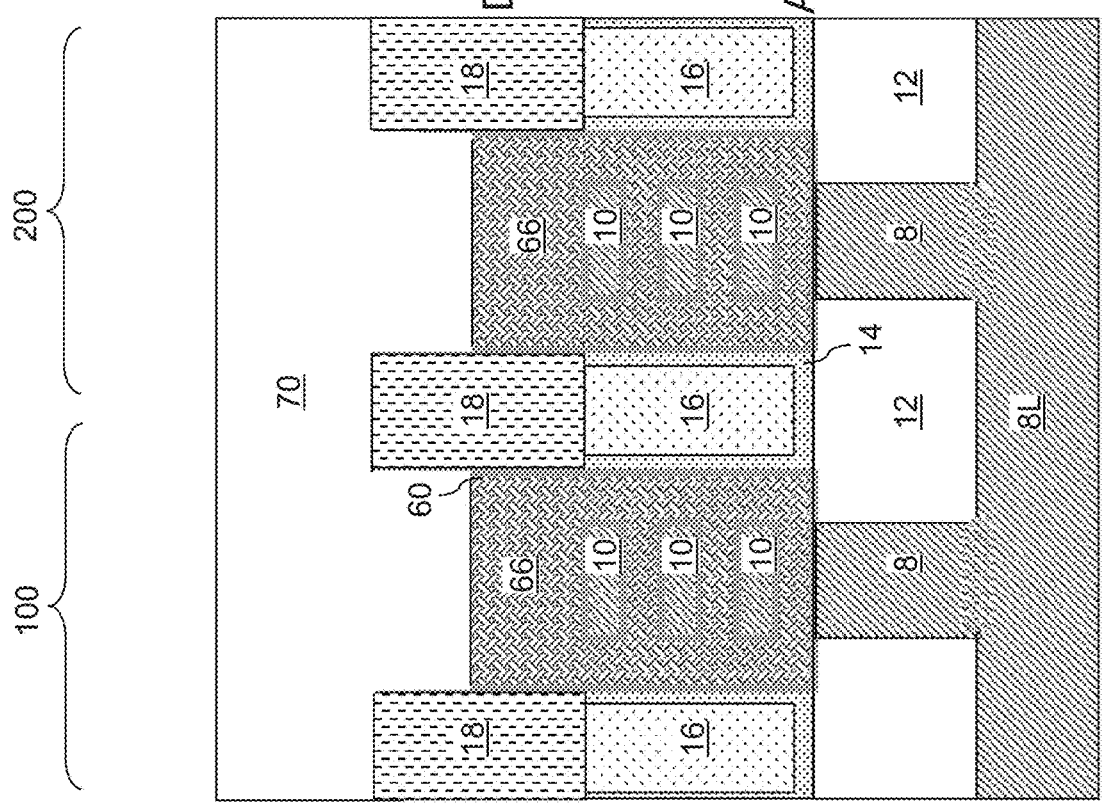
FIG. 30B is a top-down view of the exemplary structure of FIG. 30A. The vertical plane A-A' is the plane of the vertical cross-sectional view of FIG. 30A.
Figure 30D:
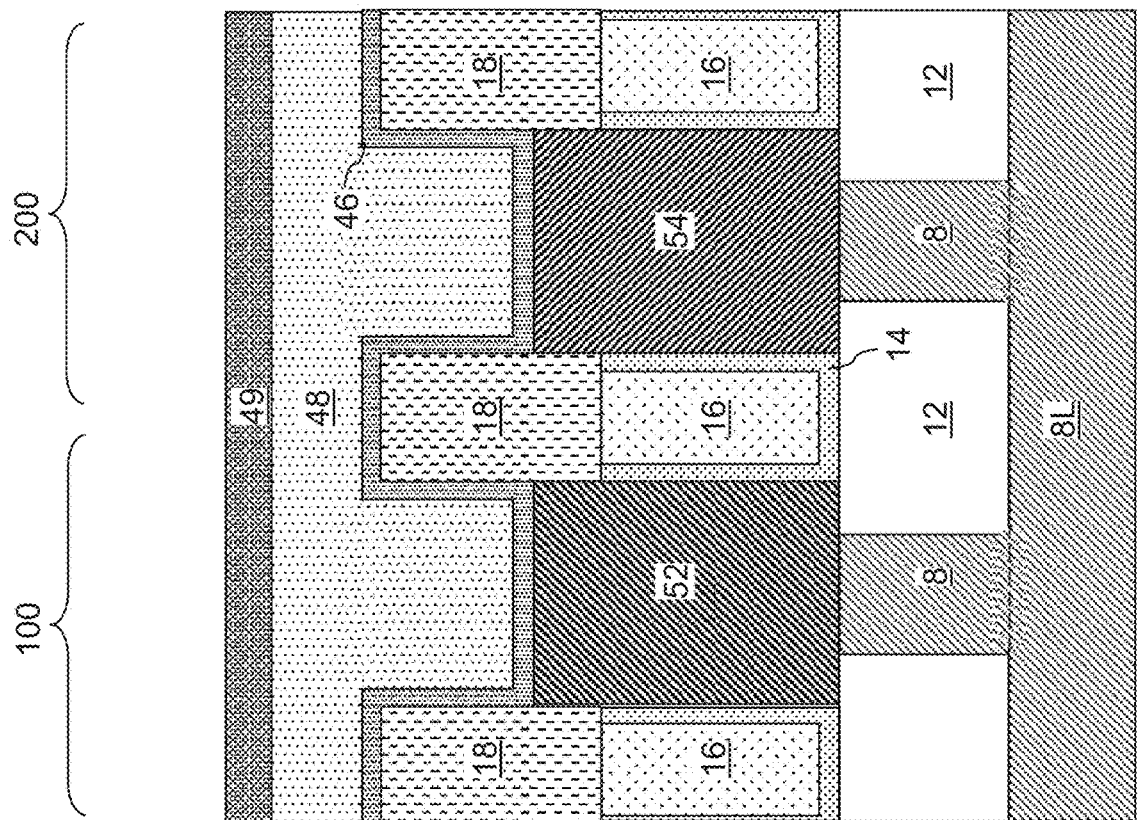
FIG. 30C is a vertical cross-sectional view along the vertical plane C-C' of FIG. 30B.
Figure 30C:
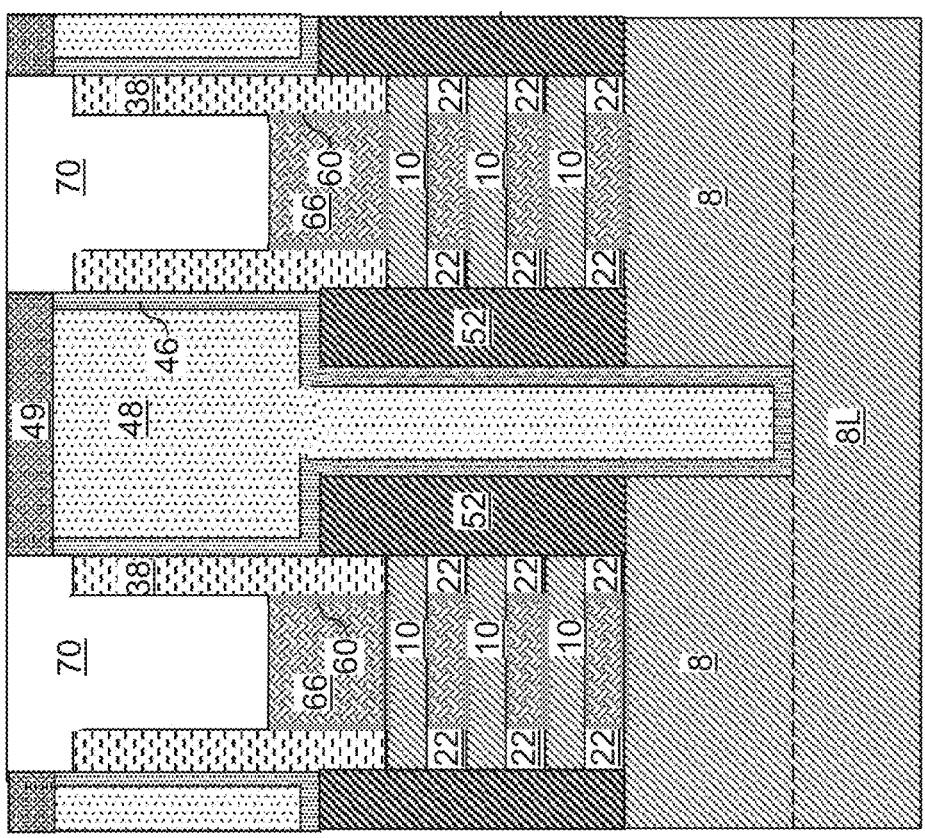
Figure 30E:
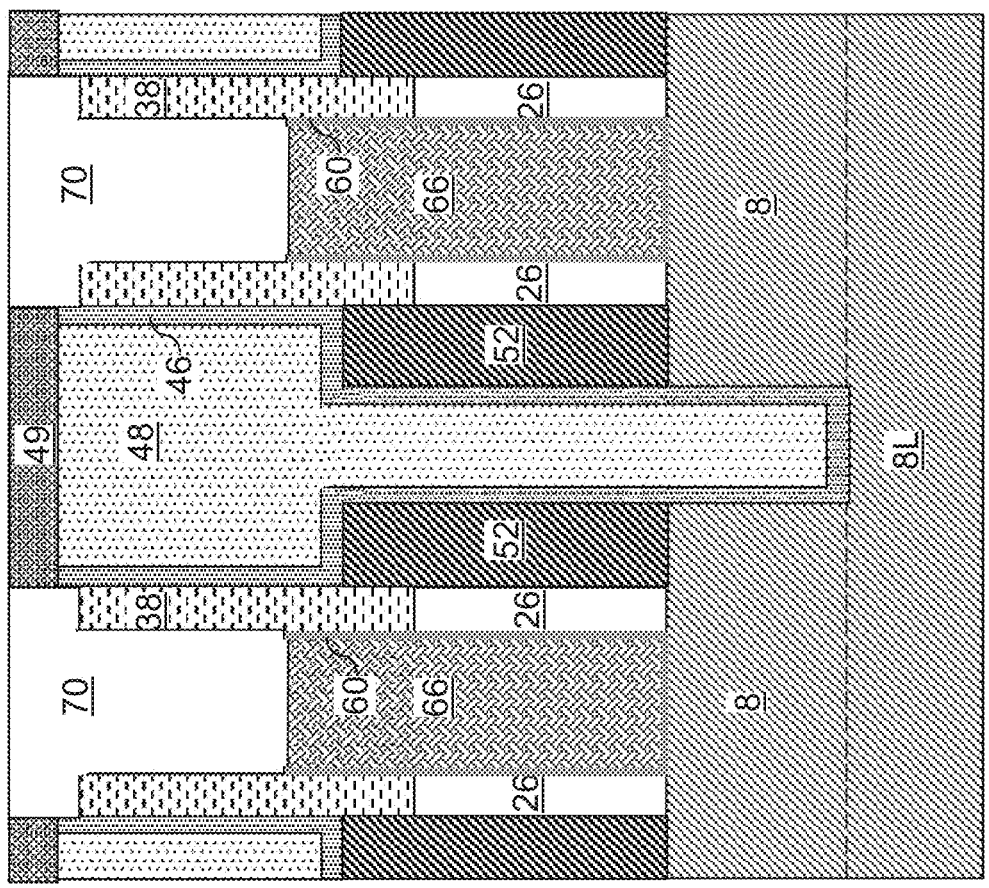

FIG. 30A is a vertical cross-sectional view of an alternative configuration of the exemplary structure according to an embodiment of the present disclosure. FIG. 30B is a top-down view of the exemplary structure of FIG. 30A. The vertical plane A-A' is the plane of the vertical cross-sectional view of FIG. 30A. FIG. 30C is a vertical cross-sectional view along the vertical plane C-C' of FIG. 30B. FIG. 30D is a vertical cross-sectional view along the vertical plane D-D' of FIG. 30B. FIG. 30E is a vertical cross-sectional view along the vertical plane E-E' of FIG. 30B. Referring to FIGS. 30A-30E and all related drawings thereto and according to embodiments of the present disclosure, a gate-all-around (GAA) field effect transistor is provided. The GAA field effect transistor comprises: at least one semiconductor plate (such as the first semiconductor plates 10) surrounded at a middle portion by a gate structure (60, 66) including a combination of a gate dielectric layer 60 and a gate electrode 66; a source region (which is one of the source/drain regions (52, 54)) located at a first end of each of the at least one semiconductor plate; a drain region (which is another of the source/drain regions (52, 54)) located at a second end of each of the at least one semiconductor plate; a dielectric gate spacer 38 laterally surrounding the gate structure (60, 66); and etch stop dielectric fins 18 located adjacent to the at least one semiconductor plate and protruding above a horizontal plane including a topmost surface of the at least one semiconductor plate. A top surface of the gate dielectric layer 60 may be located at approximately the same height as a horizontal plane including top surfaces of the etch stop dielectric fins 18. For example, the top surface of the gate dielectric layer 60 may be located at, or is vertically offset by less than 3 nm from, a horizontal plane including top surfaces of the etch stop dielectric fins 18. In one embodiment, the thickness of the gate dielectric layer 60 may be not greater than 3 nm, and the top surface of the gate dielectric layer 60 may be located at, or is vertically offset by less than the thickness of the gate dielectric layer 60 from, a horizontal plane including top surfaces of the etch stop dielectric fins 18.

In one embodiment, a top surface of the gate electrode 66 may be substantially coplanar with the top surfaces of the etch stop dielectric fins 18. In one embodiment, the top surface of the gate electrode 66 may be located within, or may be vertically offset by less than 3 nm from, the horizontal plane including top surfaces of the etch stop dielectric fins 18. In one embodiment, the thickness of the gate dielectric layer 60 may be not greater than 3 nm, and the top surface of the gate electrode 66 may be located within, or may be vertically offset by less than the thickness of the gate dielectric layer 60 from, the horizontal plane including top surfaces of the etch stop dielectric fins 18. This feature may be achieved by having substantially the same etch rate for the material of the gate electrodes 66 as the etch rate for the material of the gate dielectric layers 60 during the first anisotropic etch process, which forms the profile of the gate dielectric layers 60 and the gate electrodes 66 in the alternative configuration of the exemplary structure.

In one embodiment, the top surface of the gate dielectric layers 60 and the top surface of the gate electrode 66 may be vertically recessed below a horizontal plane including a top surface of the dielectric gate spacers 38. In one embodiment, the gate dielectric layers 60 comprises, and/or consists essentially of, a first dielectric metal oxide having a dielectric constant greater than 7.9, and the etch stop dielectric fins 18 comprises, and/or consists essentially of, a second dielectric metal oxide having a dielectric constant greater than 7.9.

As discussed above, the selectivity of the first etch process may be in a range from 0.75 to 1.25. In this embodiment, the first anisotropic etch process may remove all portions of the gate dielectric layers 60 that overlie the etch stop dielectric fins 18, thereby removing a potential leakage current path that would be otherwise formed with the etch residues of the gate dielectric layers 60. Any etch residue from the gate dielectric layers 60 may be removed at a terminal portion of the first anisotropic etch process as the top surfaces of the etch stop dielectric fins 18 are collaterally recessed concurrently with vertical recessing of the gate electrodes 66 and vertically-extending portions of the gate dielectric layers 60 that contact sidewalls of the etch stop dielectric fins 18.

Referring to FIGS. 29A-30E and according to various embodiments of the present disclosure, each etch stop dielectric fin 18 may laterally extend along the first horizontal direction hd1 with a uniform width throughout along the second horizontal direction hd2. Each gate dielectric layer 60 has a top surface located below the horizontal plane including the top surfaces of the etch stop dielectric fins 18. Thus, each gate dielectric layer 60 is confined between a neighboring pair of etch stop dielectric fins 18 that are laterally spaced apart along the second horizontal direction hd2, and between inner sidewalls of a dielectric gate spacer 38. Each gate dielectric layer 60 has a top surface located below the horizontal plane including the top surfaces of the dielectric gate spacers 38. Thus, the gate dielectric layer 60 is not present over the top surfaces of the etch stop dielectric fins 18 or over the top surfaces of the dielectric gate spacers 38. The contact-level dielectric layer 70 contacts top surfaces of the etch stop dielectric fins 18 and top surfaces of dielectric gate spacers 38, and contacts upper portions of sidewalls of the etch stop dielectric fins 18 and upper portions of sidewalls of the dielectric gate spacers 38.

In one embodiment, bottom surfaces of the etch stop dielectric fins 18 may be located within a horizontal plane within, or may be vertically offset by less than 6 nm from, the horizontal plane including a topmost surface of the at least one semiconductor plate (such as a plurality of first semiconductor plates 10 of the GAA field effect transistor). This feature may be provided by controlling the recess depth of the line trenches at the processing steps of FIGS. 7A and 7B. Each gate structure (60, 66) may be located between a neighboring pair of hybrid dielectric fins (14, 16). Further, each gate structure (60, 66) may be located between a neighboring pair of etch stop dielectric fins 18. Each etch stop dielectric fin 18 may have the same width along the second horizontal direction hd2 that is the same as the width of an underlying hybrid dielectric fin (14, 16). Each dielectric gate spacer 38 may have a pair of inner sidewalls that contact a gate structure (60, 66) and a pair of outer sidewalls that contact a pair of source/drain regions (52, 54). The pair of inner sidewalls and the pair of outer sidewalls of each dielectric gate spacer 38 may be perpendicular to the first horizontal direction hd1, and may be parallel to the second horizontal direction hd2.

Figure 31:
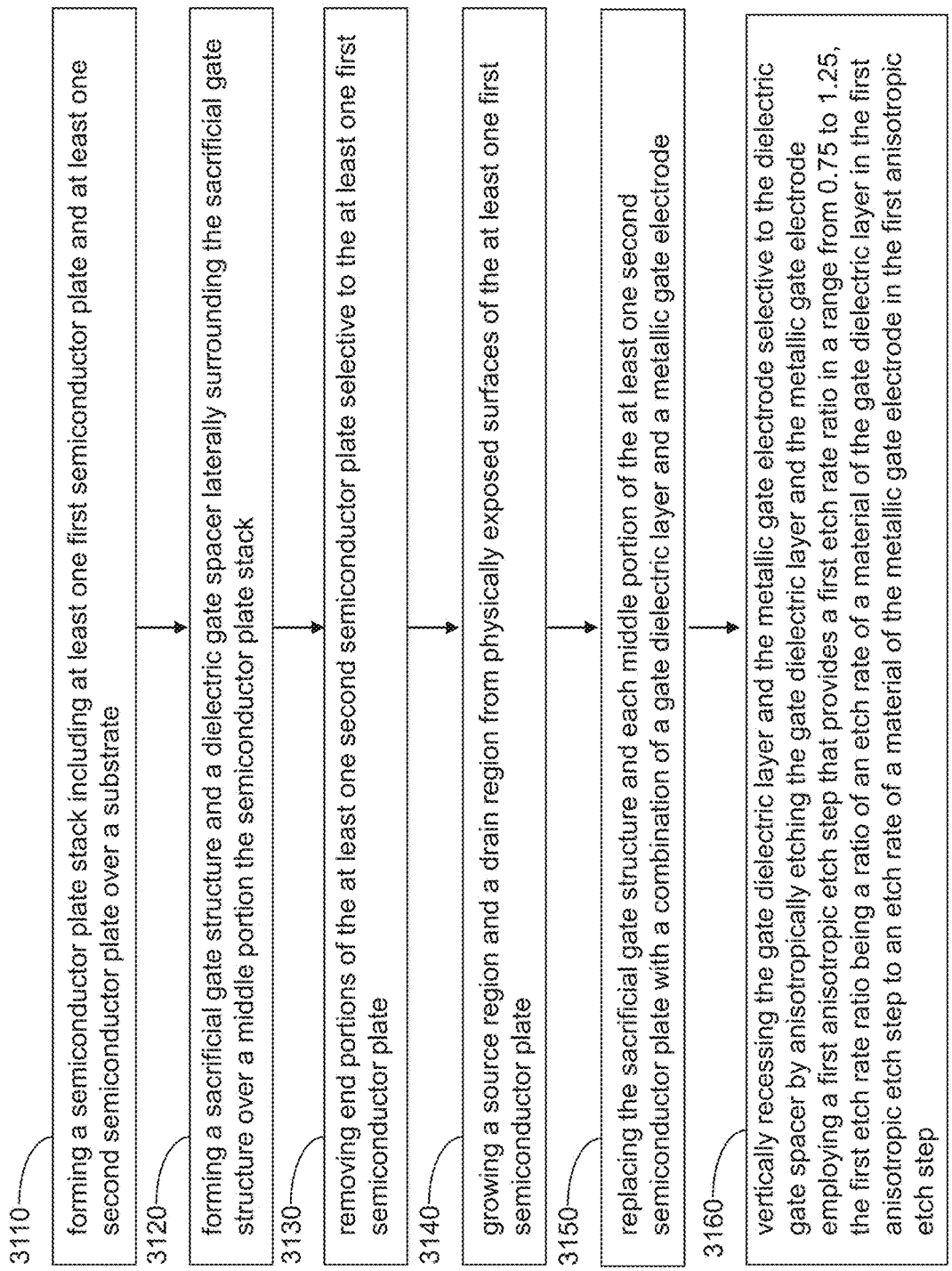

Referring to FIG. 31, a flowchart illustrating steps for forming the exemplary structure of the present disclosure is illustrated. Referring to step 3110 and FIGS. 1A-2B, a semiconductor plate stack (10, 20) including at least one first semiconductor plate 10 and at least one second semiconductor plate 20 may be formed over a substrate (which includes, for example, a substrate single crystalline semiconductor layer 8L). Referring to step 3120 and FIGS. 3A-10B, a sacrificial gate structure 32 and a dielectric gate spacer 38 laterally surrounding the sacrificial gate structure 32 may be formed over a middle portion of the semiconductor plate stack (10, 20). Referring to step 3130 and FIGS. 11A-14E, end portions of the at least one second semiconductor plate 20 may be removed selective to the at least one first semiconductor plate 10. Referring to step 3140 and FIGS. 15A-18E, a source region (i.e., one of the source/drain regions (52, 54)) and a drain region (i.e., another of the source/drain regions (52, 54)) may be grown from physically exposed surfaces of the at least one first semiconductor plate 10. Referring to step 3150 and FIGS. 19A-26E, the sacrificial gate structure 32 and each middle portion of the at least one second semiconductor plate 20 may be replaced with a combination of a gate dielectric layer 60 and a gate electrode 66. Referring to step 3160 and FIGS. 27A-30E, the gate dielectric layer 60 and the gate electrode 66 may be vertically recessed selective to the dielectric gate spacer 38 by anisotropically etching the gate dielectric layer 60 and the gate electrode 66 using a first anisotropic etch process that provides a first etch rate ratio in a range from 0.75 to 1.25. The first etch rate ratio is a ratio of an etch rate of a material of the gate dielectric layer in the first anisotropic etch process to an etch rate of a material of the gate electrode in the first anisotropic etch process. Metallic residue from the gate dielectric layer 60 that overlies the etch stop dielectric fins 18 as formed at the processing steps of FIGS. 26A-26E is removed by the first anisotropic etch process to remove leakage current paths from above the top surfaces of the etch stop dielectric fins 18.

A metal oxide material in a gate dielectric layer 60 may generate etch residues including a metallic element in a non-oxidized form, which may agglomerate to generate an electrical leakage path between adjacent gate-all-around (GAA) field effect transistors. The first metallic metal oxide material of the gate dielectric layers 60 may be selected to optimize the performance of the GAA field effect transistors, and the second metallic oxide material of the etch stop dielectric fins 18 may be selected to minimize generation of metallic residues during the anisotropic etch processes. Thus, high performance GAA field effect transistors with low inter-device leakage current may be provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   forming a semiconductor plate stack including at least one first semiconductor plate and at least one second semiconductor plate over a substrate;
   forming a sacrificial gate structure and a dielectric gate spacer laterally surrounding the sacrificial gate structure over a middle portion the semiconductor plate stack;
   removing end portions of the at least one second semiconductor plate selective to the at least one first semiconductor plate;
   growing a source region and a drain region from physically exposed surfaces of the at least one first semiconductor plate;
   replacing the sacrificial gate structure and each middle portion of the at least one second semiconductor plate with a combination of a gate dielectric layer and a gate electrode; and
   vertically recessing the gate dielectric layer and the gate electrode selective to the dielectric gate spacer by anisotropically etching the gate dielectric layer and the gate electrode using a first anisotropic etch process that provides a first etch rate ratio in a range from 0.75 to 1.25, the first etch rate ratio being a ratio of an etch rate of a material of the gate electrode in the first anisotropic etch process to an etch rate of a material of the gate dielectric layer in the first anisotropic etch process.

2. The method of claim 1, wherein the gate dielectric layer comprises a dielectric metal oxide having a dielectric constant greater than 7.9.

3. The method of claim 1, further comprising:
   forming a hard mask plate above the semiconductor plate stack, wherein sidewalls of the hard mask plate are vertically coincident with sidewalls of the semiconductor plate stack; and
   forming etch stop dielectric fins adjacent to the hard mask plate, wherein the sacrificial gate structure comprises a portion that extends over the etch stop dielectric fins.

4. The method of claim 3, further comprising terminating the first anisotropic etch process when a recessed top surface of the gate electrode is recessed a horizontal plane including top surfaces of the etch stop dielectric fins.

5. The method of claim 4, further comprising performing a second anisotropic etch process after terminating the first anisotropic etch process, wherein the second anisotropic etch process provides a second etch rate ratio in a range from 1.5 to 10, the second etch rate ratio being a ratio of an etch rate of the material of the gate electrode in the second anisotropic etch process to an etch rate of the material of the gate dielectric layer in the second anisotropic etch process.

6. The method of claim 5, wherein the top surfaces of the etch stop dielectric fins are physically exposed after the second anisotropic etch process.

7. The method of claim 5, wherein the second anisotropic etch process vertically recesses a top surface of the gate electrode by a vertical recess distance that is less than a height of the etch stop dielectric fins.

8. The method of claim 5, wherein a topmost surface of the gate dielectric layer is recessed to a height within 3 nm from a horizontal plane including the top surface of the etch stop dielectric fins upon termination of the second anisotropic etch process.

9. The method of claim 5, wherein the second anisotropic etch process comprises a reactive ion etch process using a combination of $BCl_4$, $CF_4$, and $O_2$ as process gases.

10. The method of claim 3, wherein the first anisotropic etch process is terminated when a recessed top surface of the gate electrode is formed below a horizontal plane including top surfaces of the etch stop dielectric fins.

11. The method of claim 10, wherein a topmost surface of the gate dielectric layer is recessed to a height within 3 nm from a horizontal plane including the top surface of the etch stop dielectric fins upon termination of the first anisotropic etch process.

12. The method of claim 1, wherein a top surface of the gate dielectric layer is vertically recessed below a horizontal plane including a top surface of the dielectric gate spacer by the first anisotropic etch process.

13. A gate-all-around (GAA) field effect transistor comprising:
   at least one semiconductor plate surrounded by a gate structure at a middle portion including a combination of a gate dielectric layer and a gate electrode at a middle portion;

a source region located at a first end of each of the at least one semiconductor plate;

a drain region located at a second end of each of the at least one semiconductor plate;

a dielectric gate spacer laterally surrounding the gate structure; and etch stop dielectric fins located adjacent to the at least one semiconductor plate and protruding above a horizontal plane including a topmost surface of the at least one semiconductor plate, wherein the top surface of the gate electrode is located below a horizontal plane including top surfaces of the etch stop dielectric fins, wherein a top surface of the gate dielectric layer is located below a horizontal plane including a top surface of the dielectric gate spacer, and protrudes above a horizontal plane including a top surface of the gate electrode; and wherein the top surface of the gate dielectric layer is located at a height within 3 nm from the horizontal plane including the top surfaces of the etch stop dielectric fins.

14. The GAA field effect transistor of claim 13, wherein:
the gate dielectric layer comprises a first dielectric metal oxide having a dielectric constant greater than 7.9; and
the etch stop dielectric fins comprises a second dielectric metal oxide having a dielectric constant greater than 7.9.

15. The GAA field effect transistor of claim 13, wherein an isolation dielectric liner laterally surrounds a dielectric fill material portion, and contacts a sidewall and a top surface of one of the source region and the drain region.

16. The GAA field effect transistor of claim 15, wherein:
the at least one semiconductor plate, the source region, and the drain region are located above a substrate containing a substrate single crystalline semiconductor layer;
a single crystalline semiconductor fin is located between the substrate single crystalline semiconductor layer and the at least one semiconductor plate; and
the isolation dielectric liner contacts a portion of a top surface of the substrate single crystalline semiconductor layer and a sidewall of the single crystalline semiconductor fin.

17. A gate-all-around (GAA) field effect transistor comprising:
at least one semiconductor plate surrounded at a middle portion by a gate structure including a combination of a gate dielectric layer and a gate electrode;
a source region located at a first end of each of the at least one semiconductor plate;
a drain region located at a second end of each of the at least one semiconductor plate;
a dielectric gate spacer laterally surrounding the gate structure; and
etch stop dielectric fins located adjacent to the at least one semiconductor plate and protruding above a horizontal plane including a topmost surface of the at least one semiconductor plate,
wherein a top surface of the gate dielectric layer is located at, or is vertically offset by less than 3 nm from, a horizontal plane including top surfaces of the etch stop dielectric fins.

18. The GAA field effect transistor of claim 17, wherein a top surface of the gate electrode is located at, or is vertically offset by less than 3 nm from, the horizontal plane including top surfaces of the etch stop dielectric fins.

19. The GAA field effect transistor of claim 18, wherein the top surface of the gate dielectric layer and a top surface of the gate electrode is vertically recessed below a horizontal plane including a top surface of the dielectric gate spacer.

20. The GAA field effect transistor of claim 18, wherein:
the gate dielectric layer comprises a first dielectric metal oxide having a dielectric constant greater than 7.9; and
the etch stop dielectric fins comprises a second dielectric metal oxide having a dielectric constant greater than 7.9.

* * * * *